US012696476B2

(12) United States Patent (10) Patent No.: US 12,696,476 B2
Shin et al. (45) Date of Patent: Jul. 28, 2026

(54) SEMICONDUCTOR DEVICE AND METHOD FOR FABRICATING THE SAME

(71) Applicant: Samsung Electronics Co., Ltd., Suwon-si (KR)

(72) Inventors: Hong Sik Shin, Seoul (KR); Jeong Yeon Seo, Seoul (KR); Sung Woo Kang, Suwon-si (KR); Dong Kwon Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 659 days.

(21) Appl. No.: 17/982,634

(22) Filed: Nov. 8, 2022

(65) Prior Publication Data

US 2023/0231024 A1 Jul. 20, 2023

(30) Foreign Application Priority Data

Jan. 19, 2022 (KR) ........................ 10-2022-0007928

(51) Int. Cl.
H10D 30/62 (2025.01)
H10D 30/00 (2025.01)
(Continued)

(52) U.S. Cl.
CPC ....... H10D 30/6219 (2025.01); H10D 30/503 (2025.01); H10D 30/506 (2025.01);
(Continued)

(58) Field of Classification Search
CPC ............. H10D 30/6219; H10D 30/503; H10D 30/506; H10D 30/6211; H10D 62/121;
(Continued)

(56) References Cited

U.S. PATENT DOCUMENTS 5,714,804 A * 2/1998 Miller .............. H01L 21/76877
257/E21.585
9,741,609 B1 * 8/2017 Cheng .............. H01L 21/76805
(Continued)

FOREIGN PATENT DOCUMENTS

CN 212412061 U 1/2021
EP 4 099 394 A1 12/2022
(Continued)

OTHER PUBLICATIONS

European Office Action dated Jul. 7, 2023 issued in European Patent Application No. 22 205 069.2-1211.
(Continued)

*Primary Examiner* — Earl N Taylor
(74) *Attorney, Agent, or Firm* — Fish & Richardson P.C.

(57) ABSTRACT

The semiconductor device including an active pattern on a substrate and extending in a first direction, a gate structure on the active pattern, including a gate electrode extending in a second direction different from the first direction, a source/drain pattern on at least one side of the gate structure, and a source/drain contact on the source/drain pattern and connected to the source/drain pattern, wherein with respect to an upper surface of the active pattern, a height of an upper surface of the gate electrode is same as a height of an upper surface of the source/drain contact, and the source/drain contact comprises a lower source/drain contact and an upper source/drain contact on the lower source/drain contact, may be provided.

20 Claims, 43 Drawing Sheets

(51) Int. Cl.

| | |
|---|---|
| *H10D 62/10* | (2025.01) |
| *H10D 84/01* | (2026.01) |
| *H10D 84/83* | (2025.01) |
| *H10D 88/00* | (2026.01) |

(52) U.S. Cl.

CPC ....... *H10D 30/6211* (2025.01); *H10D 62/121* (2025.01); *H10D 84/0149* (2025.01); *H10D 84/0158* (2025.01); *H10D 84/832* (2025.01); *H10D 84/834* (2025.01); *H10D 88/00* (2025.01)

(58) Field of Classification Search

CPC ........... H10D 84/0149; H10D 84/0158; H10D 84/832; H10D 84/834; H10D 88/00; H10D 30/014; H10D 30/43; H10D 30/6735; H10D 64/017; H10D 64/256; H10D 62/822; H10D 30/6713; H10D 30/6757; H10D 84/038; H10D 84/83; H10D 64/251; H10D 64/512; H10D 84/0135; B82Y 10/00; H01L 21/76834; H01L 21/76843; H01L 21/76897; H01L 21/76865; H01L 21/76883; H01L 23/5226; H01L 23/5283; H01L 23/485; H01L 23/5386; H01L 21/76841; H01L 21/76877; H01L 23/528; H10W 20/033; H10W 20/069; H10W 20/42; H10W 20/435; H10W 20/438; H10W 20/054; H10W 20/056

See application file for complete search history.

(56) References Cited

U.S. PATENT DOCUMENTS

| | | | | |
|---|---|---|---|---|
| 10,665,586 B2 * | 5/2020 | Xie | ................... | H01L 21/31051 |
| 11,139,203 B2 * | 10/2021 | Tsai | ................. | H01L 21/76897 |
| 11,848,364 B2 * | 12/2023 | Lee | ..................... | H01L 23/5226 |
| 2012/0043592 A1 | 2/2012 | Zhao et al. | | |
| 2015/0048455 A1 * | 2/2015 | Basker | ................. | H10D 30/021 |
| | | | | 438/299 |
| 2019/0148226 A1 * | 5/2019 | Yim | .................. | H01L 21/76876 |
| | | | | 257/383 |
| 2020/0006491 A1 * | 1/2020 | Bomberger | .......... | H10D 62/822 |
| 2020/0127089 A1 * | 4/2020 | Hsu | ................... | H01L 23/53266 |
| 2020/0365698 A1 * | 11/2020 | Tsai | ...................... | H10D 64/01 |
| 2021/0020633 A1 * | 1/2021 | Shen | ................... | H10D 84/834 |
| 2021/0036146 A1 | 2/2021 | Zhou | | |
| 2021/0082756 A1 * | 3/2021 | Tsai | ................. | H01L 21/76847 |
| 2021/0082757 A1 * | 3/2021 | Lee | ................... | H01L 21/28114 |
| 2021/0090950 A1 * | 3/2021 | Fan | ................... | H01L 21/76816 |
| 2021/0351039 A1 * | 11/2021 | Huang | ................. | H01L 23/485 |
| 2021/0384192 A1 * | 12/2021 | Bae | .................... | H10D 30/6735 |
| 2022/0109055 A1 * | 4/2022 | Lee | ....................... | H10D 30/62 |

FOREIGN PATENT DOCUMENTS

| | | | |
|---|---|---|---|
| KR | 10-2016-0130591 A | 11/2016 |
| KR | 10-2018-0018947 A | 2/2018 |
| KR | 10-2021-0027643 A | 3/2021 |
| KR | 10-2021-0096400 A | 8/2021 |
| KR | 10-2021-0152849 A | 12/2021 |
| TW | 201924048 A | 6/2019 |

OTHER PUBLICATIONS

Extended European Search Report dated Jun. 27, 2023 issued in European Patent Application No. 22205069.2-1211.

Office Action in Korean Appln. No. 10-2022-0007928, mailed on Sep. 25, 2025, 26 pages (with machine translation).

Office Action in Taiwanese Appln. No. 112101663, mailed on Mar. 23, 2026, 28 pages (with machine translation).

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2022-0007928 filed on Jan. 19, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor devices and/or methods for fabricating the same.

2. Description of the Related Art

As one of scaling techniques for increasing the density of semiconductor devices, a multi-gate transistor has been proposed, in which a fin- or nanowire-shaped multi-channel active pattern (or silicon body) is formed on a substrate and a gate is formed on the surface of the multi-channel active pattern.

Because the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

SUMMARY

Some aspects of the present disclosure provide semiconductor devices capable of improving element performance and reliability.

Some aspects of the present disclosure also provide methods for fabricating a semiconductor device capable of improving element performance and reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor device includes an active pattern on a substrate and extending in a first direction, a gate structure on the active pattern, the gate structure including a gate electrode, the gate structure extending in a second direction different from the first direction, a source/drain pattern on at least one side of the gate structure, and a source/drain contact on the source/drain pattern and connected to the source/drain pattern, wherein with respect to an upper surface of the active pattern, a height of an upper surface of the gate electrode is same as a height of an upper surface of the source/drain contact, and the source/drain contact comprises a lower source/drain contact and an upper source/drain contact on the lower source/drain contact.

According to another aspect of the present disclosure, a semiconductor device includes an active pattern on a substrate and extending in a first direction, a gate structure on the active pattern, the gate structure including a gate spacer and a gate electrode, the gate electrode extending in a second direction different from the first direction, a source/drain pattern on at least one side of the gate structure, a source/drain contact on the source/drain pattern and connected to the source/drain pattern, a first wiring line on the source/drain contact, the first wiring line being in contact with the source/drain contact and extending in the first direction, and a wiring structure on the first wiring line and connected to the first wiring line, the wiring structure including a via and a second wiring line, wherein the source/drain contact comprises a lower source/drain contact and an upper source/drain contact on the lower source/drain contact, the gate electrode comprises a line portion extending in the second direction and a protruding portion protruding from the line portion of the gate electrode, and the protruding portion of the gate electrode comprises an upper surface of the gate electrode According to still another aspect of the present disclosure, a semiconductor device includes a first active pattern on a substrate and extending in a first direction, a second active pattern on the substrate and extending in the first direction, the second active pattern spaced apart from the first active pattern in a second direction, a gate electrode extending in the second direction, the gate electrode being on the first active pattern and the second active pattern, a first source/drain pattern on the first active pattern, a second source/drain pattern on the second active pattern, a first source/drain contact on the first source/drain pattern and connected to the first source/drain pattern, a second source/drain contact on the second source/drain pattern and connected to the second source/drain pattern, a contact isolation structure between the first source/drain contact and the second source/drain contact, and a wiring line on the first source/drain contact, the wiring line extending in the first direction and in contact with the first source/drain contact, wherein an upper surface of the gate electrode is coplanar with an upper surface of the first source/drain contact and an upper surface of the second source/drain contact, and each of the first source/drain contact and the second source/drain contact comprises a lower source/drain contact and an upper source/drain contact on the lower source/drain contact.

According to still another aspect of the present disclosure, a method for fabricating a semiconductor device includes forming a pre-source/drain contact on a source/drain pattern between adjacent pre-gate electrodes, the pre-source/drain contact, the pre-source/drain contact including a pre-source/drain barrier layer and a pre-source/drain filling layer on the pre-source/drain barrier layer, removing a part of the pre-source/drain contact to form a lower source/drain contact on the source/drain pattern, forming a pre-upper source/drain contact on the lower source/drain contact such that an upper surface of the pre-upper source/drain contact is coplanar with an upper surface of the pre-gate electrode, forming a mask pattern on the pre-gate electrode and the pre-source/drain contact, and removing a part of the pre-gate electrode and a part of the pre-source/drain contact using the mask pattern as a mask to form a gate electrode and an upper source/drain contact.

BRIEF DESCRIPTION OF THE DRAWINGS

The above and other aspects and features of the present disclosure will become more apparent by describing in detail some example embodiments thereof with reference to the attached drawings, in which:

FIGS. 6 to 8 are enlarged views of part P of FIG. 2.

DETAILED DESCRIPTION

Figure 1:
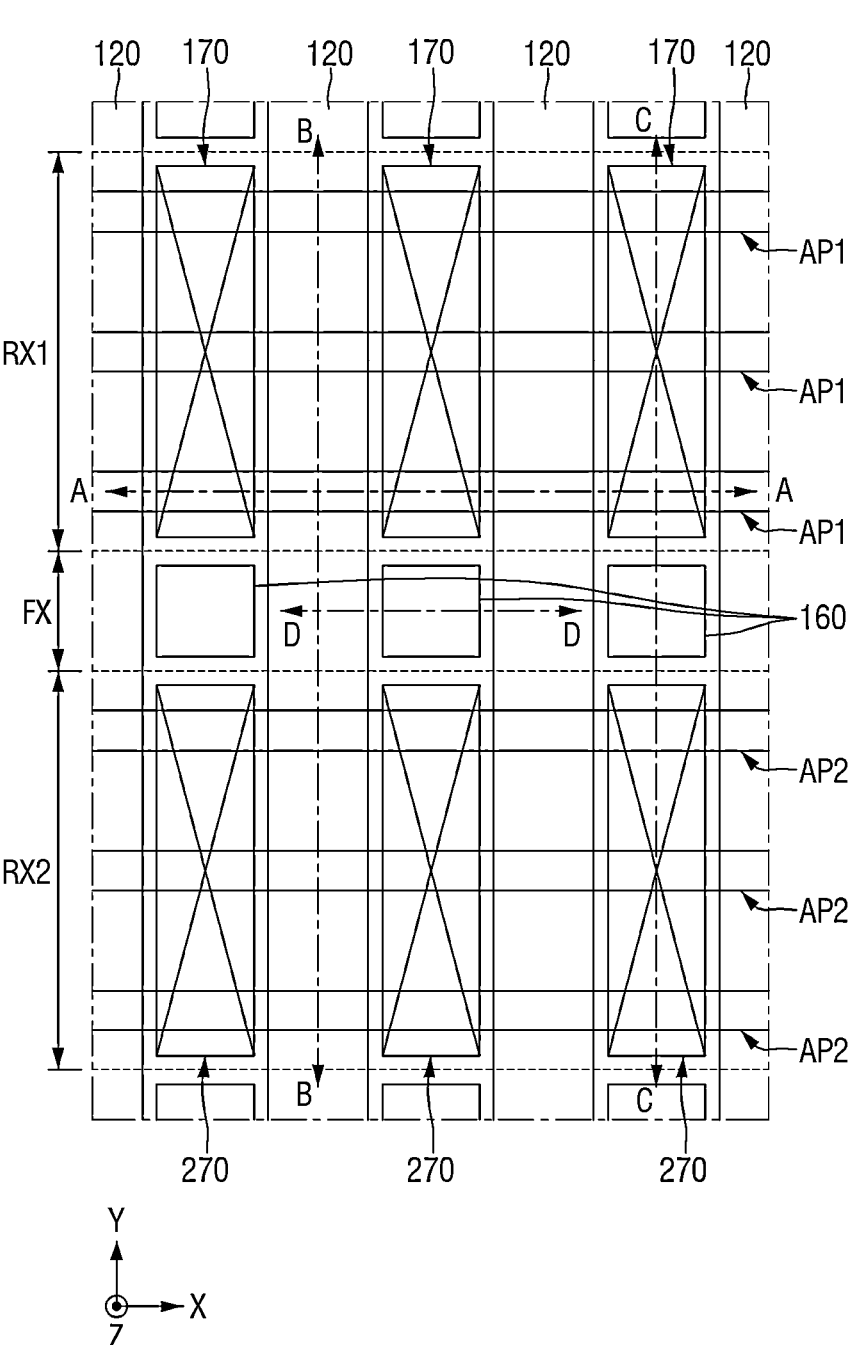
FIG. 1 is an example layout diagram illustrating a semiconductor device according to an example embodiment.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In the drawings of the semiconductor device according to some example embodiments, for example, a fin-shaped transistor (FinFET) including a channel region of a fin-shaped pattern, a transistor including a nanowire or a nanosheet, and a multi-bridge channel field effect transistor (MBCFET™), or a vertical transistor (vertical FET) is illustrated, but the present disclosure is not limited thereto. The semiconductor device according to some example embodiments may include a tunneling field effect transistor (TFET) or a three-dimensional (3D) transistor. It goes without saying that the semiconductor device according to some example embodiments may include a planar transistor. In addition, the technical spirit of the present disclosure can be applied to transistors based on two-dimensional (2D) materials based FETs and heterostructures thereof.

Further, the semiconductor device according to some example embodiments may include a bipolar junction transistor, a lateral double diffusion MOS (LDMOS) transistor, or the like.

Semiconductor devices according to some example embodiments will be described with reference to FIGS. 1 to 8.

Figure 6:
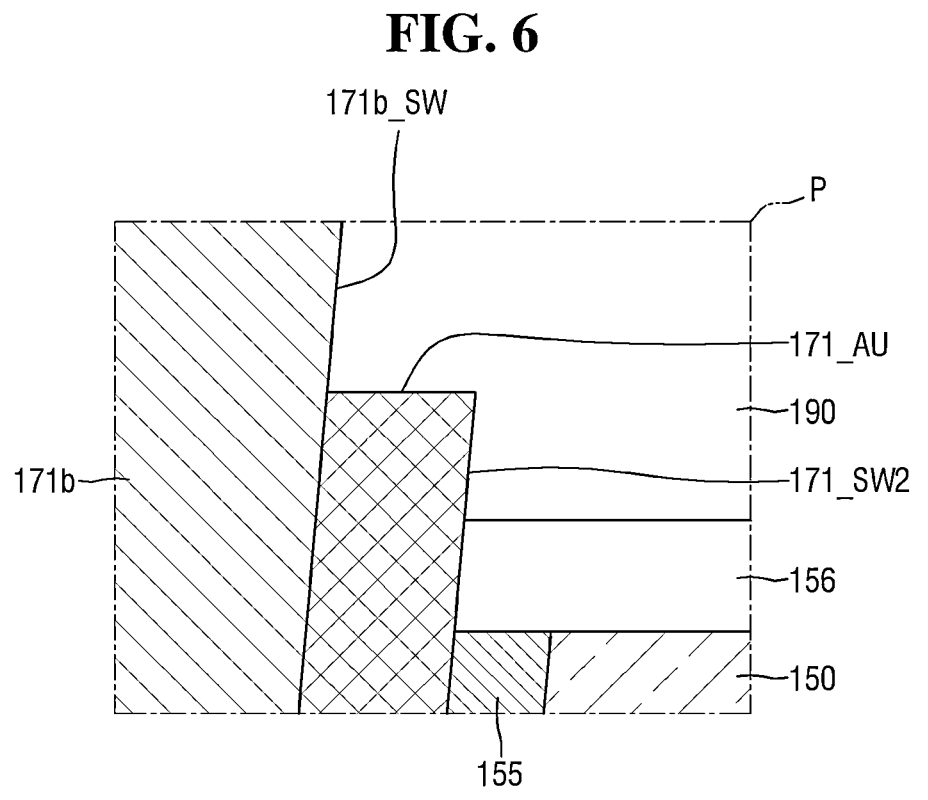
Figure 7:
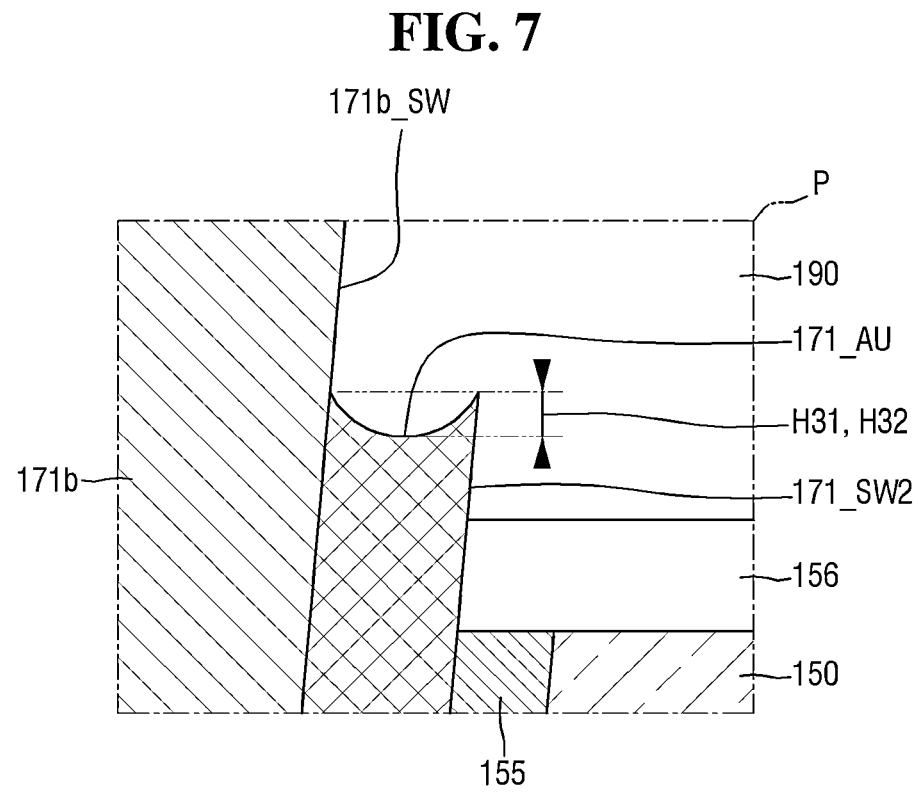
Figure 8:
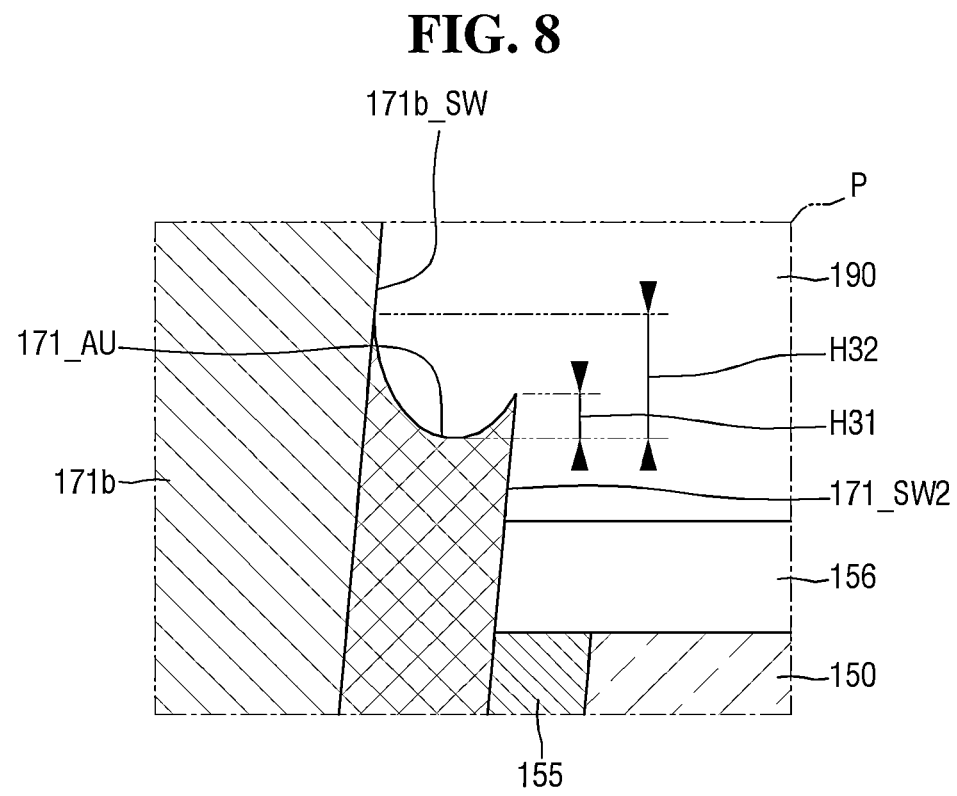

FIG. 1 is an example layout diagram illustrating a semiconductor device according to an example embodiment. FIGS. 2 to 5 are example cross-sectional views taken along lines A-A, B-B, C-C and D-D of FIG. 1. FIGS. 6 to 8 are enlarged views of part P of FIG. 2. For simplicity of description, a first wiring line 205 and a second wiring structure 206 are not illustrated in FIG. 1.

Referring to FIGS. 1 to 8, a semiconductor device according to an example embodiment may include at least one first active pattern AP1, at least one second active pattern AP2, at least one first gate electrode 120, a first source/drain contact 170, a second source/drain contact 270, the first wiring line 205, and the second wiring structure 206.

A substrate 100 may include a first active region RX1, a second active region RX2, and a field region FX. The field region FX may be formed immediately adjacent to the first active region RX1 and the second active region RX2. The field region FX may form a boundary with the first active region RX1 and the second active region RX2.

The first active region RX1 and the second active region RX2 are spaced apart from each other. The first active region RX1 and the second active region RX2 may be separated by the field region FX.

In other words, an element isolation layer may be disposed around the first active region RX1 and the second active region RX2 spaced apart from each other. In this case, a portion of the element isolation layer between the first active region RX1 and the second active region RX2 may be the field region FX. For example, a portion in which a channel region of a transistor, which may be an example of a semiconductor device, is formed may be an active region, and a portion that divides a channel region of a transistor that is formed in the active region may be a field region. In some example embodiments, the active region may be a portion in which a fin-shaped pattern or a nanosheet, which is used as a channel region of a transistor, is formed, and the field region may be a region in which a fin-shaped pattern or a nanosheet used as a channel region is not formed.

Figure 3:
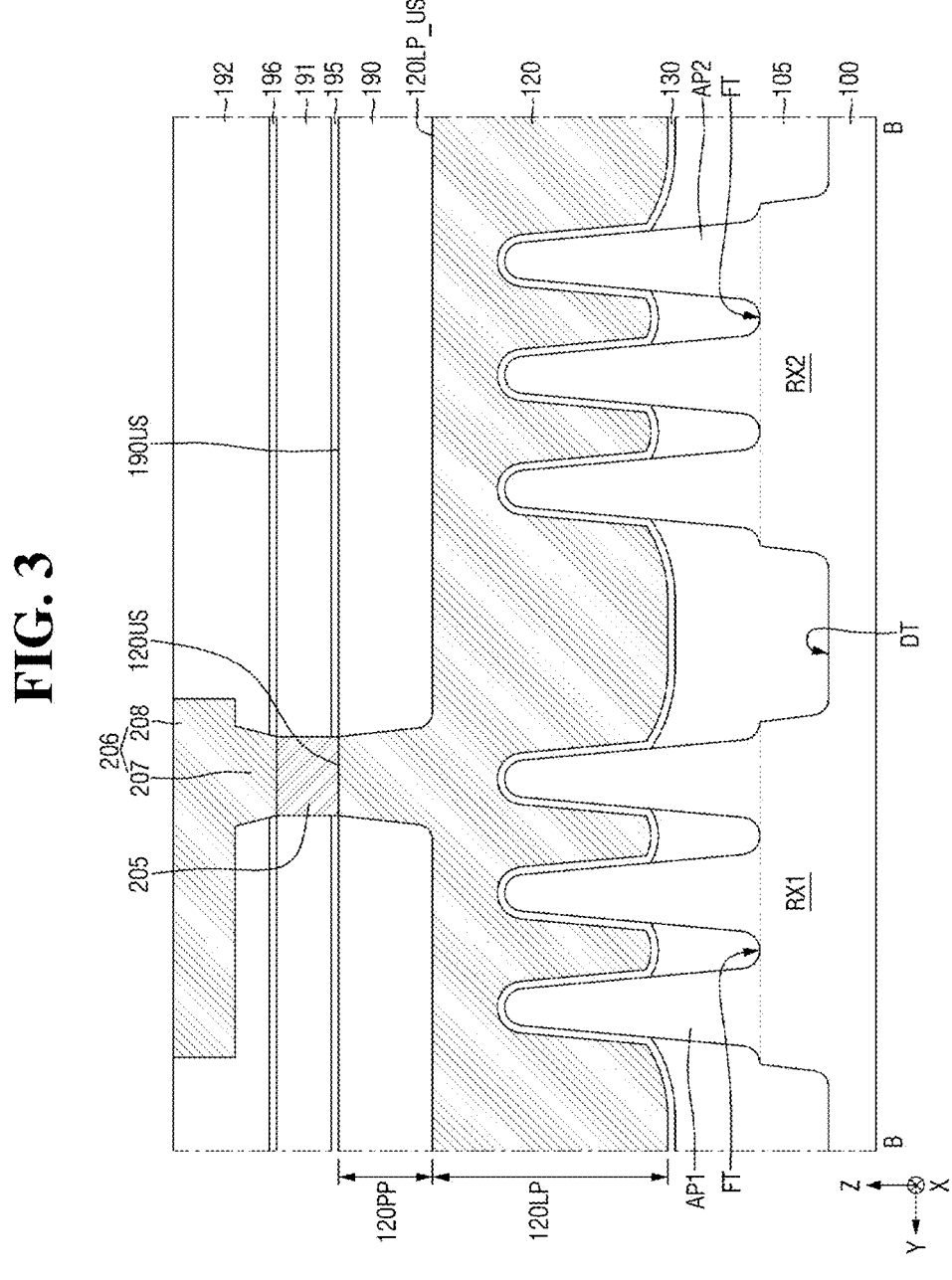
Figure 4:
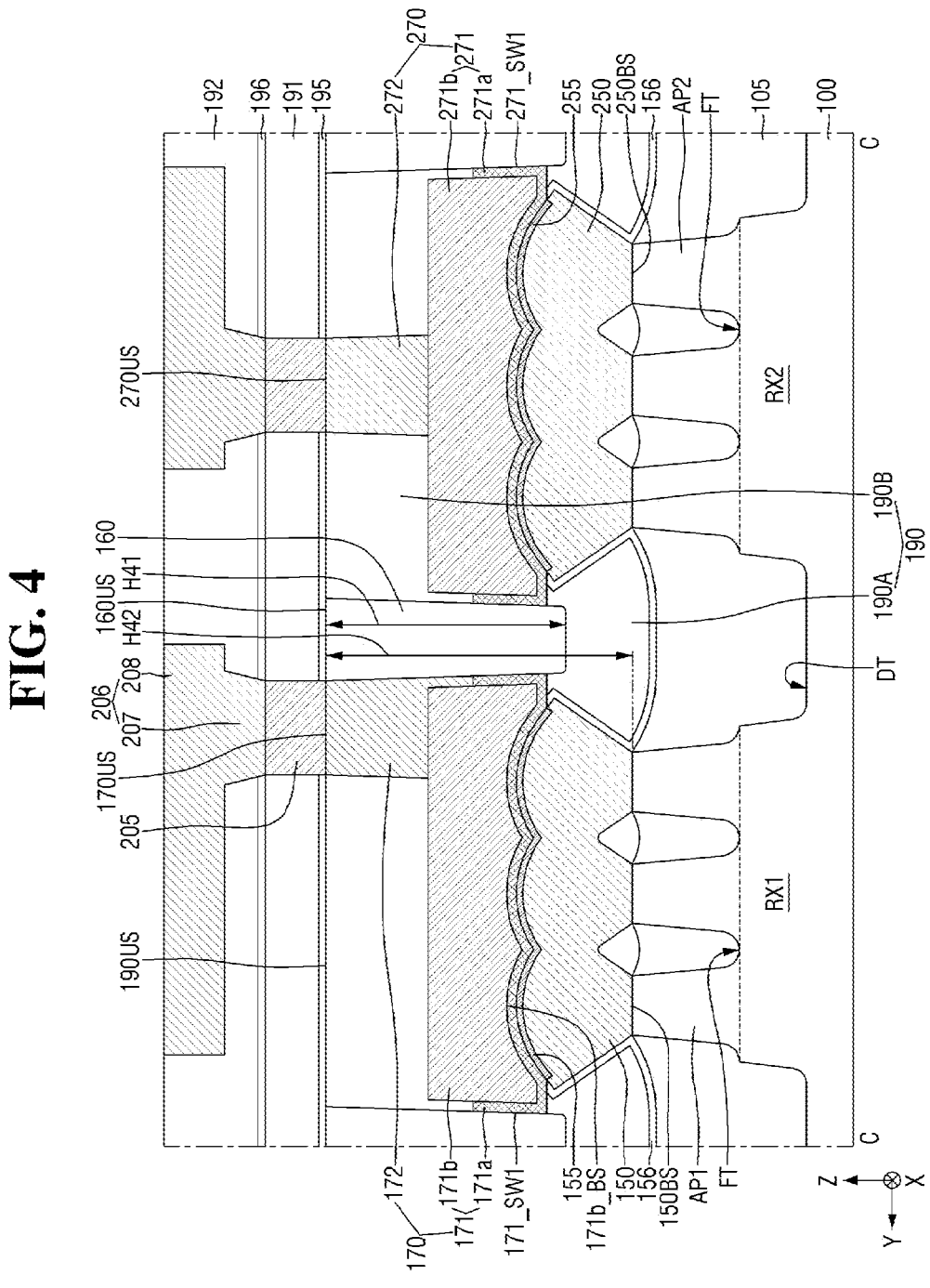
Figure 5:
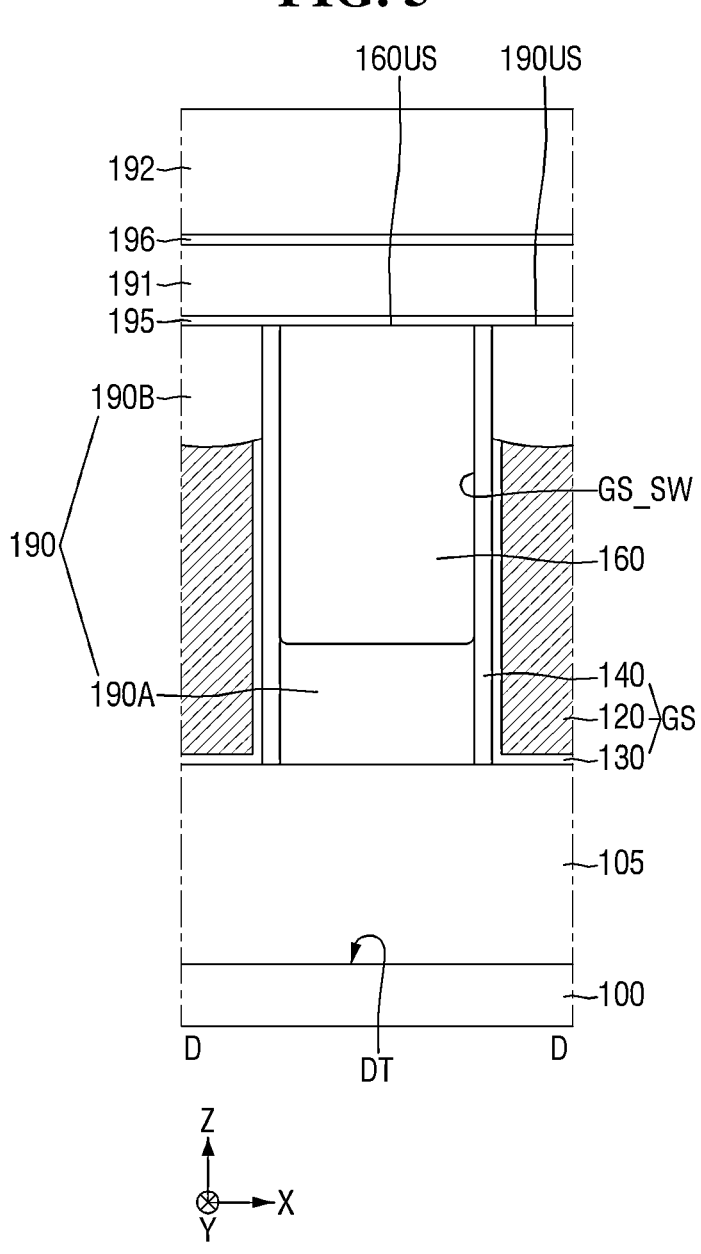

As shown in FIGS. 3 and 4, the field region FX may be defined by a deep trench DT, but is not limited thereto. In addition, it is obvious that a person of ordinary skill in the art to which the present disclosure pertains may distinguish which portion is a field region and which portion is an active region.

In one example, one of the first active region RX1 and the second active region RX2 may be a PMOS forming region, and the other one may be an NMOS forming region. In another example, the first active region RX1 and the second active region RX2 may be PMOS forming regions. In still another example, the first active region RX1 and the second active region RX2 may be NMOS forming regions.

The substrate 100 may be a silicon substrate or silicon-on-insulator (SOI) substrate. In some example embodiments, the substrate 100 may include silicon germanium, silicon germanium on insulator (SGOI), indium antimonide, a lead tellurium compound, indium arsenide, indium phosphide, gallium arsenide, or gallium antimonide, but is not limited thereto.

At least one first active pattern AP1 may be formed in the first active region RX1. The first active pattern AP1 may protrude from the substrate 100 of the first active region RX1. The first active pattern AP1 may be elongated on the substrate 100 along the first direction X. The sidewall of the first active pattern AP1 may be defined by a fin trench FT extending in the first direction X. For example, the first active pattern AP1 may include a long side extending in the first direction X and a short side extending in the second direction Y. Here, the first direction X may cross the second direction Y and the third direction Z. In addition, the second direction Y may cross the third direction Z. The third direction Z may be a thickness direction of the substrate 100.

At least one second active pattern AP2 may be formed in the second active region RX2. The description of the second active pattern AP2 may be the same as or substantially similar to the description of the first active pattern AP1.

Each of the first active pattern AP1 and the second active pattern AP2 may be a multi-channel active pattern. In the semiconductor device according to some example embodiments, each of the first active pattern AP1 and the second active pattern AP2 may be, for example, a fin-shaped pattern. Each of the first active pattern AP1 and the second active pattern AP2 may be used as a channel region of a transistor. Although each of the first active pattern AP1 and the second active pattern AP2 is shown to include three active patterns for simplicity of description, the present disclosure is not limited thereto. Each of the first active pattern AP1 and the second active pattern AP2 may be one or more active patterns.

Each of the first and second active patterns AP1 and AP2 may be a part of the substrate 100 or may include an epitaxial layer grown from the substrate 100. The first and second active patterns AP1 and AP2 may include, for example, silicon or germanium, which is an elemental semiconductor material. In some example embodiments, the first active pattern AP1 and the second active pattern AP2 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

For example, the first active pattern AP1 and the second active pattern AP2 may include the same material. For example, each of the first active pattern AP1 and the second active pattern AP2 may be a silicon fin-shaped pattern. In some example embodiments, for example, each of the first active pattern AP1 and the second active pattern AP2 may be a fin-shaped pattern including a silicon-germanium pattern. As another example, the first active pattern AP1 and the second active pattern AP2 may include different materials. For example, the first active pattern AP1 may be a silicon fin-shaped pattern, and the second active pattern AP2 may be a fin-shaped pattern including a silicon-germanium pattern.

A field insulating layer 105 may be formed on the substrate 100. The field insulating layer 105 may be formed over the first active region RX1, the second active region RX2, and the field region FX. The field insulating layer 105 may fill the deep trench DT and at least a portion of the fin trench FT.

The field insulating layer 105 may be formed on a portion of the sidewall of the first active pattern AP1 and a portion of the sidewall of the second active pattern AP2. Each of the first active pattern AP1 and the second active pattern AP2 may protrude above the upper surface of the field insulating layer 105. The field insulating layer 105 may include, for example, an oxide layer, a nitride layer, an oxynitride layer, or a combination layer thereof.

At least one gate structure GS may be disposed on the substrate 100. For example, at least one gate structure GS may be disposed on the field insulating layer 105. The gate structure GS may extend in the second direction Y. The adjacent gate structures GS may be spaced apart in the first direction X.

The gate structure GS may be disposed on the first active pattern AP1 and the second active pattern AP2. The gate structure GS may intersect the first active pattern AP1 and the second active pattern AP2.

Although the gate structure GS is illustrated to be disposed over the first active region RX1 and the second active region RX2, this is only for convenience of description and is not limited thereto. That is, some of the gate structures GS may be separated into two portions by a gate isolation structure disposed on the field insulating layer 105 and may be disposed on the first active region RX1 and the second active region RX2.

The gate structure GS may include, for example, a first gate electrode 120, a first gate insulating layer 130, and a first gate spacer 140.

The first gate electrode 120 may be disposed on the first active pattern AP1 and the second active pattern AP2. The first gate electrode 120 may intersect the first active pattern AP1 and the second active pattern AP2. The first gate electrode 120 may wrap the first active pattern AP1 and the second active pattern AP2 protruding from the upper surface of the field insulating layer 105. The first gate electrode 120 may include a long side extending in the second direction Y and a short side extending in the first direction X.

The first gate electrode 120 may include a line portion 120LP and a protruding portion 120PP. The line portion 120LP of the first gate electrode may be elongated in the second direction Y. A portion of the first gate electrode 120 that intersects the first active pattern AP1 and the second active pattern AP2 may be the line portion 120LP of the first gate electrode.

The protruding portion 120PP of the first gate electrode may be disposed on the line portion 120LP of the first gate electrode. The protruding portion 120PP of the first gate electrode may protrude in the third direction Z from the line portion 120LP of the first gate electrode. On the basis of (or with respect to) an upper surface AP1_US of the first active pattern, the upper surface of the protruding portion 120PP of the first gate electrode is higher than an upper surface 120LP_US of the line portion of the first gate electrode.

The protruding portion 120PP of the first gate electrode includes an upper surface 120US of the first gate electrode. The upper surface of the protruding portion 120PP of the first gate electrode is the upper surface 120US of the first gate electrode.

Figure 2:
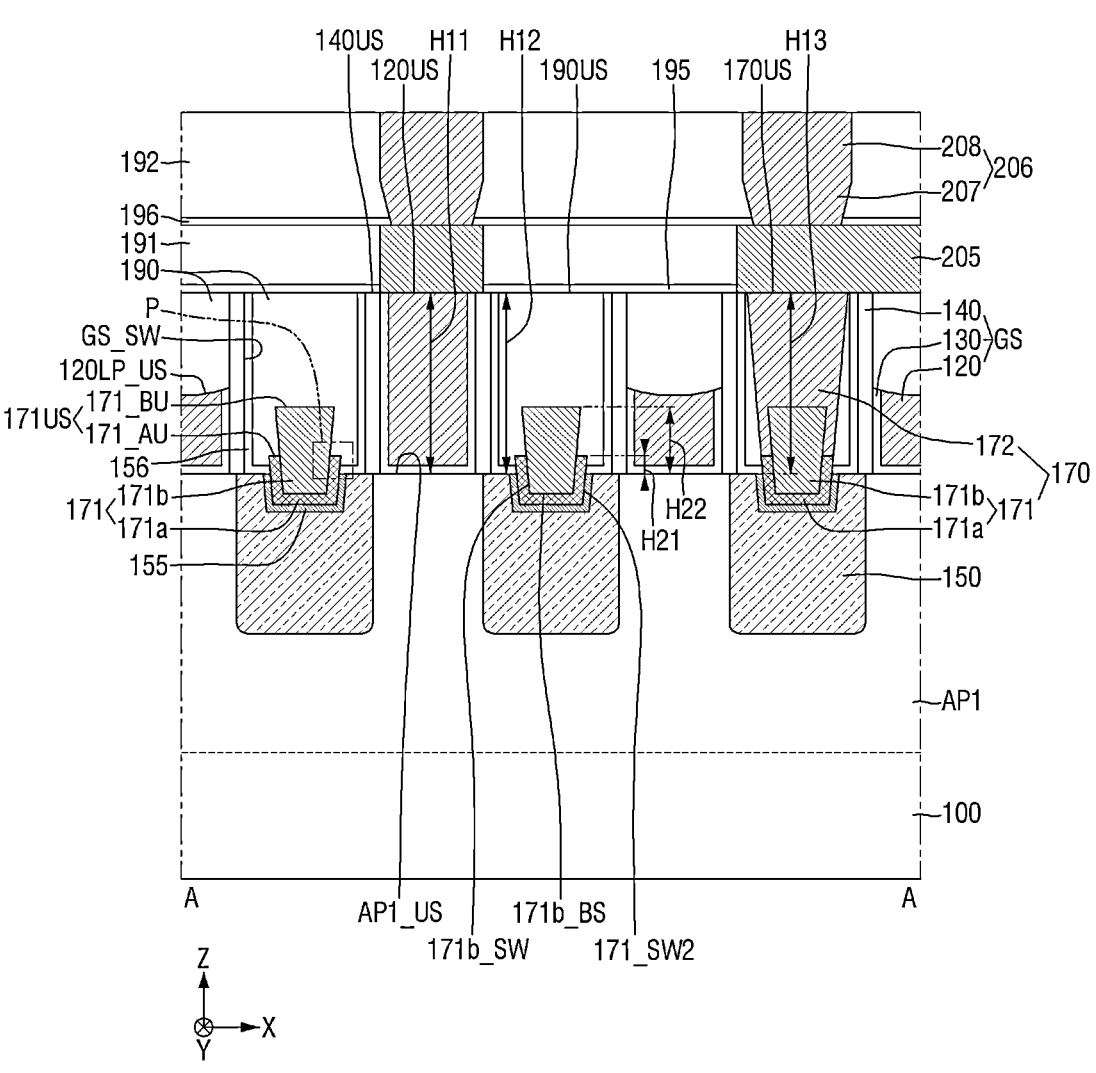
FIGS. 2 to 5 are example cross-sectional views taken along lines A-A, B-B, C-C and D-D of FIG. 1, respectively.

In FIG. 2, the upper surface 120LP_US of the line portion of the first gate electrode may be a concave surface recessed with respect to the upper surface AP1_US of the first active pattern, but is not limited thereto. That is, unlike the illustrated example, the upper surface 120LP_US of the line portion of the first gate electrode may be a flat surface.

In FIG. 3, the upper surface 120LP_US of the line portion of the first gate electrode is illustrated to be a flat surface, but is not limited thereto. Unlike the illustrated example, the upper surface 120LP_US of the line portion of the first gate electrode may include a concave surface. The width in the second direction Y of the protruding portion 120PP of the first gate electrode may decrease as the protruding portion 120PP becomes farther from the substrate 100. Unlike the illustrated example, the width of the protruding portion 120PP of the first gate electrode in the second direction Y may be constant regardless of a distance from the substrate 100.

The first gate electrode 120 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof.

The first gate electrode 120 may include conductive metal oxide, conductive metal oxynitride or the like, and may include an oxidized form of the aforementioned material.

The first gate electrodes 120 may be disposed on both sides of a first source/drain pattern 150 to be described later. The gate structures GS may be disposed on both sides of the first source/drain pattern 150 in the first direction X.

For example, the first gate electrodes 120 disposed on both sides of the first source/drain pattern 150 may be normal gate electrodes used as gates of transistors. As another example, the first gate electrode 120 disposed on one side of the first source/drain pattern 150 may be used as a gate of a transistor, whereas the first gate electrode 120 disposed on the other side of the first source/drain pattern 150 may be used as a dummy gate electrode.

Although not shown, the first gate electrodes 120 may be disposed on both sides of a second source/drain pattern 250 to be described later. The gate structures GS may be disposed on both sides of the second source/drain pattern 250 in the first direction X. As described above, the first gate electrodes 120 disposed on both sides of the second source/drain pattern 250 may be normal gate electrodes or dummy gate electrodes.

The first gate spacer 140 may be disposed on the sidewall of the first gate electrode 120. The first gate spacer 140 may extend in the second direction Y. The first gate spacer 140 may be a sidewall GS_SW of the gate structure.

The first gate spacer 140 may include, for example, at least one of silicon nitride (SiN), silicon oxynitride (SiON), silicon oxide (SiO_2), silicon oxynitride (SiOCN), silicon boron nitride (SiBN), silicon oxyboron nitride (SiOBN), silicon oxycarbide (SiOC) or a combination thereof.

For example, an upper surface 140US of the first gate spacer may be coplanar with the upper surface 120US of the first gate electrode. In other words, on the basis of (or with respect to) the upper surface AP1_US of the first active pattern, a height H11 of the upper surface 120US of the first gate electrode may be the same as a height H12 of the upper surface 140US of the first gate spacer. Here, the meaning of the "same height" includes not only a case where heights are completely the same at two positions being compared, but also a case where there is a minute difference in height therebetween that might be caused due to a margin in a process or the like.

The first gate insulating layer 130 may extend along the sidewall and the bottom surface of the first gate electrode 120. The first gate insulating layer 130 may be formed on the first active pattern AP1, the second active pattern AP2, and the field insulating layer 105. The first gate insulating layer 130 may be formed between the first gate electrode 120 and the first gate spacer 140.

The first gate insulating layer 130 may be formed along the profile of the first active pattern AP1 protruding above the field insulating layer 105, the profile of the second active pattern AP2, and the upper surface of the field insulating layer 105. Although not illustrated, an interface layer may be further formed along the profile of the second active pattern AP2 and the profile of the first active pattern AP1 protruding above the field insulating layer 105. Each of the first gate insulating layers 130 may be formed on the interface layer.

The first gate insulating layer 130 may include silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some example embodiments may include a negative capacitor (NC) FET using a negative capacitor (NC). For example, the first gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 nm to 10 nm, but is not limited thereto. Because a critical thickness at which each ferroelectric material exhibits ferroelectric properties may be different, the thickness of the ferroelectric material layer may vary depending on the ferroelectric material.

In one example, the first gate insulating layer 130 may include one ferroelectric material layer. In another example, the first gate insulating layer 130 may include a plurality of ferroelectric material layers spaced apart from each other. The first gate insulating layer 130 may have a laminated layer structure in which a plurality of ferroelectric material layers and a plurality of paraelectric material layers are alternately laminated.

The first source/drain pattern 150 may be disposed on the first active pattern AP1. The first source/drain pattern 150 may be positioned on the substrate 100. The first source/drain pattern 150 may be disposed on the side surface of the gate structure GS. The first source/drain pattern 150 may be disposed between the gate structures GS. The first source/drain pattern 150 includes a bottom surface 150BS connected to the first active pattern AP1.

For example, the first source/drain patterns 150 may be disposed on both sides of the gate structure GS. Unlike the illustrated example, the first source/drain pattern 150 may be disposed on one side of the gate structure GS and may not be disposed on the other side of the gate structure GS.

The second source/drain pattern 250 may be disposed on the second active pattern AP2. The second source/drain pattern 250 may be positioned on the substrate 100. As an example, although not shown, the second source/drain patterns 250 may be disposed on both sides of the gate structure GS. As another example, the second source/drain pattern 250 may be disposed on one side of the gate structure GS and may not be disposed on the other side of the gate structure GS. The second source/drain pattern 250 includes a bottom surface 250BS connected to the second active pattern AP2.

Each of the first source/drain pattern 150 and the second source/drain pattern 250 may include an epitaxial pattern. The first source/drain pattern 150 and the second source/drain pattern 250 may include, for example, a semiconductor material.

The first source/drain pattern 150 may be connected to a channel pattern portion used as a channel among the first active patterns AP1. The second source/drain pattern 250 may be connected to a channel pattern portion used as a channel among the second active patterns AP2.

The first source/drain pattern 150 is illustrated as merging of three epitaxial patterns formed on the respective first active patterns AP1. However, this is merely for simplicity of description and the present disclosure is not limited thereto. That is, epitaxial patterns formed on the respective first active patterns AP1 may be separated from each other.

For example, an air gap may be disposed in a space between the first source/drain patterns 150 combined with the field insulating layer 105. As another example, an insulating material may be filled in a space between the first source/drain patterns 150 combined with the field insulating layer 105.

The description of the second source/drain pattern 250 may be the same as or substantially similar to the description of the first source/drain pattern 150 stated above.

A source/drain etch stop layer 156 may be disposed on the upper surface of the field insulating layer 105, the sidewall GS_SW of the gate structure, the upper surface of the first source/drain pattern 150, the sidewall of the first source/drain pattern 150, the upper surface of the second source/drain pattern 250, and the sidewall of the second source/drain pattern 250.

The source/drain etch stop layer 156 may include a material having etch selectivity on the basis of (or with respect to) a first portion 190A of a first interlayer insulating layer 190 to be described later. The source/drain etch stop layer 156 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof. Unlike the illustrated example, the source/drain etch stop layer 156 may not be formed.

The first interlayer insulating layer 190 may be formed on the field insulating layer 105. The first interlayer insulating layer 190 may be disposed on the first source/drain pattern 150. An upper surface 190US of the first interlayer insulating layer may be coplanar with the upper surface 120US of the first gate electrode and the upper surface 140US of the first gate spacer.

The first interlayer insulating layer 190 may include the first portion 190A and a second portion 190B. The first portion 190A of the first interlayer insulating layer is located below the first source/drain contact 170 and the second source/drain contact 270 to be described later. The second portion 190B of the first interlayer insulating layer may be disposed on the upper surface 120LP_US of the line portion of the first gate electrode, an upper surface 171US of a first lower source/drain contact, and the upper surface of a second lower source/drain contact 271. The second portion 190B of the first interlayer insulating layer covers the sidewall of the protruding portion 120PP of the first gate electrode, the sidewall of a first upper source/drain contact 172, and the sidewall of a second upper source/drain contact 272.

The first interlayer insulating layer 190 may include, for example, at least one of silicon oxide, silicon nitride, silicon oxynitride, silicon oxycarbide, silicon oxycarbonitride, silicon carbonitride, or a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

A contact isolation structure 160 is disposed on the substrate 100. For example, the contact isolation structure 160 is disposed on the field insulating layer 105. The contact isolation structure 160 is disposed between the gate structures GS adjacent to each other in the first direction X.

The contact isolation structure 160 is disposed in the first interlayer insulating layer 190. The contact isolation structure 160 may be in contact with the gate structure GS. The contact isolation structure 160 may be in contact with, for example, the gate spacer 140. The contact isolation structure 160 may be disposed between the first source/drain contact 170 and the second source/drain contact 270 to be described later.

An upper surface 160US of the contact isolation structure may be coplanar with, for example, the upper surface 190US of the first interlayer insulating layer. The contact isolation structure 160 may include first sidewalls and second sidewalls. The first sidewalls of the contact isolation structure 160 may be opposed to each other in the first direction X. The second sidewalls of the contact isolation structure 160 may be opposed to each other in the second direction Y. The first sidewall of the contact isolation structure 160 may be in contact with the gate structure GS, and the second sidewall of the contact isolation structure 160 may face the first source/drain contact 170 and the second source/drain contact 270.

For example, a height H41 of the contact isolation structure 160 may be smaller than a height H42 from the bottom surface 150BS of the first source/drain pattern to the upper surface 160US of the contact isolation structure.

The width of the contact isolation structure 160 in the second direction Y may decrease as the contact isolation structure 160 becomes farther from the upper surface 160US of the contact isolation structure in the third direction Z. The distance between the second sidewalls of the contact isolation structure 160 may decrease as the contact isolation structure 160 becomes farther from the upper surface 160US of the contact isolation structure in the third direction Z. Unlike the illustrated example, the width of the contact isolation structure 160 in the second direction Y may be constant regardless of a distance from the upper surface 160US of the contact isolation structure in the third direction Z.

The contact isolation structure 160 may include, for example, at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC) or a combination thereof. Although it is illustrated that the contact isolation structure 160 is a single layer, it is merely for simplicity of description and the present disclosure is not limited thereto.

The first source/drain contact 170 may be disposed on the first active region RX1. The second source/drain contact 270 may be disposed on the second active region RX2. The first source/drain contact 170 may be connected to the first source/drain pattern 150 disposed in the first active region RX1.

The second source/drain contact 270 may be connected to the second source/drain pattern 250 disposed in the second active region RX2. The first source/drain contact 170 and the second source/drain contact 270 penetrate the etch stop layer 156 and are connected to the source/drain patterns 150 and 250, respectively.

On the basis of (or with respect to) the upper surface of the substrate 100, the height of the upper surface 160US of the contact isolation structure may be the same as the height of an upper surface 170US of the first source/drain contact and the height of an upper surface 270US of the second source/drain contact. The upper surface 170US of the first source/drain contact and the upper surface 270US of the second source/drain contact may be coplanar with the upper surface 160US of the contact isolation structure.

On the basis of (or with respect to) the upper surface AP1_US of the first active pattern, a height H13 of the upper surface 170US of the first source/drain contact may be the same as the height H11 of the upper surface 120US of the first gate electrode. That is, the height H13 from the upper surface AP1_US of the first active pattern to the upper surface 170US of the first source/drain contact may be the same as the height H11 from the upper surface AP1_US of the first active pattern to the upper surface 120US of the first gate electrode. The upper surface 170US of the first source/drain contact may be coplanar with the upper surface 120US of the first gate electrode.

Although not shown, on the basis of (or with respect to) the upper surface of the second active pattern AP2, the height of the upper surface 270US of the second source/drain contact may be the same as the height H11 of the upper surface 120US of the first gate electrode. The upper surface 270US of the second source/drain contact may be coplanar with the upper surface 120US of the first gate electrode.

In a semiconductor device according to some example embodiments, the first source/drain contact 170 and the second source/drain contact 270 may be in contact with the contact isolation structure 160.

The first source/drain contact 170 includes a first lower source/drain contact 171 and a first upper source/drain contact 172. The first upper source/drain contact 172 is disposed on the first lower source/drain contact 171. The first upper source/drain contact 172 includes the upper surface 170US of the first source/drain contact. The upper surface of the first upper source/drain contact 172 is the upper surface 170US of the first source/drain contact.

The second source/drain contact 270 includes the second lower source/drain contact 271 and a second upper source/drain contact 272. The second upper source/drain contact 272 is disposed on the second lower source/drain contact 271. The second upper source/drain contact 272 includes the upper surface 270US of the second source/drain contact. The upper surface of the second upper source/drain contact 272 is the upper surface 270US of the second source/drain contact.

The first lower source/drain contact 171 may include a first lower source/drain filling layer 171b and a first lower source/drain barrier layer 171a. The first lower source/drain filling layer 171b is disposed on the first lower source/drain barrier layer 171a.

The first lower source/drain barrier layer 171a extends along a sidewall 171b_SW of the first lower source/drain filling layer. In a semiconductor device according to some example embodiments, the first lower source/drain barrier layer 171a may extend along a bottom surface 171b_BS of the first lower source/drain filling layer. The first lower source/drain barrier layer 171a may extend along the boundary between the first lower source/drain filling layer 171b and the first source/drain pattern 150.

The upper surface 171US of the first lower source/drain contact is lower than the upper surface 120US of the first gate electrode. The first interlayer insulating layer 190 covers the upper surface 171US of the first lower source/drain contact. The upper surface 171US of the first lower source/drain contact includes an upper surface 171_AU of the first lower source/drain barrier layer and an upper surface 171_BU of the first lower source/drain filling layer.

In a semiconductor device according to some example embodiments, the first lower source/drain barrier layer 171a may extend along a portion of the sidewall 171b_SW of the first lower source/drain filling layer. The sidewall 171b_SW of the first lower source/drain filling layer includes a portion not covered with the first lower source/drain barrier layer 171a.

On the basis of (or with respect to) the upper surface AP1_US of the first active pattern, the upper surface 171_BU of the first lower source/drain filling layer is higher than the upper surface 171_AU of the first lower source/drain barrier layer. A height H22 from the upper surface AP1_US of the first active pattern to the upper surface 171_BU of the first lower source/drain filling layer is greater than a height H21 from the upper surface AP1_US of the first active pattern to the upper surface 171_AU of the first lower source/drain barrier layer. A portion of the first lower source/drain filling layer 171b may protrude above the first lower source/drain barrier layer 171a.

Although the upper surface 171_BU of the first lower source/drain filling layer is shown to be flat in FIG. 2, it is only for simplicity of illustration and is not limited thereto. The width in the first direction X of the first lower source/drain filling layer 171b may increase as the first lower source/drain filling layer 171b becomes farther from the first source/drain pattern 150 in the third direction Z. The distance between the sidewalls 171b_SW of the first lower source/drain filling layer opposed to each other in the first direction X may increase as the first lower source/drain filling layer becomes farther from the first source/drain pattern 150 in the third direction Z. A point at which the upper surface 171_BU of the first lower source/drain filling layer meets the sidewall 171b_SW of the first lower source/drain filling layer is illustrated as being angular, but the present disclosure is not limited thereto.

The width in the second direction Y of the first source/drain filling layer 171b may decrease as the first source/drain filling layer 171b becomes farther from the first source/drain pattern 150 in the third direction Z. Unlike the illustrated example, the width of the first source/drain filling layer 171b in the second direction Y may be maintained constant regardless of a distance from the first source/drain pattern 150.

In FIG. 4, the upper surface of the first lower source/drain filling layer is shown to be a flat surface, but the present disclosure is not limited thereto. In cross-sectional view cut in the second direction Y, the upper surface 171_BU of the first lower source/drain filling layer may include a concave surface. The second portion 190B of the first interlayer insulating layer may fill a space between the first source/drain filling layer 171b and the contact isolation structure 160.

Although the bottom surface 171b_BS of the first lower source/drain filling layer is shown to have a wavy shape, the present disclosure is not limited thereto. Unlike the illustrated example, the bottom surface 171b_BS of the first lower source/drain filling layer may have a flat shape.

The first lower source/drain contact 171 includes a first sidewall 171_SW1 and a second sidewall 171_SW2. The first sidewall 171_SW1 of the first lower source/drain contact may extend in the first direction X. The second sidewall 171_SW2 of the first lower source/drain contact may extend in the second direction Y. The first sidewall 171_SW1 of the first lower source/drain contact faces the contact isolation structure 160. The second sidewall 171_SW2 of the first lower source/drain contact faces the gate structure GS.

In FIG. 6, the upper surface 171_AU of the first lower source/drain barrier layer may be a flat surface.

In FIGS. 7 and 8, the upper surface 171_AU of the first lower source/drain barrier layer may include a concave surface. The upper surface 171_AU of the first lower source/drain barrier layer may be a concave surface. The height of the uppermost portion of the second sidewall 171_SW2 of the first lower source/drain contact may be a first protruding height H31, and the height of the point where the first lower source/drain barrier layer 171a meets the first lower source/drain filling layer 171b may be a second protruding height H32. The first protruding height H31 and the second protruding height H32 may be measured based on the lowermost portion of the upper surface 171_AU of the first lower source/drain barrier layer.

In FIG. 7, the first protruding height H31 may be equal to the second protruding height H32. In FIG. 8, the second protruding height H32 is greater than the first protruding height H31.

The first upper source/drain contact 172 is disposed on the upper surface 171US of the first lower source/drain contact. In a semiconductor device according to some example embodiments, the first upper source/drain contact 172 may have a single material layer structure. The first upper source/drain contact 172 may be formed of a single conductive material. In this case, the first upper source/drain contact 172 may include impurities that are unintentionally introduced in the process of forming the first upper source/drain contact 172.

As an example, the first upper source/drain contact 172 may be formed of a single grain. As another example, the first upper source/drain contact 172 may include a plurality of crystal grains separated by grain boundaries.

The width in the second direction Y of the first upper source/drain contact 172 may decrease as the first upper source/drain contact 172 becomes farther from the first source/drain pattern 150 in the third direction Z. Unlike the illustrated example, the width of the first upper source/drain contact 172 in the second direction Y may be maintained constant regardless of a distance from the first source/drain pattern 150 in the third direction Z.

The second lower source/drain contact 271 may include a second lower source/drain filling layer 271b and a second lower source/drain barrier layer 271a. The second lower source/drain filling layer 271b is disposed on the second lower source/drain barrier layer 271a. The second lower source/drain contact 271 includes a first sidewall 271_SW1 facing the contact isolation structure 160.

The second upper source/drain contact 272 is disposed on the upper surface of the second lower source/drain contact 271.

Because the description of the second lower source/drain contact 271 is the same as or substantially similar to that of the first lower source/drain contact 171, redundant description thereof will be omitted below. Because the description of the second upper source/drain contact 272 is the same as or substantially similar to that of the first upper source/drain contact 172, redundant description thereof will be omitted below.

The first lower source/drain barrier layer 171a and the second lower source/drain barrier layer 271a may include, for example, at least one of tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh), but are not limited thereto. The first lower source/drain barrier layer 171a and the second lower source/drain barrier layer 271a include the same material.

The first lower source/drain filling layer 171b and the second lower source/drain filling layer 271b may include, for example, at least one of aluminum (Al), tungsten (W), cobalt (Co), copper (Cu), ruthenium (Ru), silver (Ag), gold (Au), manganese (Mn), or molybdenum (Mo), but are not limited thereto. The first lower source/drain filling layer 171b and the second lower source/drain filling layer 271b include the same material.

The first upper source/drain contact 172 and the second upper source/drain contact 272 may include, for example, one of titanium (Ti), tungsten (W), molybdenum (Mo), ruthenium (Ru), and cobalt (Co), but are not limited thereto. The first upper source/drain contact 172 and the second upper source/drain contact 272 include the same material.

A first contact silicide layer 155 is disposed between the first source/drain contact 170 and the first source/drain pattern 150. The first source/drain contact 170 is disposed on the first contact silicide layer 155.

A second contact silicide layer 255 is disposed between the second source/drain contact 270 and the second source/drain pattern 250. The second source/drain contact 270 is disposed on the second contact silicide layer 255.

The first contact silicide layer 155 and the second contact silicide layer 255 include a metal silicide material. As an example, the first contact silicide layer 155 and the second contact silicide layer 255 may include a metal silicide material containing a metal included in the first lower source/drain barrier layer 171a. As another example, the first contact silicide layer 155 and the second contact silicide layer 255 may include a metal silicide material containing a metal that is not included in the first lower source/drain barrier layer 171a.

A second interlayer insulating layer 191 is disposed on the first interlayer insulating layer 190. A first wiring etch stop layer 195 may be disposed between the first interlayer insulating layer 190 and the second interlayer insulating layer 191. The first wiring etch stop layer 195 may extend along the upper surface 120US of the first gate electrode, the upper surface 190US of the first interlayer insulating layer, the upper surface 160US of the contact isolation structure, the upper surface 170US of the first source/drain contact, and the upper surface 270US of the second source/drain contact.

A first wiring structure may be disposed in the second interlayer insulating layer 191. The first wiring structure includes the first wiring line 205. At least a portion of the first wiring line 205 may have a line shape extending in the first direction X. The first wiring structure may not include a via connected to the first source/drain contact 170, the second source/drain contact 270, and the first gate electrode 120.

The first wiring line 205 may be disposed in the second interlayer insulating layer 191. The first wiring line 205 penetrates the first wiring etch stop layer 195. The first wiring line 205 may be in contact with the first source/drain contact 170, the second source/drain contact 270, and the first gate electrode 120. The first wiring line 205 may be directly connected to the upper surface 120US of the first gate electrode, the upper surface 170US of the first source/drain contact, and the upper surface 270US of the second source/drain contact.

Although the first wiring line 205 is shown to be a single layer, it is only for simplicity of description, and the present disclosure is not limited thereto. As an example, the first wiring line 205 may include a barrier layer and a filling layer on upper of the barrier layer. As another example, the first wiring line 205 may include a filling layer without a barrier layer.

A third interlayer insulating layer 192 is disposed on the second interlayer insulating layer 191. A second wiring etch stop layer 196 may be disposed between the second interlayer insulating layer 191 and the third interlayer insulating layer 192. The second wiring etch stop layer 196 may extend along the upper surface of the second interlayer insulating layer 191 and the upper surface of the first wiring line 205.

The second wiring structure 206 may be disposed in the third interlayer insulating layer 192. The second wiring structure 206 is disposed on the first wiring line 205. The second wiring structure 206 is connected to the first wiring line 205.

The second wiring structure 206 may include a second wiring line 208 and a via 207. The second wiring line 208 may be connected to the first wiring line 205 through the via 207. The via 207 is formed through the second wiring etch stop layer 196 and is connected to the first wiring line 205. At least a portion of the second wiring line 208 may have a line shape extending in the second direction Y.

Although the second wiring structure 206 is shown to be a single layer, it is only for simplicity of description, and the present disclosure is not limited thereto. For example, the second wiring structure 206 may include a barrier layer and a filling layer on upper of the barrier layer. As another example, the first wiring line 205 may include a filling layer without a barrier layer. As still another example, one of the second wiring line 208 and the via 207 may include a barrier layer and a filling layer, and the other may include a filling layer without a barrier layer.

Each of the second interlayer insulating layer 191 and the third interlayer insulating layer 192 may include, for example, at least one of silicon oxide, silicon nitride, silicon oxynitride, silicon oxycarbide, silicon oxycarbonitride, silicon carbonitride, or a low-k material.

The first wiring etch stop layer 195 may include a material having an etch selectivity on the basis of (or with respect to) the second interlayer insulating layer 191. The second wiring etch stop layer 196 may include a material having an etch selectivity on the basis of (or with respect to) the third interlayer insulating layer 192. Each of the first wiring etch stop layer 195 and the second wiring etch stop layer 196 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN) and aluminum oxycarbide (AlOC), or a combination thereof. Although each of the first wiring etch stop layer 195 and the second wiring etch stop layer 196 is shown to be a single layer, the present disclosure is not limited thereto. Unlike the illustrated example, at least one of the first wiring etch stop layer 195 or the second wiring etch stop layer 196 may not be formed.

Each of the first wiring line 205 and the second wiring structure 206 may include a conductive material. Each of the first wiring line 205 and the second wiring structure 206 may include, for example, at least one of a metal, a metal alloy, metal nitride, metal carbonitride, a two-dimensional (2D) material, or a conductive semiconductor material.

Figure 9:
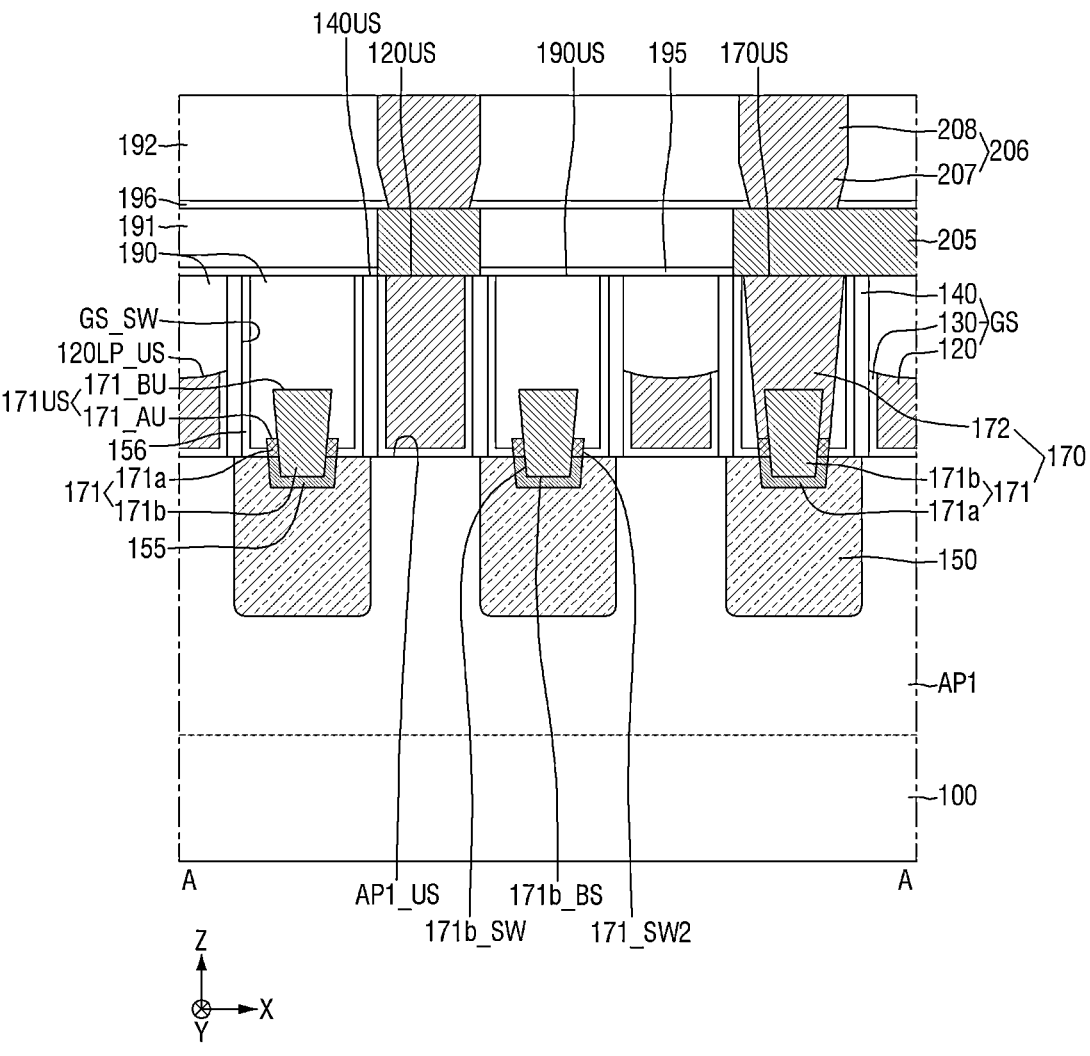
FIGS. 9 and 10 are diagrams illustrating a semiconductor device according to an example embodiment.
Figure 10:
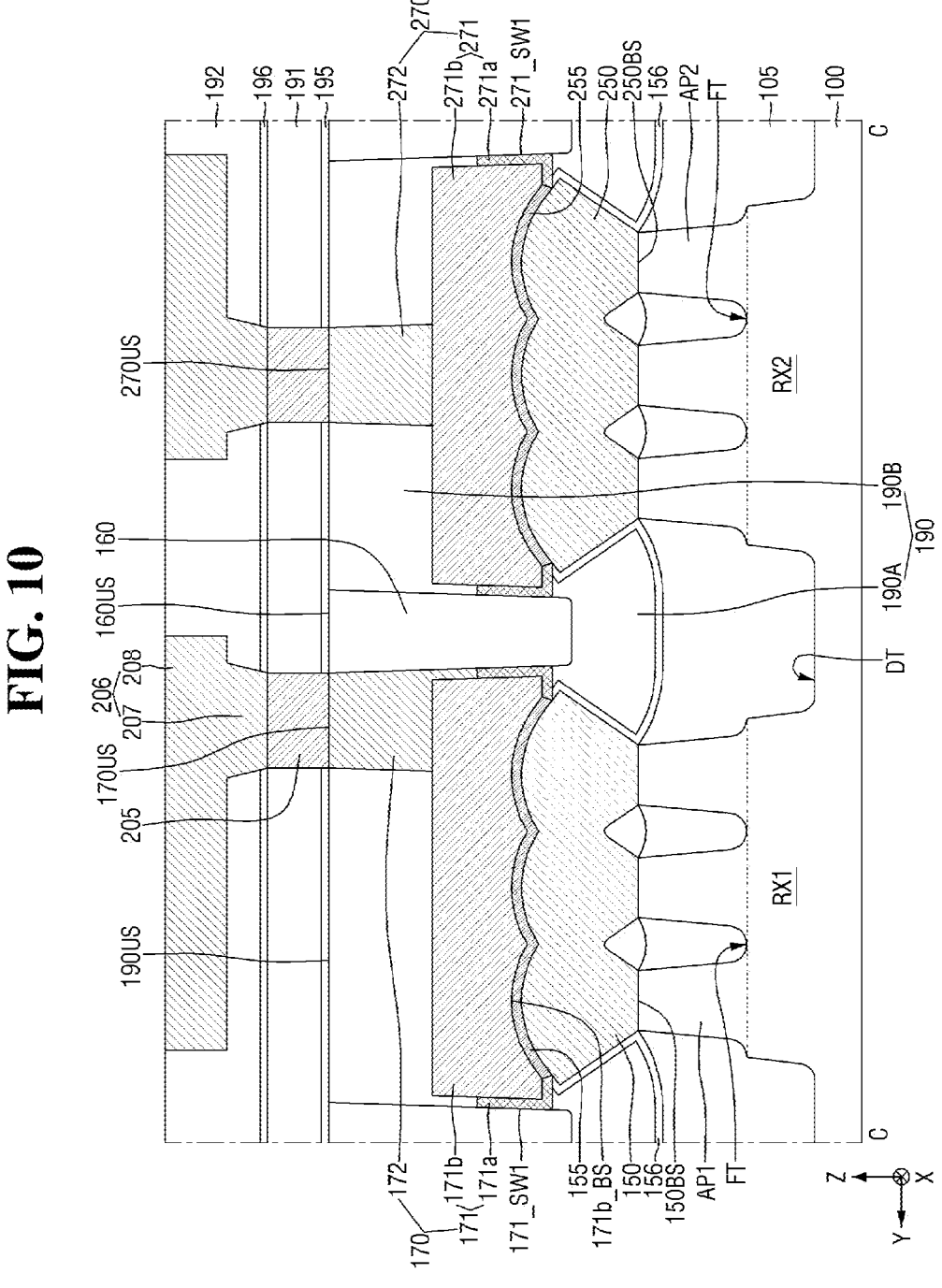
Figure 11:
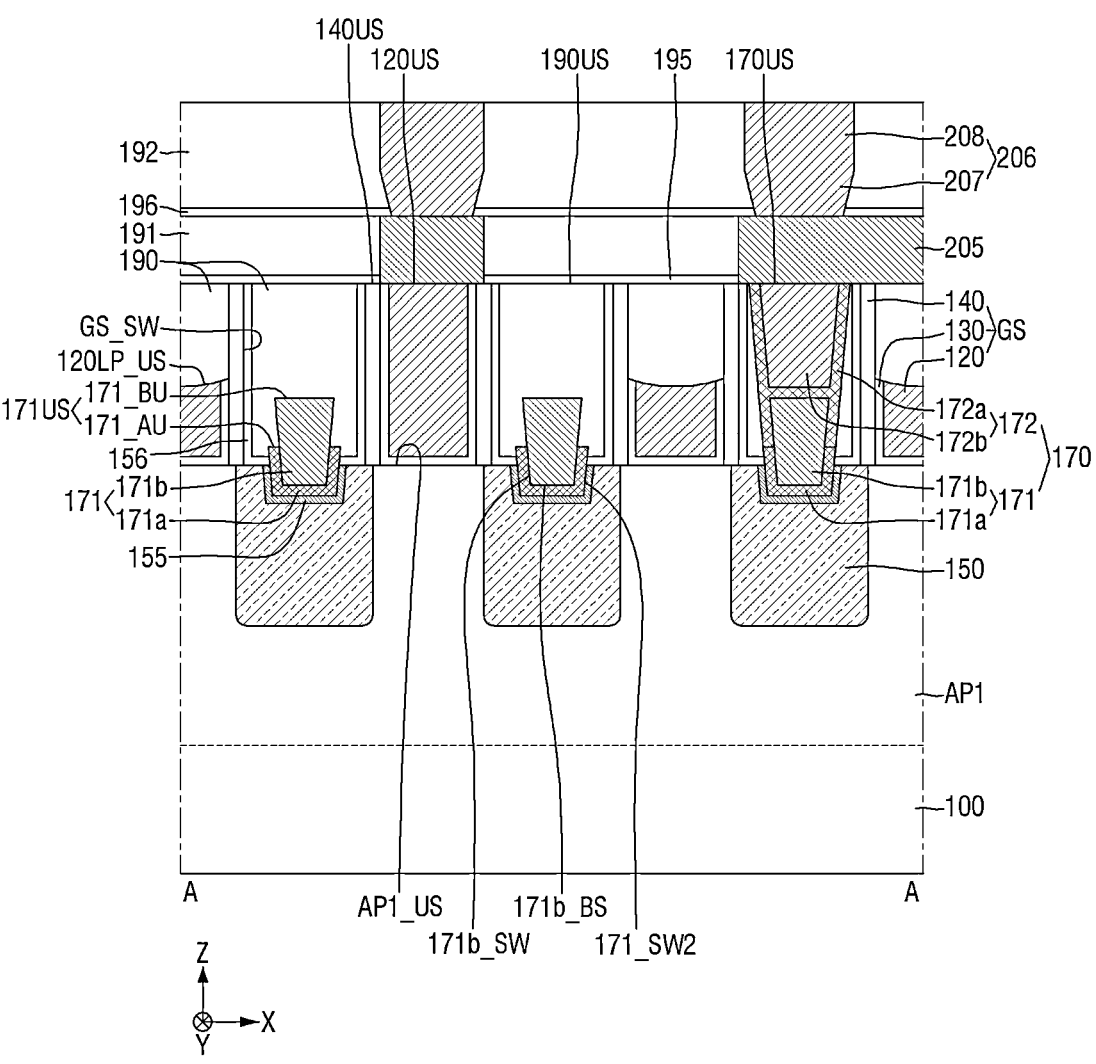
FIG. 11 is a diagram illustrating a semiconductor device according to an example embodiment.
Figure 12:
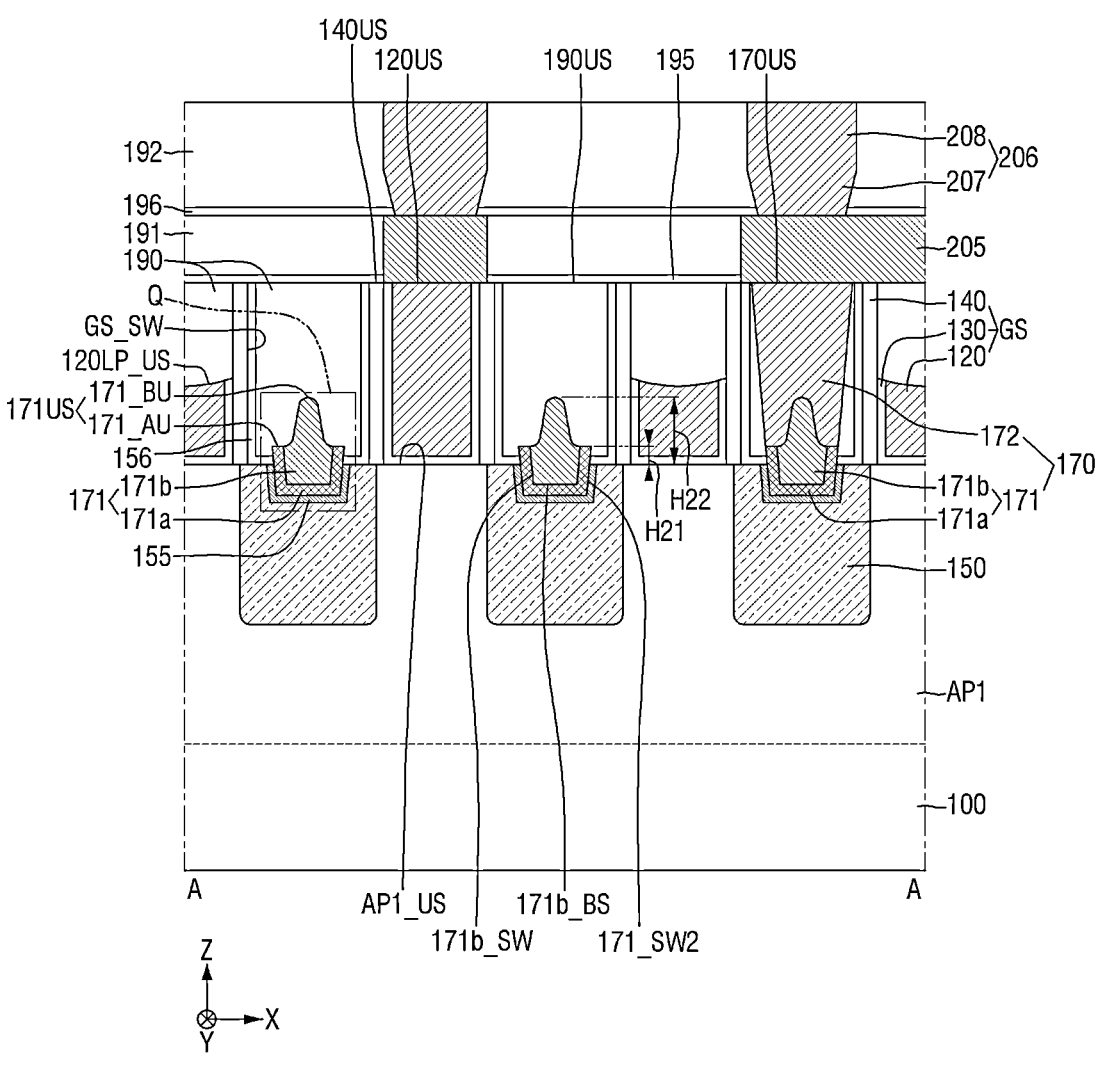
FIGS. 12 and 13 are diagrams illustrating a semiconductor device according to an example embodiment.
Figure 13:
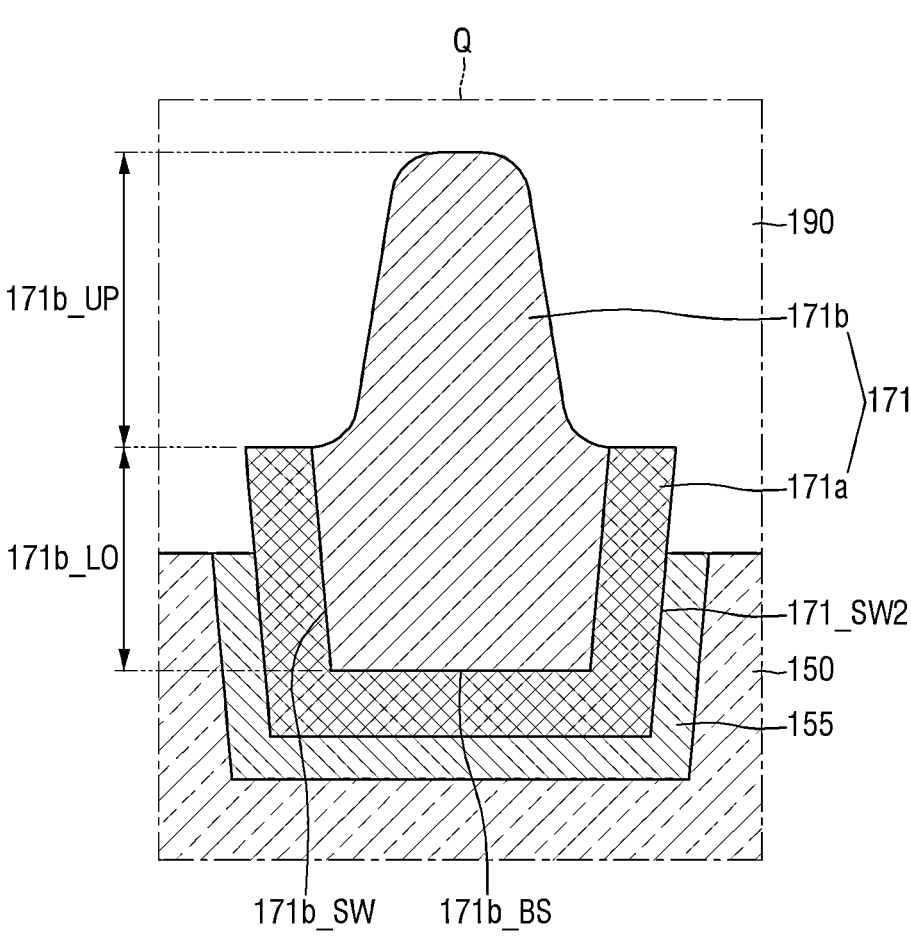
Figure 14:
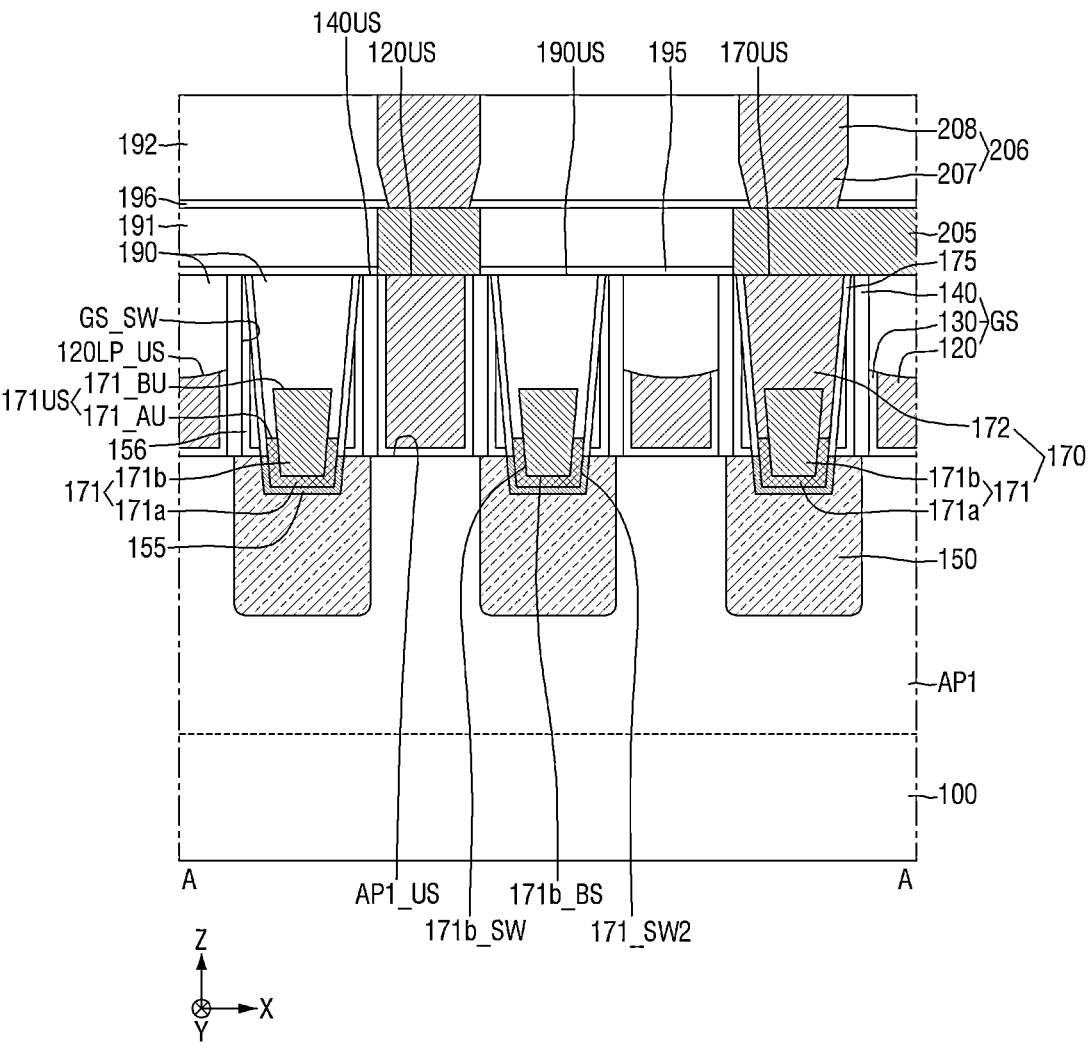
FIGS. 14 and 15 are diagrams illustrating a semiconductor device according to an example embodiment.
Figure 15:
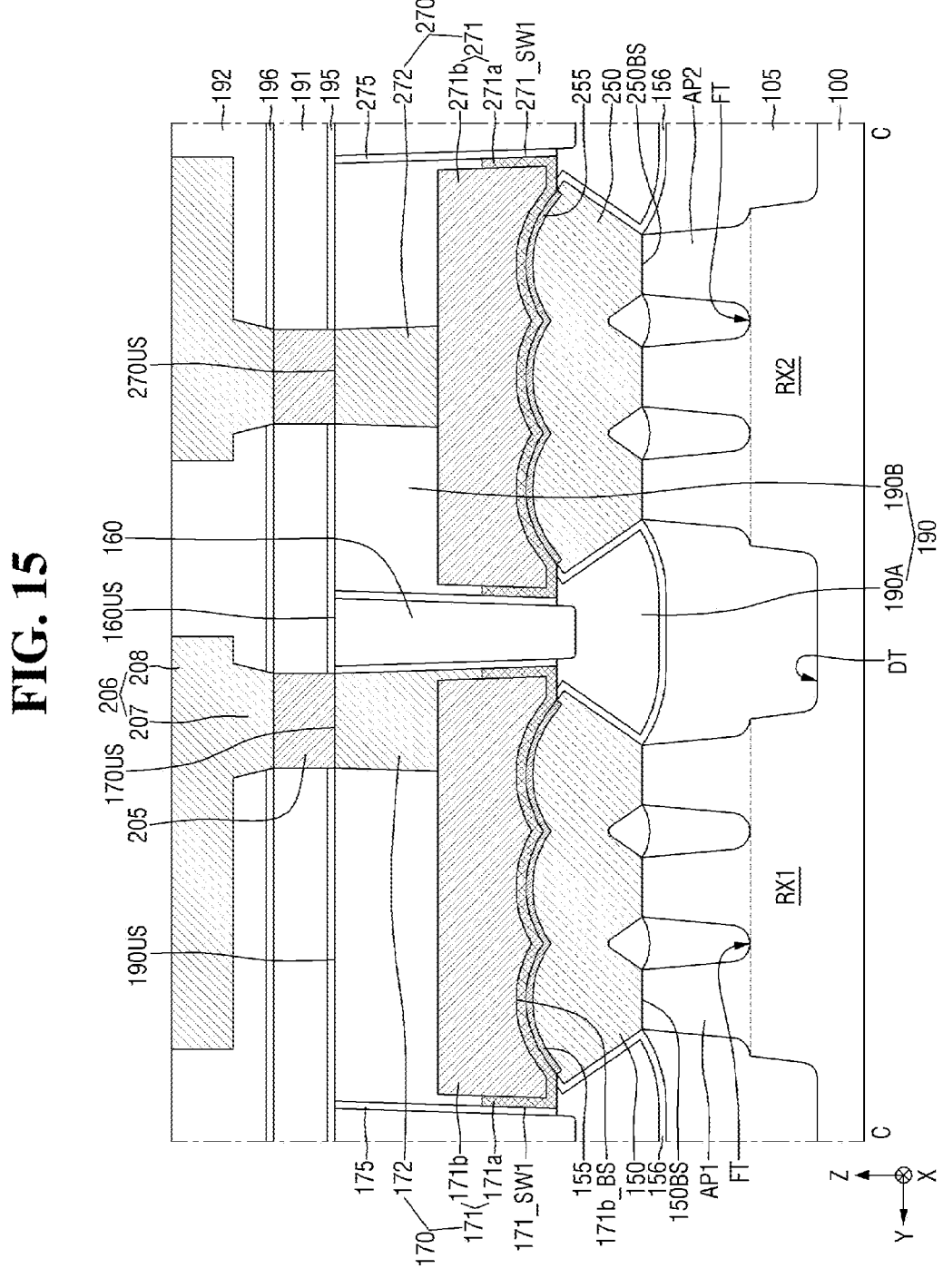

FIGS. 9 and 10 are diagrams illustrating a semiconductor device according to an example embodiment. FIG. 11 is a diagram illustrating a semiconductor device according to an example embodiment. FIGS. 12 and 13 are diagrams illustrating a semiconductor device according to an example embodiment. FIGS. 14 and 15 are diagrams illustrating a semiconductor device according to an example embodiment. For simplicity of description, the following description will focus on differences from the description with reference to FIGS. 1 to 8.

For reference, FIG. 13 is an enlarged view of part Q of FIG. 12. In addition, because the description of the second source/drain contact 270 is substantially the same as that of the first source/drain contact 170, the following description will focus on the first source/drain contact 170.

Referring to FIGS. 9 and 10, in a semiconductor device according to an example embodiment, the first lower source/drain barrier layer 171a does not extend along the boundary between the first lower source/drain filling layer 171b and the first source/drain pattern 150.

The first lower source/drain barrier layer 171a may not be disposed between the first contact silicide layer 155 and the first lower source/drain filling layer 171b. The first lower source/drain barrier layer 171a does not extend along at least a portion of the bottom surface 171b_BS of the first lower source/drain filling layer. The at least a portion of the bottom surface 171b_BS of the first lower source/drain filling layer may be in contact with the first contact silicide layer 155.

In other words, the first lower source/drain filling layer 171b may include an insertion portion inserted into the first source/drain pattern 150. The first lower source/drain barrier layer 171a may not extend along the bottom surface 171b_BS and/or the sidewall 171b_SW of the insertion portion of the first lower source/drain filling layer 171b.

Unlike the illustrated example, the first lower source/drain barrier layer 171a may not extend along the entire bottom surface 171b_BS of the first lower source/drain filling layer. The first lower source/drain barrier layer 171a may extend along the entire sidewall 171b_SW of the first lower source/drain filling layer.

Referring to FIG. 11, in a semiconductor device according to an example embodiment, the first upper source/drain contact 172 may include a first upper source/drain filling layer 172b and a first upper source/drain barrier layer 172a.

The first upper source/drain filling layer 172b is disposed on the first upper source/drain barrier layer 172a. The first upper source/drain contact 172 may have a multi-layer conductive structure like the first lower source/drain contact 171.

The description of the material included in the first upper source/drain filling layer 172b and the first upper source/drain barrier layer 172a may be the same as the description of the material included in the first lower source/drain filling layer 171b and the first lower source/drain barrier layer 171a.

Referring to FIGS. 12 and 13, in a semiconductor device according to an example embodiment, the first lower source/drain filling layer 171b may include a lower portion 171b_LO and a protruding portion 171b_UP.

The lower portion 171b_LO of the first lower source/drain filling layer may be a portion covered by the first lower source/drain barrier layer 171a. The protruding portion 171b_UP of the first lower source/drain filling layer is disposed on the lower portion 171b_LO of the first lower source/drain filling layer. The protruding portion 171b_UP of the first lower source/drain filling layer may be a portion protruding above the upper surface 171_AU of the first lower source/drain barrier layer.

For example, the width in the first direction X of the protruding portion 171b_UP of the first source/drain filling layer may decrease as the protruding portion 171b_UP becomes farther from the first source/drain pattern 150 in the third direction Z.

Although the upper surface of the protruding portion 171b_UP of the first source/drain filling layer is shown to include a flat portion, the present disclosure is not limited thereto.

Referring to FIGS. 14 and 15, a semiconductor device according to an example embodiment may further include a first contact insulating liner 175 and a second contact insulating liner 275.

The first contact insulating liner 175 extends along the sidewalls 171_SW1 and 171_SW2 of the first lower source/drain contact. The first contact insulating liner 175 extends along the second sidewall of the contact isolation structure 160. In FIG. 14, a portion of the first interlayer insulating layer 190 may be interposed between the first contact insulating liner 175 and the source/drain etch stop layer 156.

The first contact insulating liner 175 may extend up to the upper surface 160US of the contact isolation structure. The first contact insulating liner 175 does not cover the upper surface 160US of the contact isolation structure. For example, on the basis of (or with respect to) the upper surface AP1_US of the first active pattern, the height of an upper surface 175US of the first contact insulating liner may be the same as the height of the upper surface 170US of the first source/drain contact.

The first contact insulating liner 175 is in contact with the first lower source/drain contact 171 and the first upper source/drain contact 172. For example, the first contact insulating liner 175 is in contact with the sidewalls 171_SW1 and 171_SW2 of the first lower source/drain contact.

The second contact insulating liner 275 extends along the sidewall 271_SW1 of the second lower source/drain contact. The second contact insulating liner 275 extends along the second sidewall of the contact isolation structure 160. The second contact insulating liner 275 may extend up to the upper surface 160US of the contact isolation structure.

The second contact insulating liner 275 is in contact with the second lower source/drain contact 271. For example, the second contact insulating liner 275 is in contact with the sidewall 271_SW1 of the second lower source/drain contact. Although not shown, similarly to those shown in FIG. 14, the second contact insulating liner 275 is in contact with the second upper source/drain contact 272.

The first contact insulating liner 175 and the second contact insulating liner 275 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof.

Unlike the illustrated example, the height of the upper surface 175US of the first contact insulating liner may be lower than the upper surface 160US of the contact isolation structure and the upper surface 170US of the first source/drain contact. In addition, the height of the upper surface of the second contact insulating liner 275 may be lower than the upper surface 160US of the contact isolation structure and the upper surface 270US of the second source/drain contact.

When the first contact insulation liner 175 and the second contact insulation liner 275 include the same material as the contact isolation structure 160, the first contact insulation liner 175 and the second contact insulation liner 275 may not be distinguished from the contact isolation structure 160 in a cross-sectional view as shown in FIG. 15.

Figure 16:
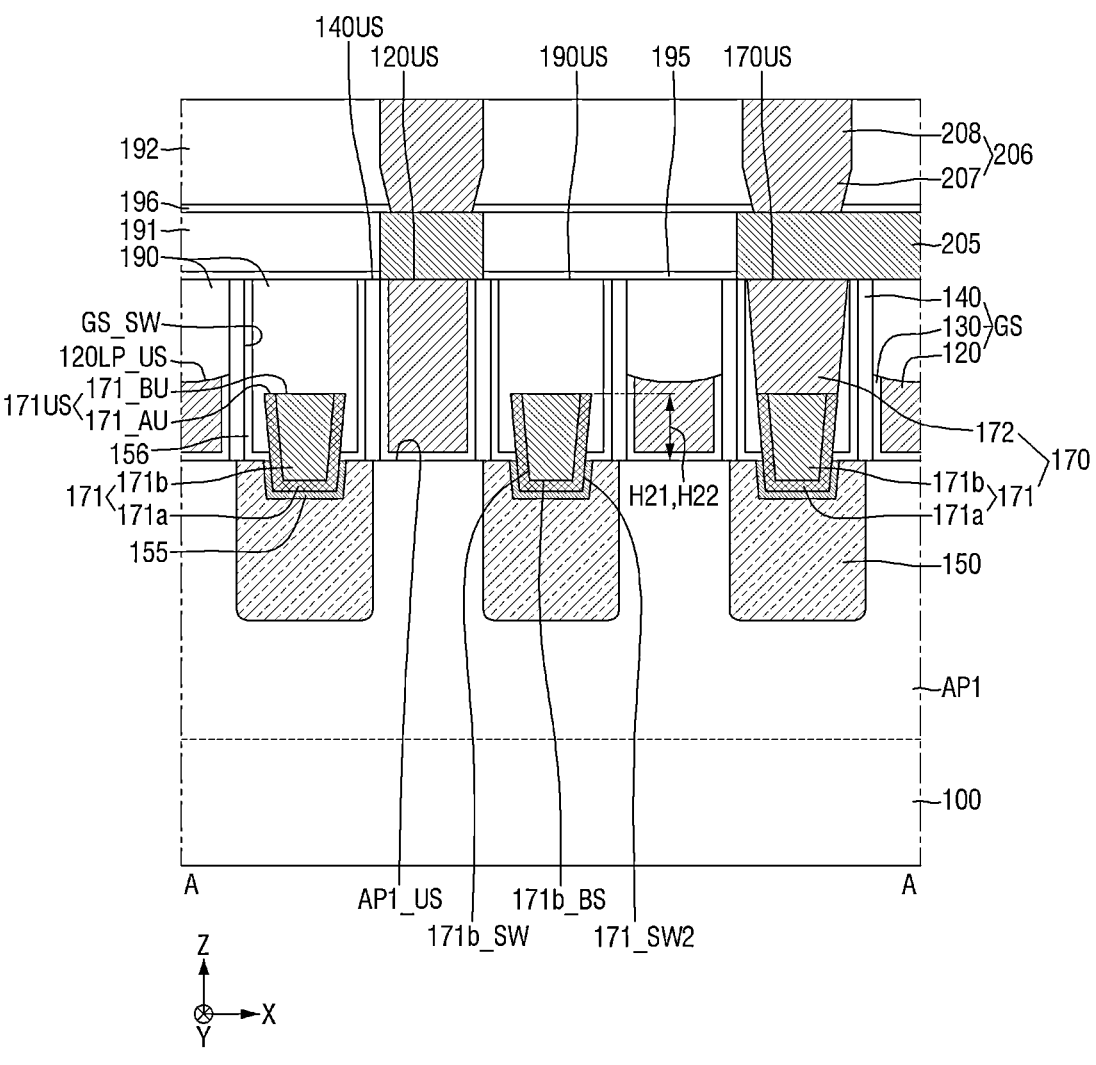
FIGS. 16 and 17 are diagrams each illustrating a semiconductor devices according to some example embodiments.
Figure 17:
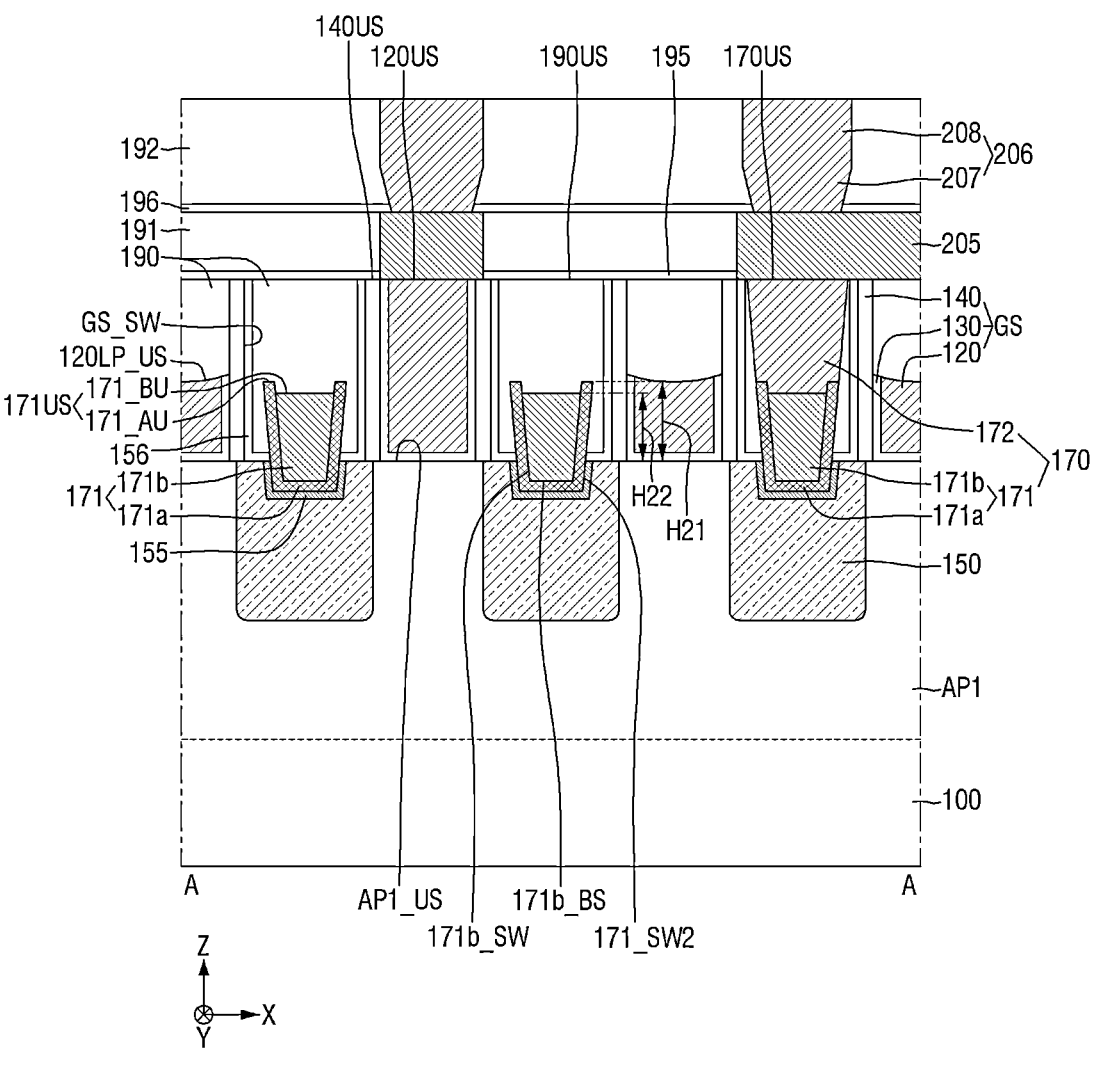

FIGS. 16 and 17 are diagrams each illustrating a semiconductor devices according to some example embodiments. For simplicity of description, the following description will focus on differences from the description with reference to FIGS. 1 to 8.

Referring to FIG. 16, in a semiconductor device according to an example embodiment, the height H22 from the upper surface AP1_US of the first active pattern to the upper surface 171_BU of the first lower source/drain filling layer may be the same as the height H21 from the upper surface AP1_US of the first active pattern to the upper surface 171_AU of the first lower source/drain barrier layer.

The upper surface 171_BU of the first lower source/drain filling layer may be coplanar with the upper surface 171_AU of the first lower source/drain barrier layer. The first lower source/drain filling layer 171b does not protrude above the first lower source/drain barrier layer 171a.

Referring to FIG. 17, in a semiconductor device according to an example embodiment, the height H22 from the upper surface AP1_US of the first active pattern to the upper surface 171_BU of the first lower source/drain filling layer is smaller than the height H21 from the upper surface AP1_US of the first active pattern to the upper surface 171_AU of the first lower source/drain barrier layer.

On the basis of (or with respect to) the upper surface AP1_US of the first active pattern, the upper surface 171_BU of the first lower source/drain filling layer is lower than the upper surface 171_AU of the first lower source/drain barrier layer. A portion of the first lower source/drain barrier layer 171a may protrude above the first lower source/drain filling layer 171b.

FIGS. 18 to 23 are diagrams each illustrating a semiconductor device according to some example embodiments. For simplicity of description, the following description will focus on differences from the description with reference to FIGS. 1 to 8.

Figure 18:
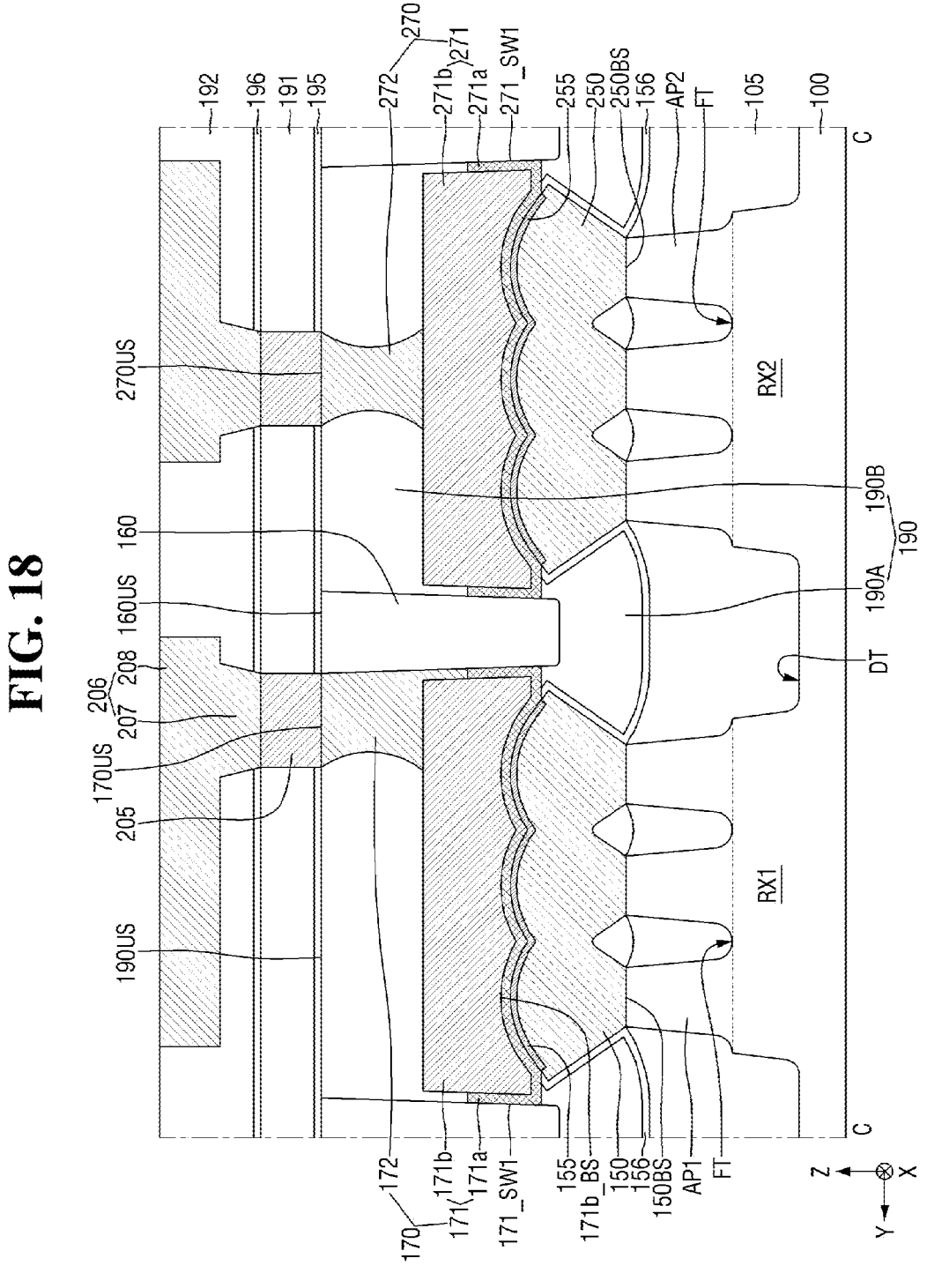
FIGS. 18 to 23 are diagrams each illustrating a semiconductor device according to some example embodiments.

Referring to FIG. 18, in a semiconductor device according to an example embodiment, at least one of the sidewalls of the first upper source/drain contact 172 and at least one of the sidewalls of the second upper source/drain contact 272 may include a concave surface.

If the second upper source/drain contact 272 is described as an example, the width in the second direction Y of the second upper source/drain contact 272 may first decrease and then increase as the second upper source/drain contact 272 becomes farther from the second lower source/drain contact 271 in the third direction Z.

When the first upper source/drain contact 172 and the second upper source/drain contact 272 are formed through a wet etching process, at least one of the sidewalls of the upper source/drain contacts 172 and 272 may include a concave surface as mentioned above.

Figure 19:
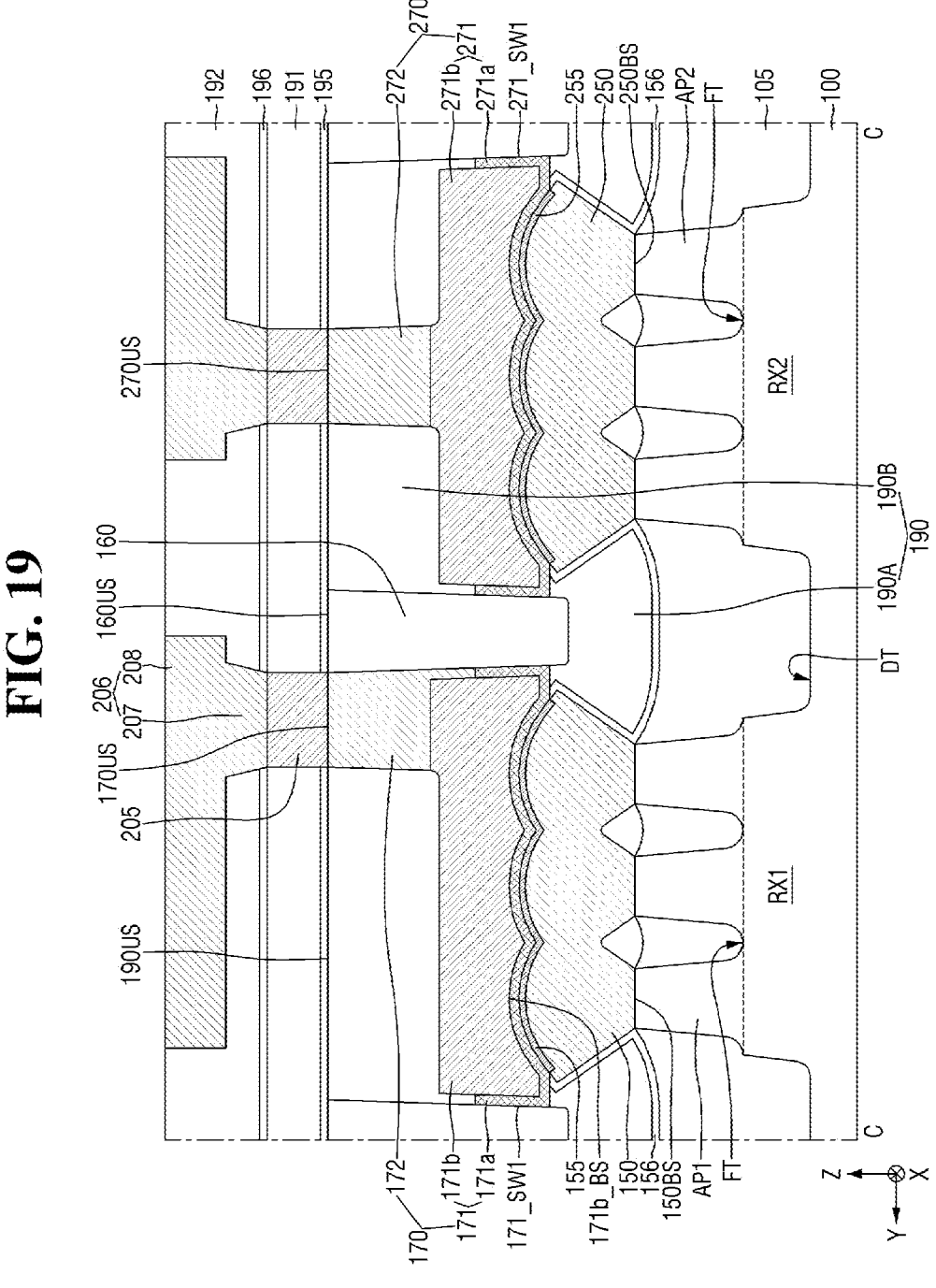

Referring to FIG. 19, in a semiconductor device according to an example embodiment, each of the first lower source/drain filling layer 171b and the second lower source/drain filling layer 271b may include a protruding portion.

If the first lower source/drain contact 17 is described as an example, the first lower source/drain filling layer 171b may include a first portion and a second portion. The first portion of the first lower source/drain filling layer 171b may overlap the first upper source/drain contact 172 in the third direction Z. The second portion of the first lower source/drain filling layer 171b does not overlap the first upper source/drain contact 172 in the third direction Z. That is, the first upper source/drain contact 172 is connected to the first portion of the first lower source/drain filling layer 171b.

The upper surface of the first portion of the first lower source/drain filling layer 171b is higher than the upper surface of the second portion thereof.

In the process of forming the first upper source/drain contact 172, a portion of the first lower source/drain filling layer 171b may be etched. As a result, the upper surface of the first portion of the first lower source/drain filling layer 171b becomes higher than the upper surface of the second portion thereof. The first portion of the first lower source/drain filling layer 171b may include a protruding portion protruding above the upper surface of the second portion of the first lower source/drain filling layer 171b in the third direction Z.

Figure 20:
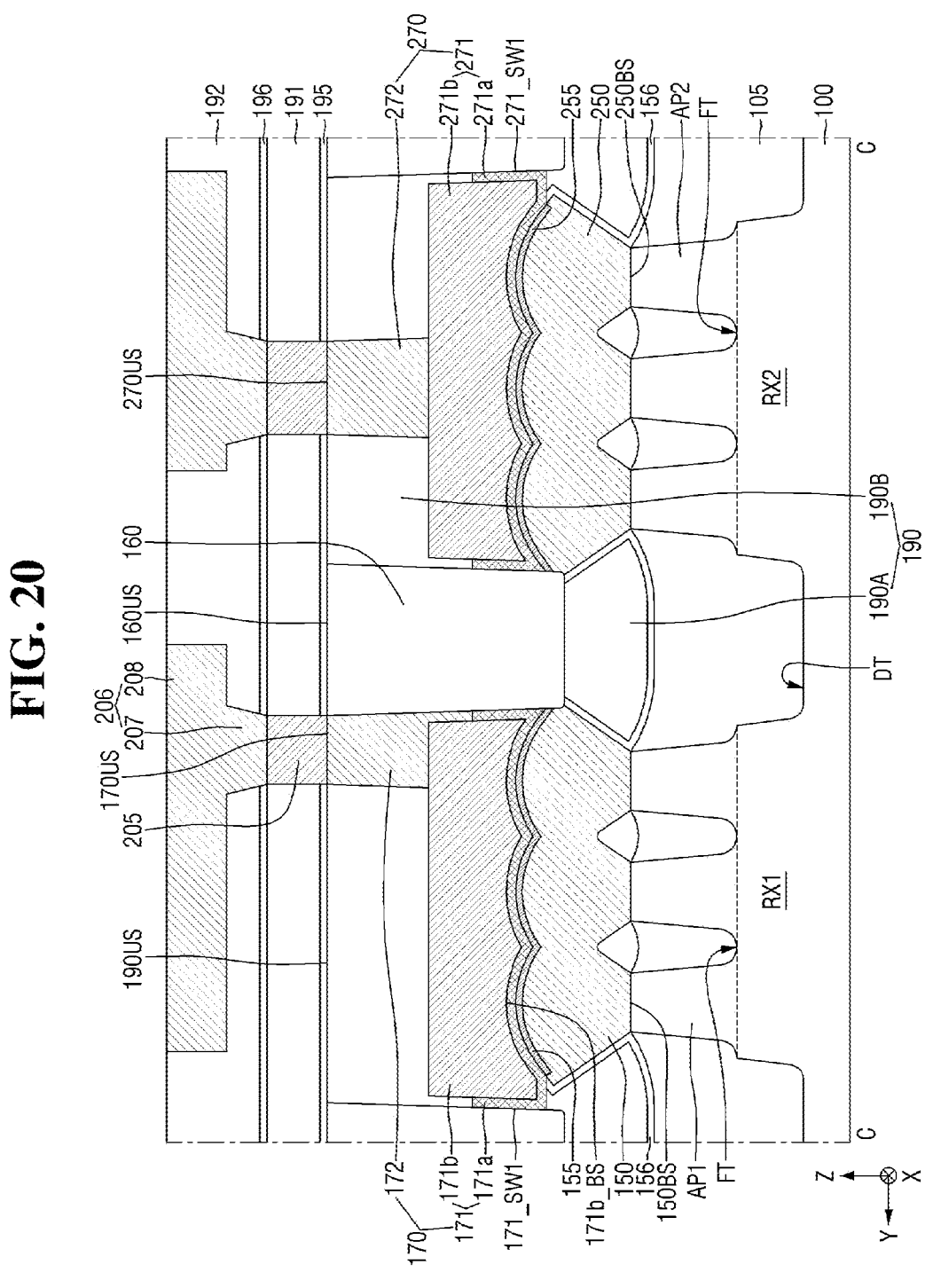

Referring to FIG. 20, in a semiconductor device according to an example embodiment, the bottom surface of the contact isolation structure 160 may overlap at least one of the first source/drain pattern 150 and the second source/drain pattern 250 in the third direction Z.

In the process of forming the contact isolation structure 160, the contact isolation structure 160 may be in contact with at least one of the first source/drain pattern 150 or the second source/drain pattern 250.

Figure 21:
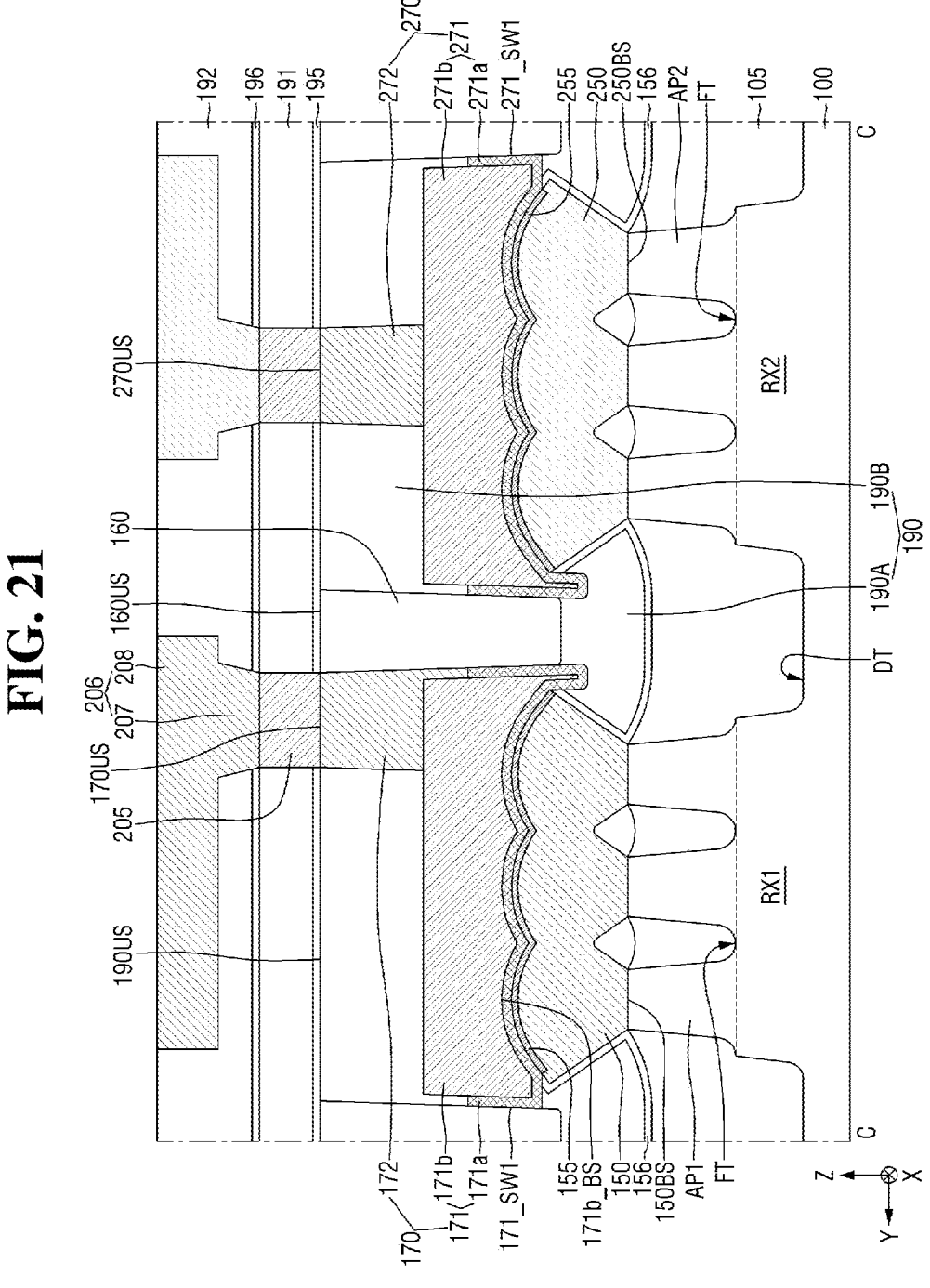

Referring to FIG. 21, in a semiconductor device according to an example embodiment, at least one of the first lower source/drain contact 171 or the second lower source/drain contact 271 may include a lower protruding portion that protrudes toward the substrate 100 more than the bottom surface of the contact isolation structure 160.

The lower protruding portion included in the first lower source/drain contact 171 and/or the second lower source/ drain contact 271 is disposed in the first portion 190A of the first interlayer insulating layer.

Although the lower protruding portion included in the first lower source/drain contact 171 and/or the second lower source/drain contact 271 is shown not to extend up to the upper surface of the field insulating layer 105, the present disclosure is not limited thereto.

Figure 22:
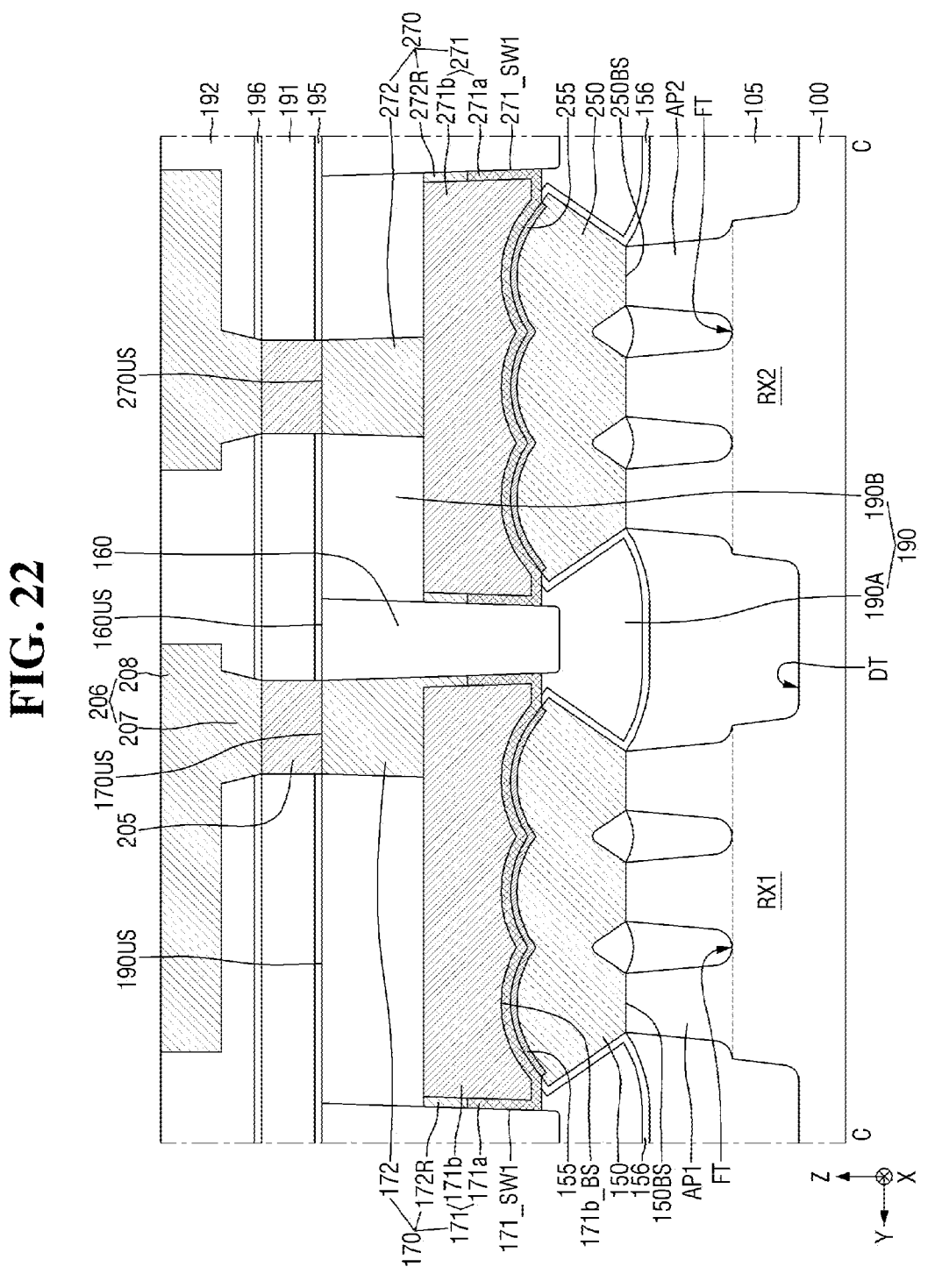

Referring to FIG. 22, in a semiconductor device according to an example embodiment, the first source/drain contact 170 may further include a first upper contact residue 172R interposed between the contact isolation structure 160 and the first lower source/drain filling layer 171*b*.

The second source/drain contact 270 may further include a second upper contact residue 272R interposed between the contact isolation structure 160 and the second lower source/drain filling layer 271*b*.

The first upper contact residue 172R and the second upper contact residue 272R include the same material as the first upper source/drain contact 172 and the second upper source/drain contact 272.

Figure 23:
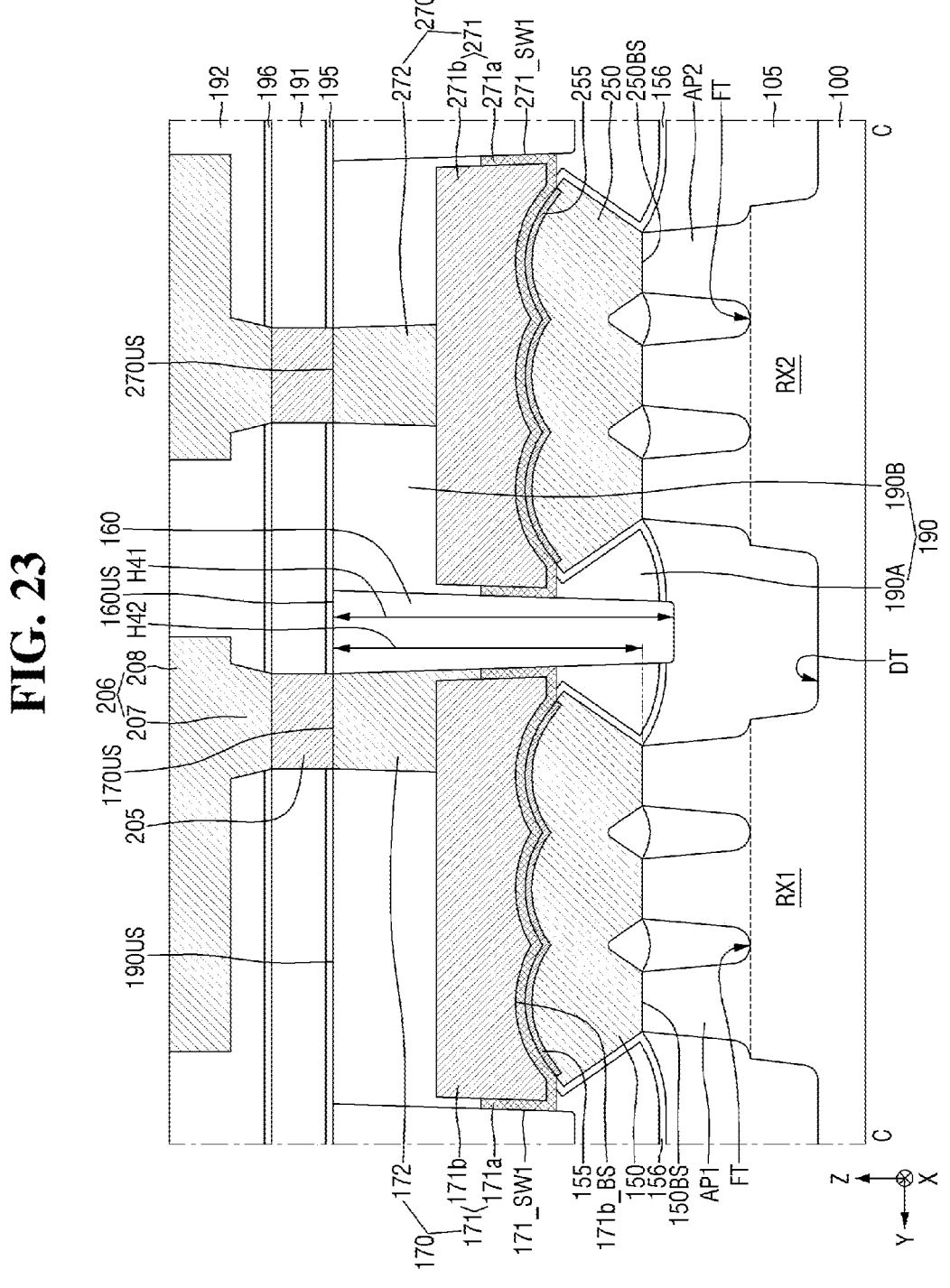

Referring to FIG. 23, in a semiconductor device according to an example embodiment, the contact isolation structure 160 may extend up to the field insulating layer 105.

The contact isolation structure 160 may be in contact with the field insulating layer 105. The height H41 of the contact isolation structure 160 may be greater than the height H42 from the bottom surface 150BS of the first source/drain pattern to the upper surface 160US of the contact isolation structure.

Figure 24:
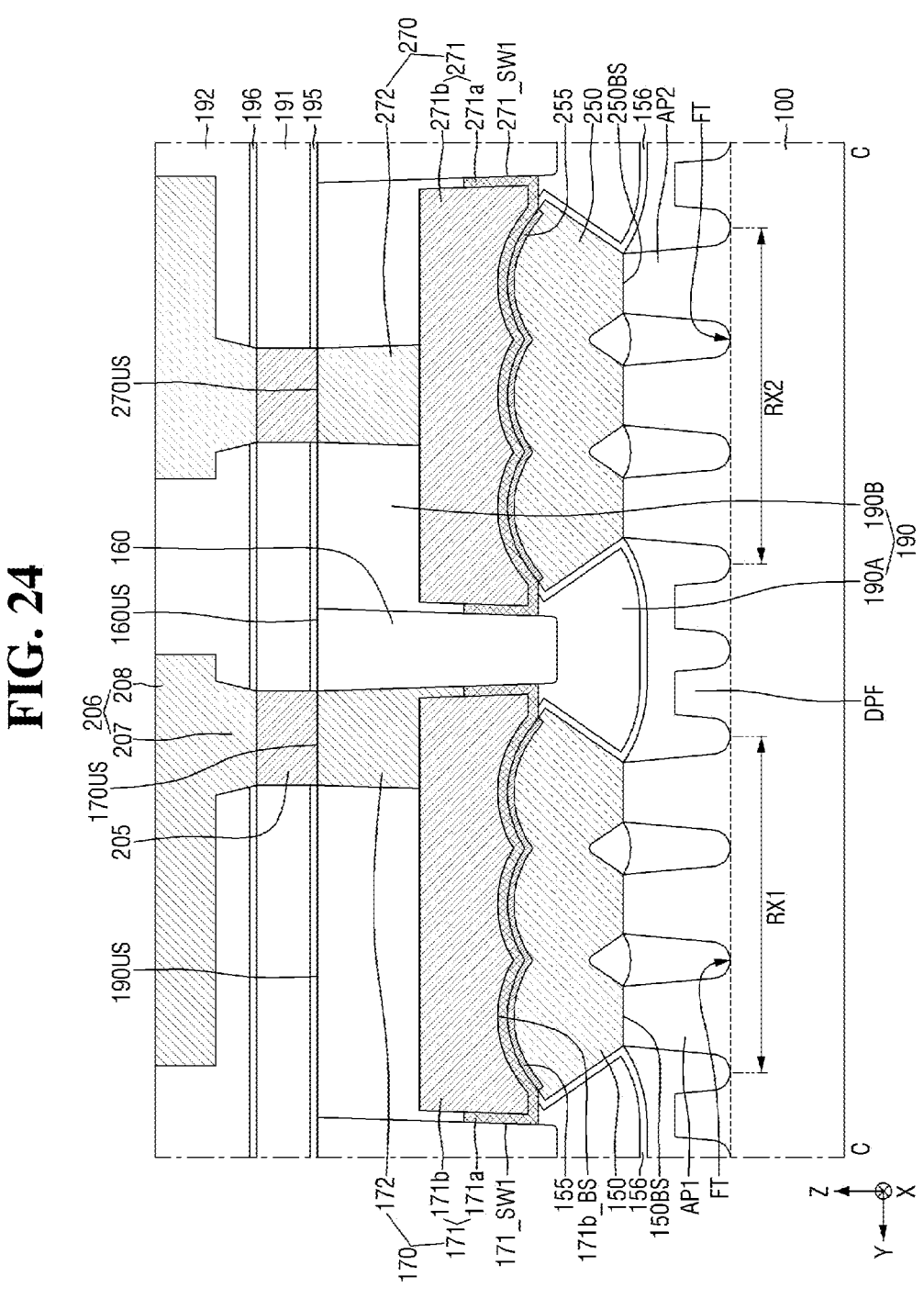
FIGS. 24 and 25 are diagrams each illustrating a semiconductor device according to some example embodiments.
Figure 25:
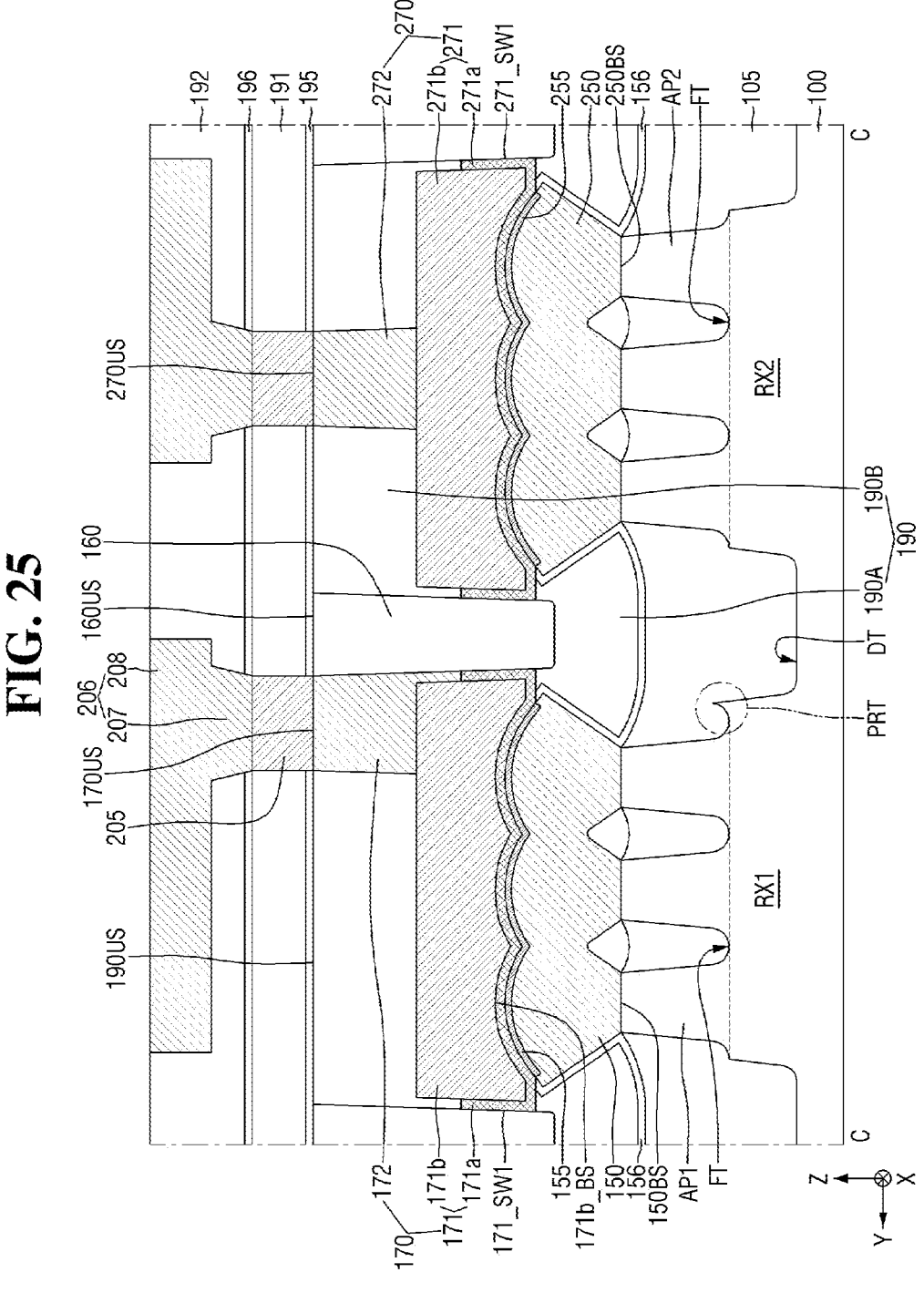

FIGS. 24 and 25 are diagrams each illustrating a semiconductor device according to some example embodiments. For simplicity of description, the following description will focus on differences from the description with reference to FIGS. 1 to 8.

Referring to FIG. 24, a semiconductor device according to an example embodiment may further include dummy protruding patterns DPF disposed in the field region FX.

The deep trench DT in FIG. 2 is not formed in the field region FX. The first active region RX1 and the second active region RX2 may be defined between the dummy protruding patterns DPF.

The dummy protruding pattern DPF may be elongated in the first direction X. The upper surface of the dummy protruding pattern DPF is covered by the field insulating layer 105. The dummy protruding pattern DPF may include a semiconductor material.

Referring to FIG. 25, a semiconductor device according to an example embodiment may further include a protrusion structure PRT disposed along the boundary of the first active region RX1.

The protrusion structure PRT may be disposed at the boundary of the first active region RX1 extending in the first direction X. The first sidewall of the protrusion structure PRT may be defined by the fin trench FT, and the second sidewall of the protrusion structure PRT may be defined by the deep trench DT. The protrusion structure PRT may be elongated in the first direction X.

The protrusion structure PRT is covered with the field insulating layer 105. The protrusion structure PRT may include the same semiconductor material as the first active pattern AP1.

Although the protrusion structure PRT is shown to be disposed along one of the two boundaries of the first active region RX1 extending in the first direction X, the present disclosure is not limited thereto. Unlike the illustrated example, it is apparent that the protrusion structures PRT may be disposed along the two boundaries of the first active region RX1 extending along the first direction X.

Although not shown, the protrusion structure PRT may be disposed at the edge of the second active region RX2.

Figure 26:
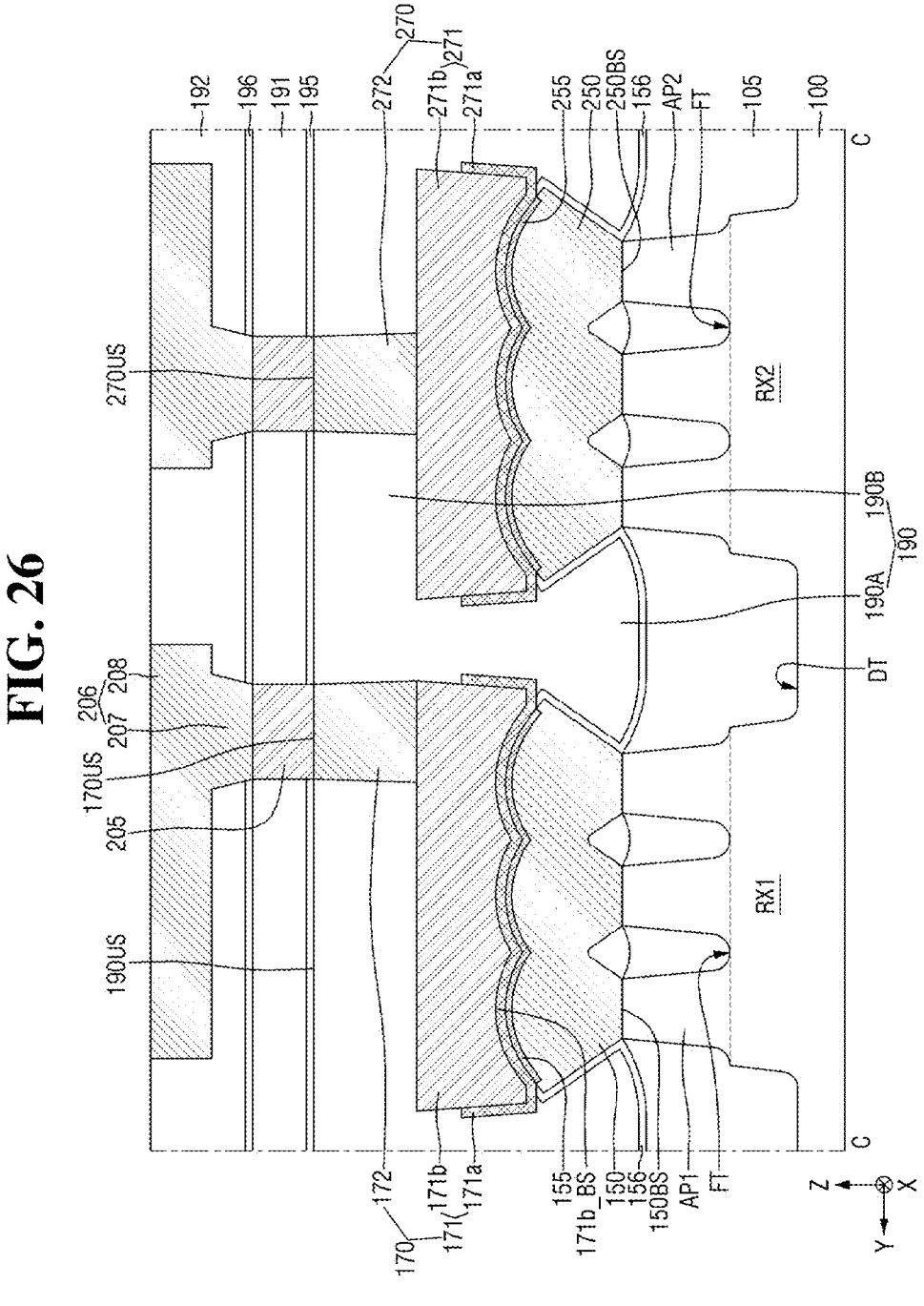
FIG. 26 is a diagram illustrating a semiconductor device according to an example embodiment.

FIG. 26 is a diagram illustrating a semiconductor device according to an example embodiment. For simplicity of description, the following description will focus on differences from the description with reference to FIGS. 1 to 8.

Referring to FIG. 26, in a semiconductor device according to an example embodiment, the contact isolation structure 160 (see FIG. 4) is not disposed between the first source/drain contact 170 and the second source/drain contact 270.

The width in the second direction Y of the first source/drain filling layer 171*b* may increase as the first source/drain filling layer 171*b* becomes farther from the first source/drain pattern 150 in the third direction Z. The width in the second direction Y of the second source/drain filling layer 271*b* may increase as the second source/drain filling layer 271*b* becomes farther from the second source/drain pattern 250 in the third direction Z.

Unlike the illustrated example, the first source/drain contact 170 may be directly connected to the second source/drain contact 270. That is, in the semiconductor device according to some example embodiments, at least one source/drain contact may be disposed over the first active region RX1 and the second active region RX2.

Figure 27:
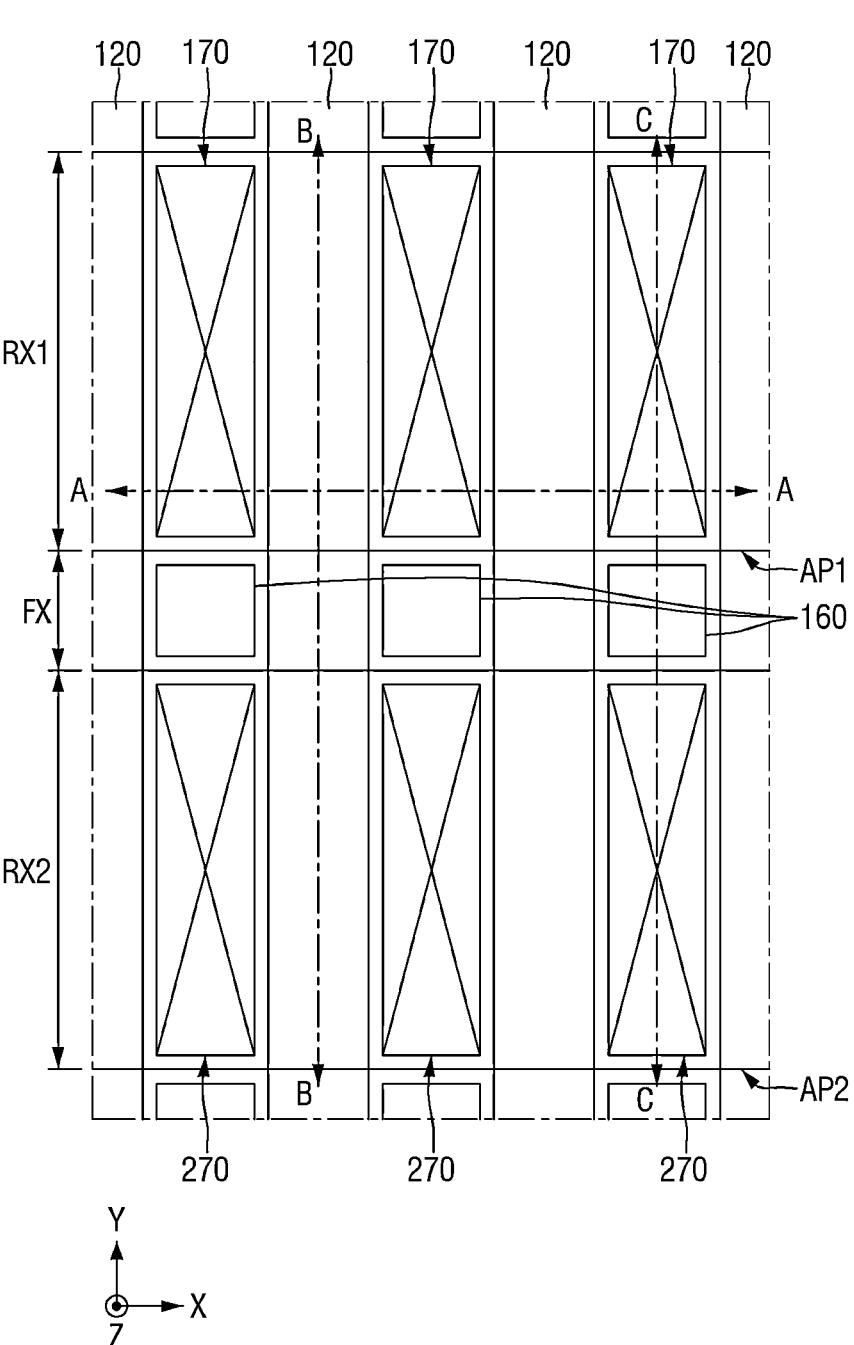
FIGS. 27 to 31 are diagrams illustrating a semiconductor device according to some example embodiments.
Figure 28:
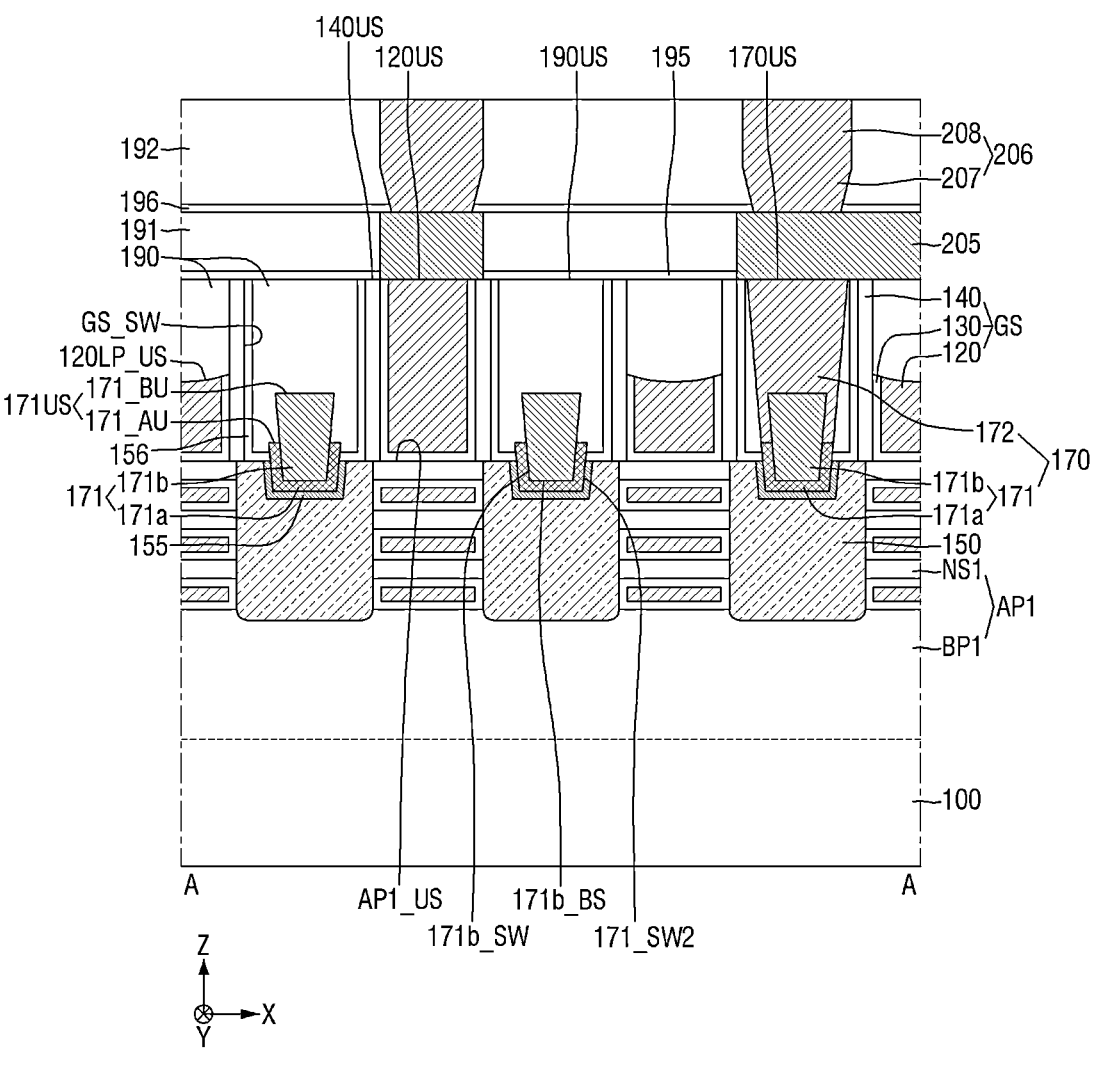
Figure 29:
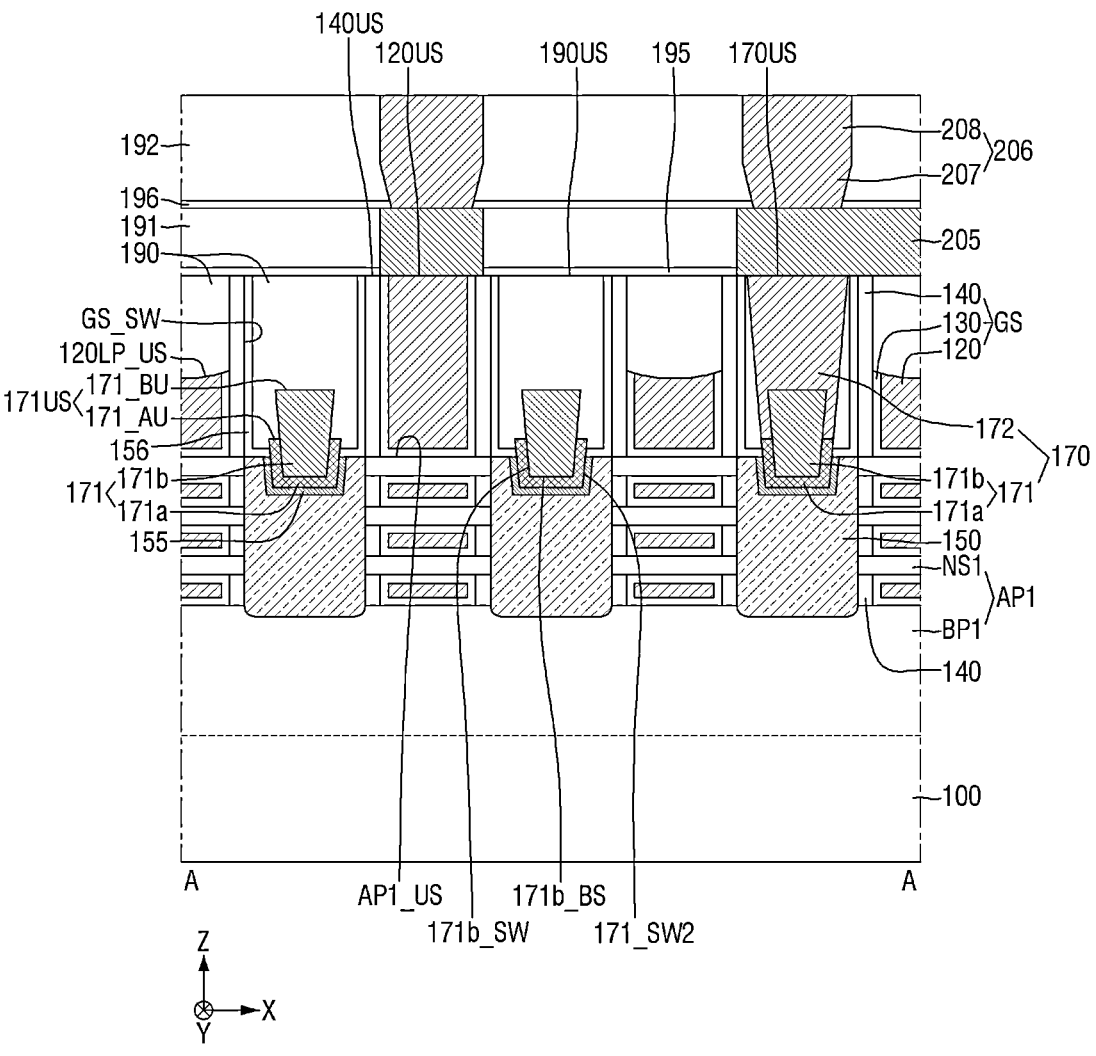
Figure 30:
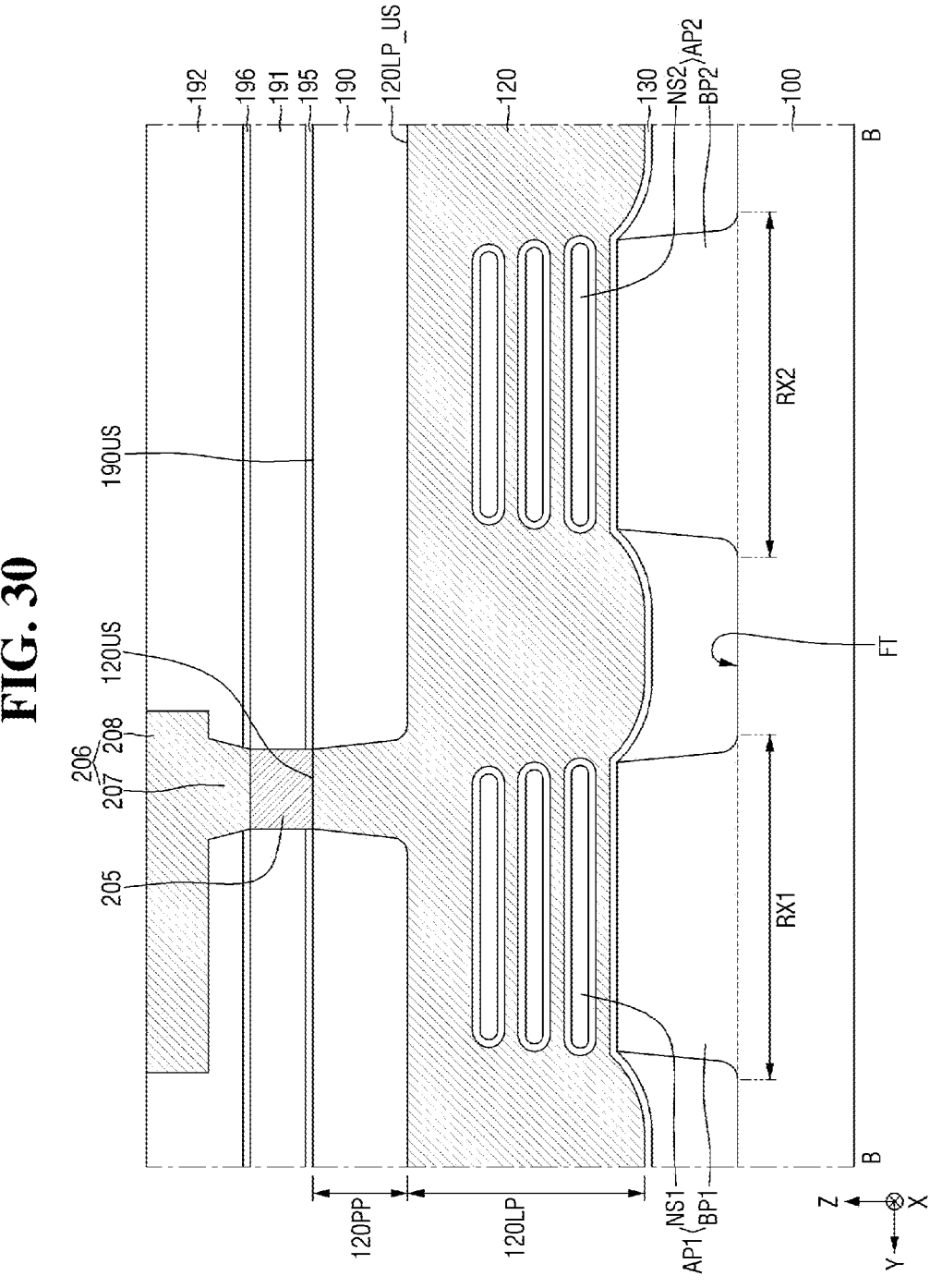
Figure 31:
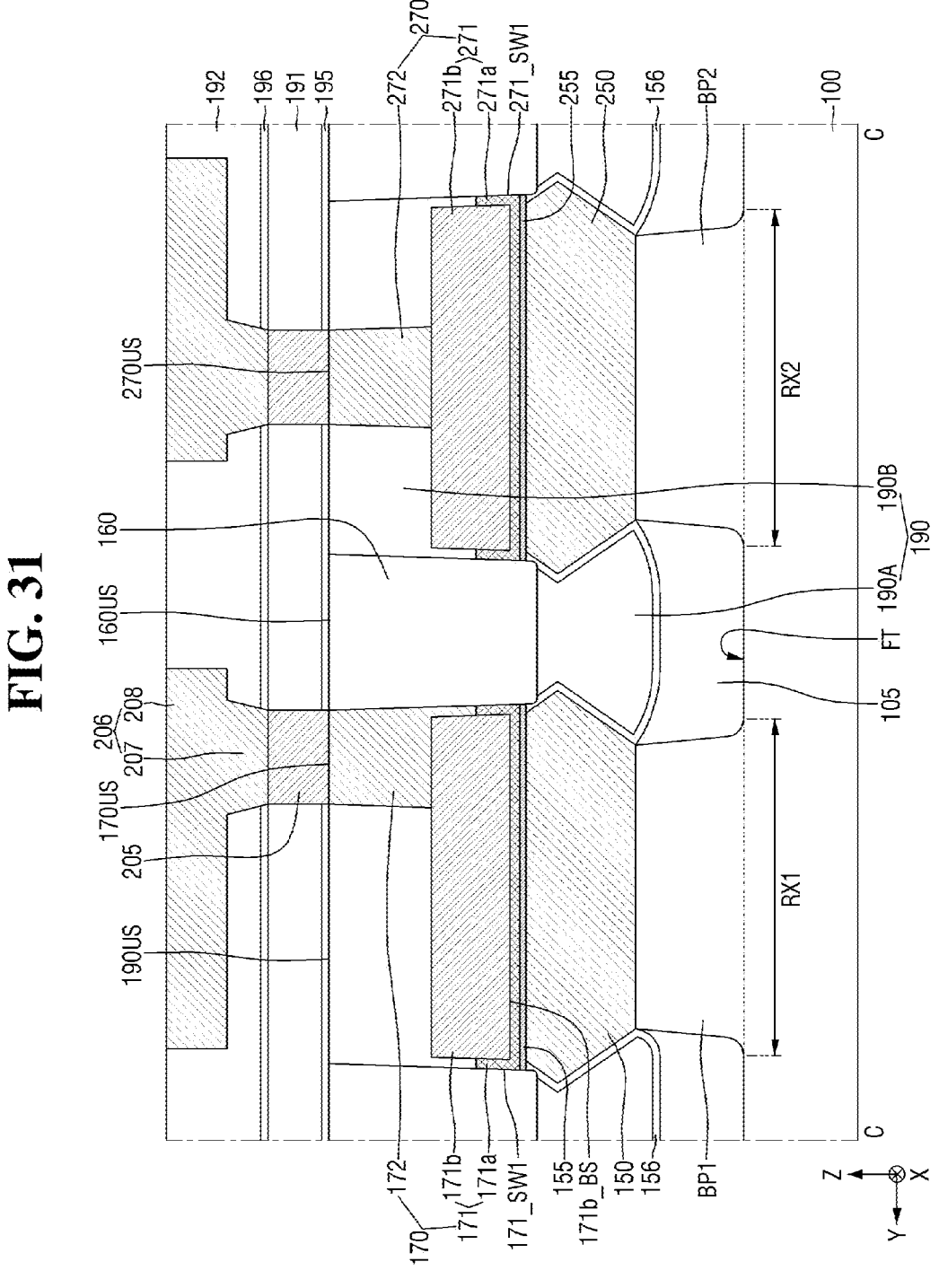

FIGS. 27 to 31 are diagrams illustrating a semiconductor device according to some example embodiments. FIG. 27 is an example layout diagram illustrating a semiconductor device according to an example embodiment. FIGS. 28 and 29 are cross-sectional views taken along line A-A of FIG. 27. FIG. 30 is a cross-sectional view taken along line B-B of FIG. 27. FIG. 31 is a cross-sectional view taken along line C-C of FIG. 27. For simplicity of description, the following description will focus on differences from the description with reference to FIGS. 1 to 8.

Referring to FIGS. 27 to 31, in a semiconductor device according to some example embodiments, the first active pattern AP1 may include a first lower pattern BP1 and a first sheet pattern NS1. The second active pattern AP2 may include a second lower pattern BP2 and a second sheet pattern NS2.

Each of the first lower pattern BP1 and the second lower pattern BP2 may extend in the first direction X. The first sheet pattern NS1 may be disposed on the first lower pattern BP1 while being spaced apart from the first lower pattern BP1. The second sheet pattern NS2 may be disposed on the second lower pattern BP2 while being spaced apart from the second lower pattern BP2.

Although three first sheet patterns NS1 and three second sheet patterns NS2 are shown to be arranged in the third direction Z, this is merely for simplicity of description and the present disclosure is not limited thereto. For example, the upper surface AP1_US of the first active pattern may be the upper surface of the uppermost first sheet pattern NS1 among the first sheet patterns NS1.

Each of the first lower pattern BP1 and the second lower pattern BP2 may be formed by etching a portion of the substrate 100, or may include an epitaxial layer grown from the substrate 100. Each of the first lower pattern BP1 and the second lower pattern BP2 may include silicon or germanium, which is an elemental semiconductor material. In addition, each of the first lower pattern BP1 and the second lower pattern BP2 may include a compound semiconductor, for example, a group IV-IV compound semiconductor or a group III-V compound semiconductor.

Each of the first sheet pattern NS1 and the second sheet pattern NS2 may include any one of silicon or germanium as an elemental semiconductor material, a group IV-IV compound semiconductor, or a group III-V compound semiconductor. The first sheet pattern NS1 may include the same material as the first lower pattern BP1, or may include a material different from that of the first lower pattern BP1. Likewise, the second sheet pattern NS2 may include the same material as the second lower pattern BP2, or may include a material different from that of the second lower pattern BP2.

The first sheet pattern NS1 may be connected to the first source/drain pattern 150. The second sheet pattern NS2 may be connected to the second source/drain pattern 250. The first sheet pattern NS1 and the second sheet pattern NS2 may be channel patterns used as channel regions of a transistor. For example, the first sheet pattern NS1 and the second sheet pattern NS2 may be nanosheets or nanowires.

The first gate insulating layer 130 may extend along the upper surface of the first lower pattern BP1, the upper surface of the second lower pattern BP2, and the upper surface of the field insulating layer 105. The first gate insulating layer 130 may wrap the circumference of the first sheet pattern NS1 and the circumference of the second sheet pattern NS2.

The first gate electrode 120 may be disposed on the first lower pattern BP1 and the second lower pattern BP2. The first gate electrode 120 may intersect the first lower pattern BP1 and the second lower pattern BP2. The first gate electrode 120 may wrap the circumference of the first sheet pattern NS1 and the circumference of the second sheet pattern NS2.

For example, the line portion 120LP of the first gate electrode may wrap the circumference of the first sheet pattern NS1 and the circumference of the second sheet pattern NS2. The line portion 120LP of the first gate electrode may be disposed between the first lower pattern BP1 and the first sheet pattern NS1 and between the adjacent first sheet patterns NS1. The line portion 120LP of the first gate electrode may be disposed between the second lower pattern BP2 and the second sheet pattern NS2 and between the adjacent second sheet patterns NS2.

In FIG. 28, the first gate spacer 140 may include only an outer spacer. The first gate spacer 140 is not disposed between the first lower pattern BP1 and the first sheet pattern NS1 and between the adjacent first sheet patterns NS1.

In FIG. 29, the first gate spacer 140 may include an outer spacer and an inner spacer. The first gate spacer 140 may be disposed between the first lower pattern BP1 and the first sheet pattern NS1 and between the adjacent first sheet patterns NS1.

Figure 32:
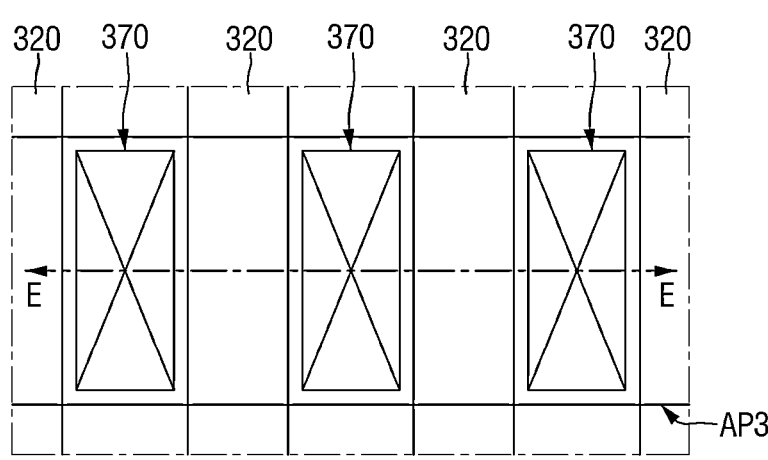
FIG. 32 is a layout diagram illustrating a semiconductor device according to an example embodiment.
Figure 32:
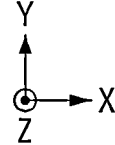
Figure 33:
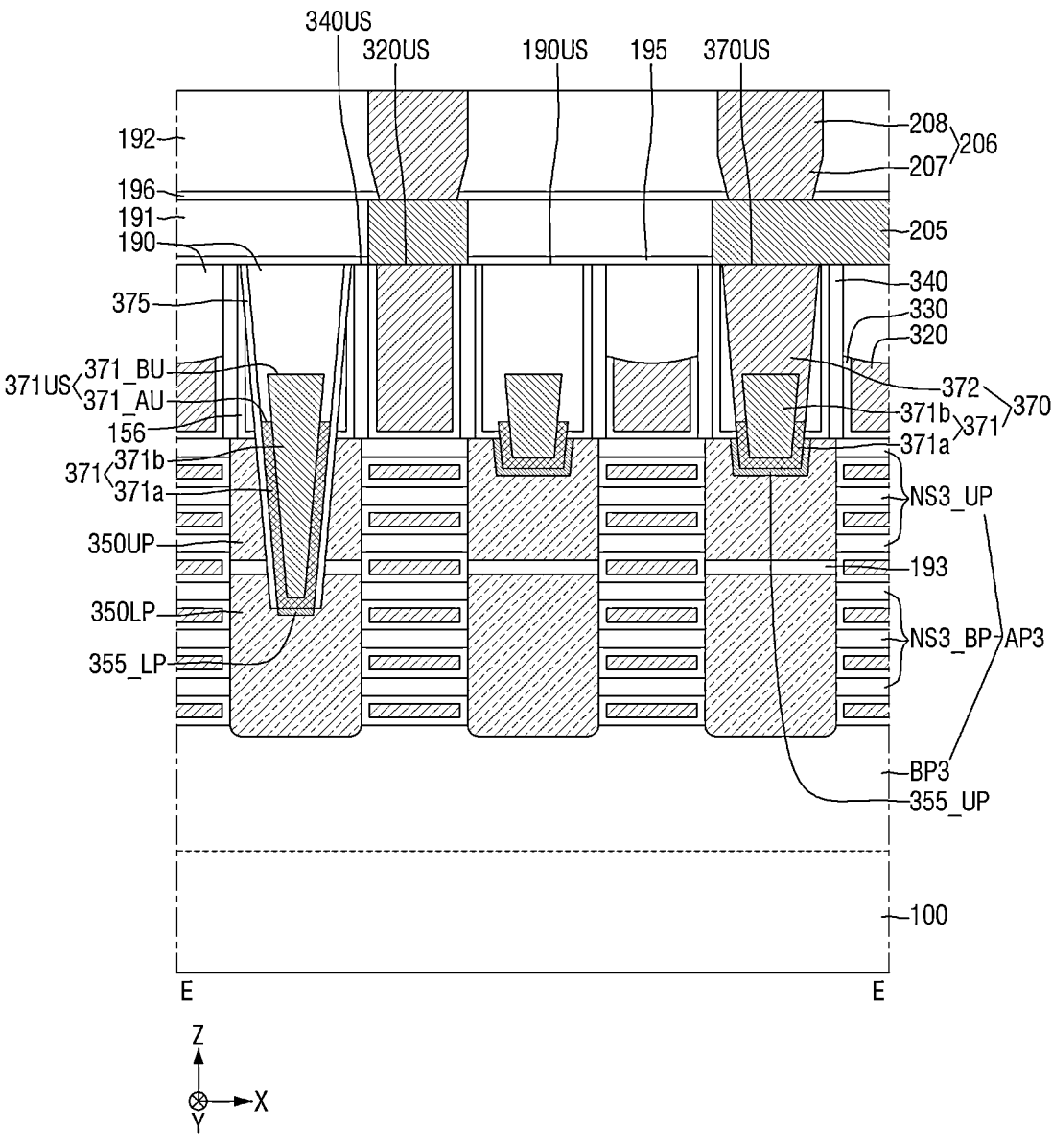
FIG. 33 is an example cross-sectional view taken along line E-E of FIG. 32.

FIG. 32 is a layout diagram illustrating a semiconductor device according to an example embodiment. FIG. 33 is an example cross-sectional view taken along line E-E of FIG. 32. For simplicity of description, the following description will focus on differences from the description with reference to FIGS. 1 to 8 and 27 to 31.

Referring to FIGS. 32 and 33, a semiconductor device according to an example embodiment may include a third active pattern AP3, at least one second gate electrode 320, a third source/drain contact 370, the first wiring line 205, and the second wiring structure 206.

The third active pattern AP3 may include a third lower pattern BP3, a third lower sheet pattern NS3_BP, and a third upper sheet pattern NS3_UP.

The third lower pattern BP3 may extend in the first direction X. The third lower sheet pattern NS3_BP may be disposed on the third lower pattern BP3. The third lower sheet pattern NS3_BP may be disposed to be spaced apart from the third lower pattern BP3 in the third direction Z. The third upper sheet pattern NS3_UP may be disposed on the third lower sheet pattern NS3_BP. The third upper sheet pattern NS3_UP may be disposed to be spaced apart from the third lower sheet pattern NS3_BP in the third direction Z.

Although three third lower sheet patterns NS3_BP and three third upper sheet patterns NS3_UP are shown to be arranged in the third direction Z, this is only for simplicity of description, and the present disclosure is not limited thereto. The upper surface of the third active pattern AP3 may be the upper surface of the uppermost third upper sheet pattern NS3_UP among the third upper sheet patterns NS3_UP.

Each of the third lower pattern BP3, the third lower sheet pattern NS3_BP, and the third upper sheet pattern NS3_UP may include any one of silicon or germanium as an elemental semiconductor material, a group IV-IV compound semiconductor, and a group III-V compound semiconductor. The third lower sheet pattern NS3_BP and the third upper sheet pattern NS3_UP may include the same material or may include different materials.

For example, one of the third lower sheet pattern NS3_BP and the third upper sheet pattern NS3_UP may be a PMOS channel region, and the other may be an NMOS channel region. As another example, the third lower sheet pattern NS3_BP and the third upper sheet pattern NS3_UP may be PMOS channel regions. As still another example, the third lower sheet pattern NS3_BP and the third upper sheet pattern NS3_UP may be NMOS channel regions.

As shown in FIG. 30, a second gate insulating layer 330 may wrap the circumference of the third lower sheet pattern NS3_BP and the circumference of the third upper sheet pattern NS3_UP.

The second gate electrode 320 may be disposed on the third active pattern AP3. The second gate electrode 320 may extend in the second direction Y and cross the third active pattern AP3. The second gate electrode 320 is disposed on the second gate insulating layer 330. As shown in FIG. 30, the second gate electrode 320 may wrap the circumference of the third lower sheet pattern NS3_BP and the circumference of the third upper lower sheet pattern NS3_UP.

Although not shown, the second gate electrode 320 may include a line portion and a protruding portion. The line portion of the second gate electrode 320 may be elongated in the second direction Y. The protruding portion of the second gate electrode 320 may protrude from the line portion of the second gate electrode 320 in the third direction Z.

A second gate spacer 340 may be disposed on the sidewall of the second gate electrode 320. The second gate spacer 340 may extend in the second direction Y. For example, an upper surface 340US of the second gate spacer may be coplanar with an upper surface 320US of the second gate electrode.

A third lower source/drain pattern 350_LP may be disposed on the third lower pattern BP3. The third lower source/drain pattern 350_LP may be connected to the third lower sheet pattern NS3_BP.

A third upper source/drain pattern 350_UP may be disposed on the third lower source/drain pattern 350_LP. The third upper source/drain pattern 350_UP may be connected to the third upper sheet pattern NS3_UP.

The third upper source/drain pattern 350_UP is spaced apart from the third lower source/drain pattern 350_LP in the third direction Z.

For example, the third upper source/drain pattern 350_UP and the third lower source/drain pattern 350_LP may be in contact with the second gate insulating layer 330. Unlike the illustrated example, at least one of the third upper source/drain pattern 350_UP or the third lower source/drain pattern 350_LP may not be in contact with the second gate insulating layer 330.

An insertion interlayer insulating layer 193 may be disposed between the third upper source/drain pattern 350_UP and the third lower source/drain pattern 350_LP.

The insertion interlayer insulating layer 193 may include an insulating material. The insertion interlayer insulating layer 193 may include, for example, at least one of silicon oxide, silicon nitride, silicon oxynitride, silicon oxynitride, silicon oxycarbide, silicon oxycarbonitride, silicon carbonitride, or a low-k material, but is not limited thereto.

The third source/drain contact 370 may be connected to one of the third upper source/drain pattern 350_UP or the third lower source/drain pattern 350_LP. A portion of the third source/drain contacts 370 may be connected to the third lower source/drain pattern 350_LP, and the rest of the third source/drain contacts 370 may be connected to the third upper source/drain pattern 350_UP.

Unlike the illustrated example, the third upper source/drain pattern 350_UP and the third lower source/drain pattern 350_LP may be connected to the single third source/drain contact 370 that is elongated in the third direction Z.

The third source/drain contact 370 includes a third lower source/drain contact 371 and a third upper source/drain contact 372. The third upper source/drain contact 372 is disposed on the third lower source/drain contact 371. The third upper source/drain contact 372 includes an upper surface 370US of the third source/drain contact. The upper surface 370US of the third source/drain contact may be coplanar with the upper surface 320US of the second gate electrode. The upper surface 370US of the third source/drain contact may be coplanar with the upper surface 190US of the first interlayer insulating layer.

The third lower source/drain contact 371 may include a third lower source/drain filling layer 371b and a third lower source/drain barrier layer 371a. The third lower source/drain filling layer 371b is disposed on the third lower source/drain barrier layer 371a.

An upper surface 371US of the third lower source/drain contact is lower than the upper surface 320US of the second gate electrode. The first interlayer insulating layer 190 covers the upper surface 371US of the third lower source/drain contact. The upper surface 371US of the third lower source/drain contact includes an upper surface 371_AU of the third lower source/drain barrier layer and an upper surface 371_BU of the third lower source/drain filling layer. On the basis of (or with respect to) the upper surface of the third active pattern AP3, the upper surface 371_BU of the third lower source/drain filling layer may be higher than the upper surface 371_AU of the third lower source/drain barrier layer, but is not limited thereto.

The third upper source/drain contact 372 is disposed on the upper surface 371US of the third lower source/drain contact. In a semiconductor device according to some example embodiments, the third upper source/drain contact 372 may have a single material layer structure.

The third source/drain contact 370 connected to the third lower source/drain pattern 350_LP may penetrate the third upper source/drain pattern 350_UP and the insertion interlayer insulating layer 193. The third lower source/drain contact 371 may penetrate the third upper source/drain pattern 350_UP and the insertion interlayer insulating layer 193. The third upper source/drain contact 372 does not penetrate the third upper source/drain pattern 350_UP and the insertion interlayer insulating layer 193.

A third contact insulating liner 375 may be disposed on the sidewalls of the third upper source/drain pattern 350_UP and the third source/drain contact 370 penetrating the insertion interlayer insulating layer 193. Unlike the illustrated example, when the third source/drain contact 370 is connected to the third upper source/drain pattern 350_UP and the third lower source/drain pattern 350_LP, the third contact insulating liner 375 may not be disposed on the sidewall of the third source/drain contact 370.

A third upper contact silicide layer 355_UP is disposed between the third source/drain contact 370 and the third upper source/drain pattern 350_UP. A third lower contact silicide layer 355_LP is disposed between the third source/drain contact 370 and the third lower source/drain pattern 350_LP.

The first wiring line 205 and the second wiring structure 206 may be sequentially disposed on the third source/drain contact 370.

FIGS. 34 to 43 are views illustrating the intermediate steps of a method for fabricating a semiconductor device according to an example embodiment.

Figure 34:
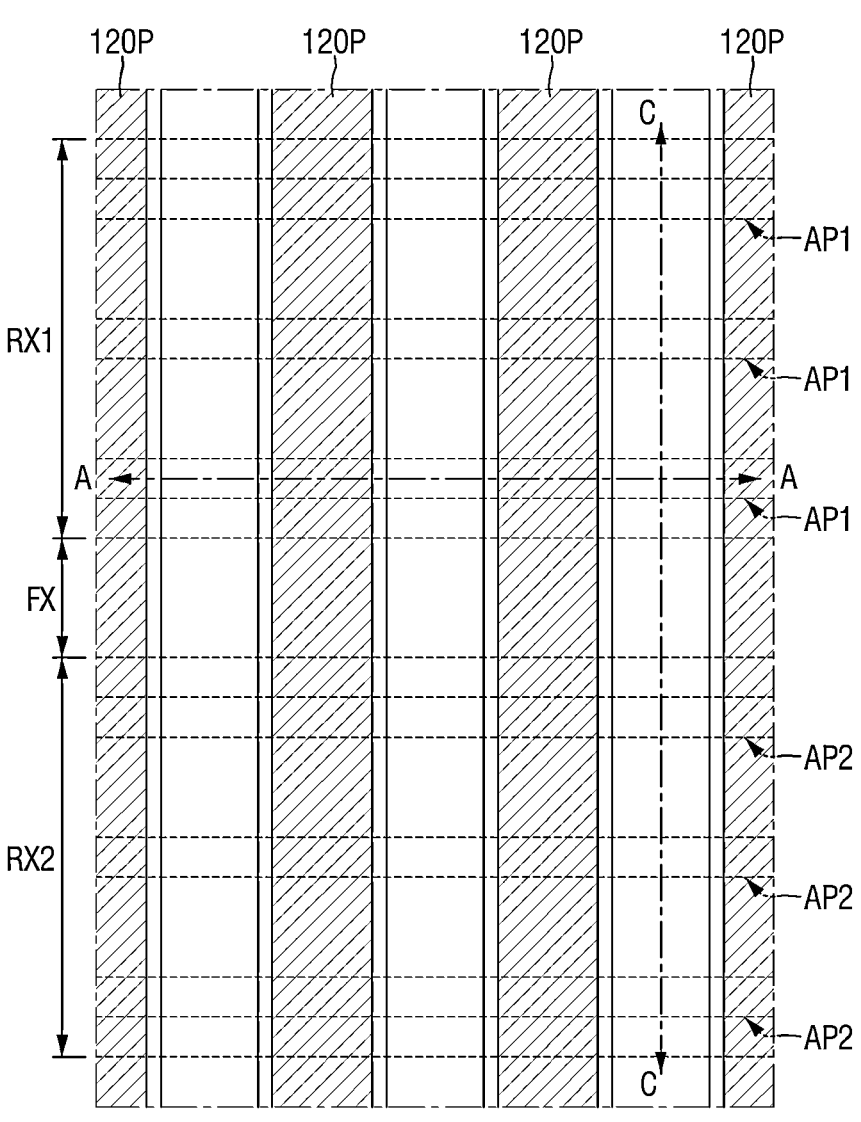
FIGS. 34 to 43 are views illustrating the intermediate steps of a method for fabricating a semiconductor device according to an example embodiment.
Figure 34:
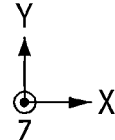

For reference, FIGS. 35 and 38 to 43 may be cross-sectional views taken along line A-A of FIG. 34. FIGS. 36 and 37 are cross-sectional views taken along line C-C of FIG. 34.

Figure 35:
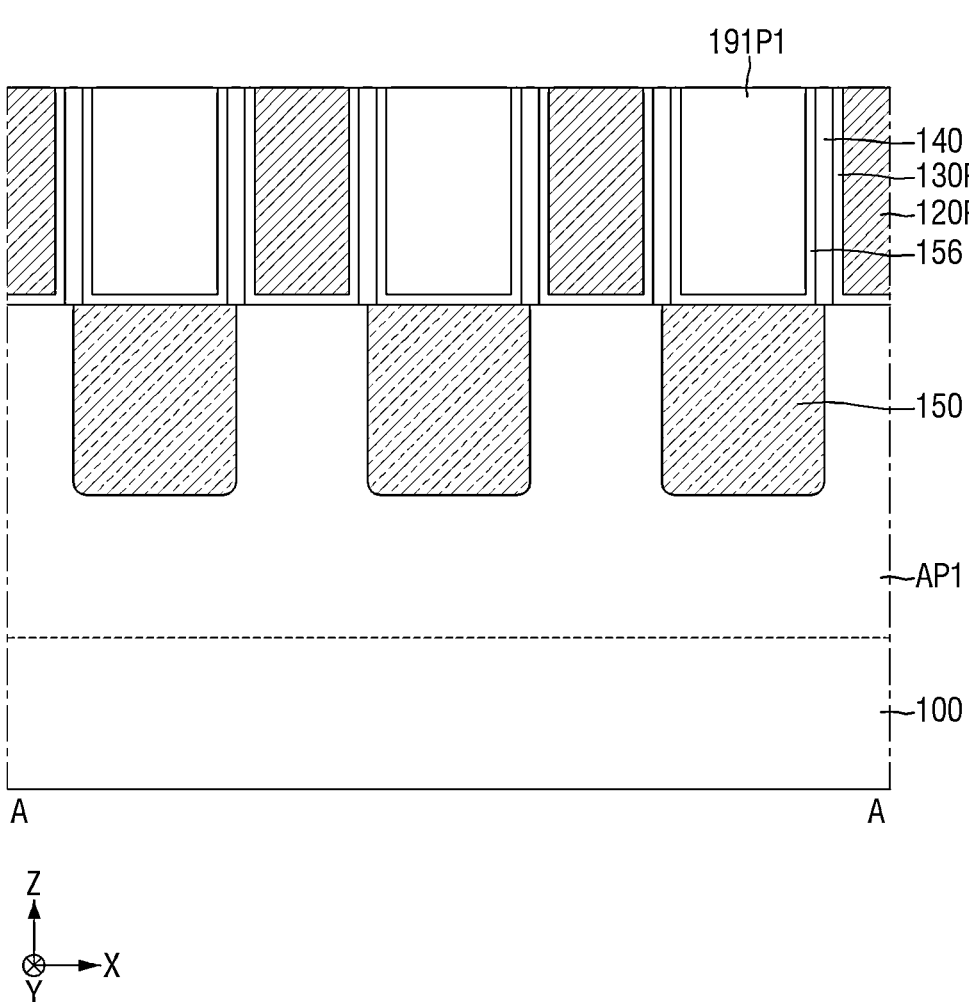
Figure 36:
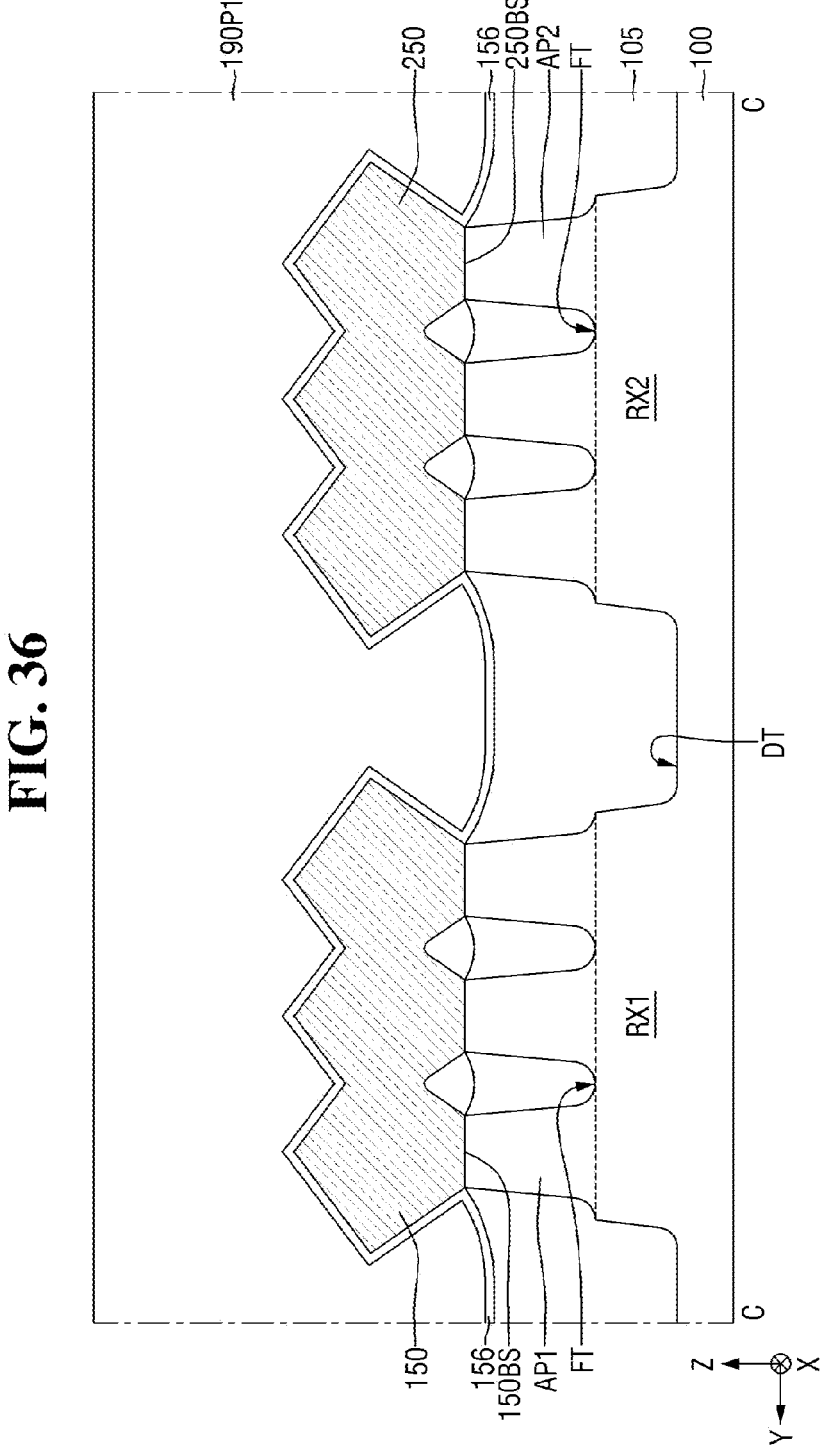
Figure 37:
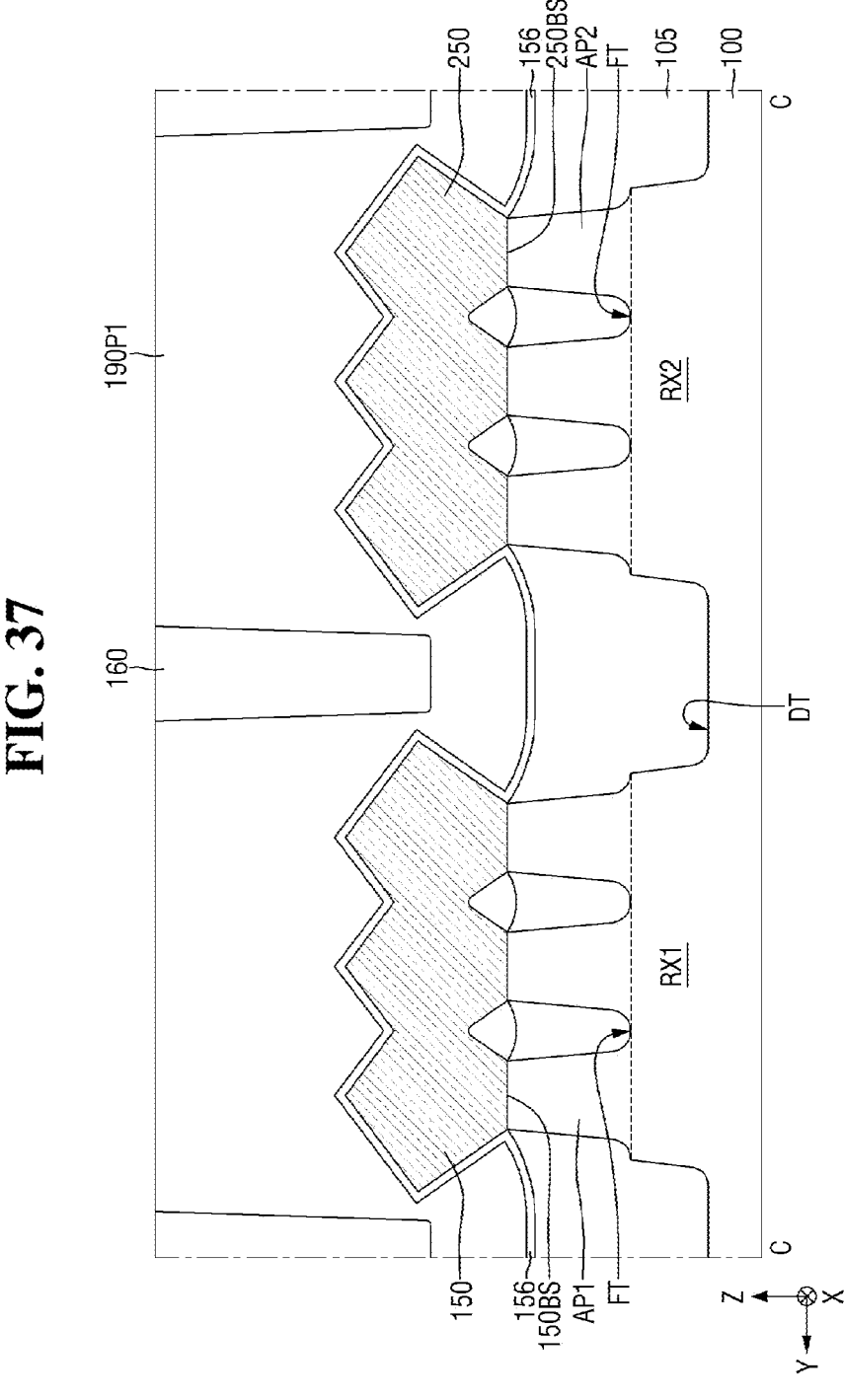

Referring to FIGS. 34 to 36, a pre-gate electrode 120P and the first source/drain pattern 150 may be formed on the first active pattern AP1.

The pre-gate electrode 120P and the second source/drain pattern 250 may be formed on the second active pattern AP2.

The first source/drain pattern 150 and the second source/drain pattern 250 may be formed between the pre-gate electrodes 120P adjacent to each other in the first direction X.

The first gate spacer 140 is disposed on the sidewall of the pre-gate electrode 120P. The pre-gate electrode 120P is formed on a pre-gate insulating layer 130p.

The source/drain etch stop layer 156 may be formed along the profile of the first source/drain pattern 150 and the profile of the second source/drain pattern 250.

A first pre-interlayer insulating layer 190P1 is formed on the source/drain etch stop layer 156. The first pre-interlayer insulating layer 190P1 may be coplanar with the upper surface of the pre-gate electrode 120P.

Referring to FIG. 37, the contact isolation structure 160 may be formed in the first pre-interlayer insulating layer 190P1.

The contact isolation structure 160 is disposed between the first source/drain pattern 150 and the second source/drain pattern 250 adjacent to each other in the second direction Y.

Hereinafter, description will be provided with reference to cross-sectional views taken along line A to A of FIG. 34.

Figure 38:
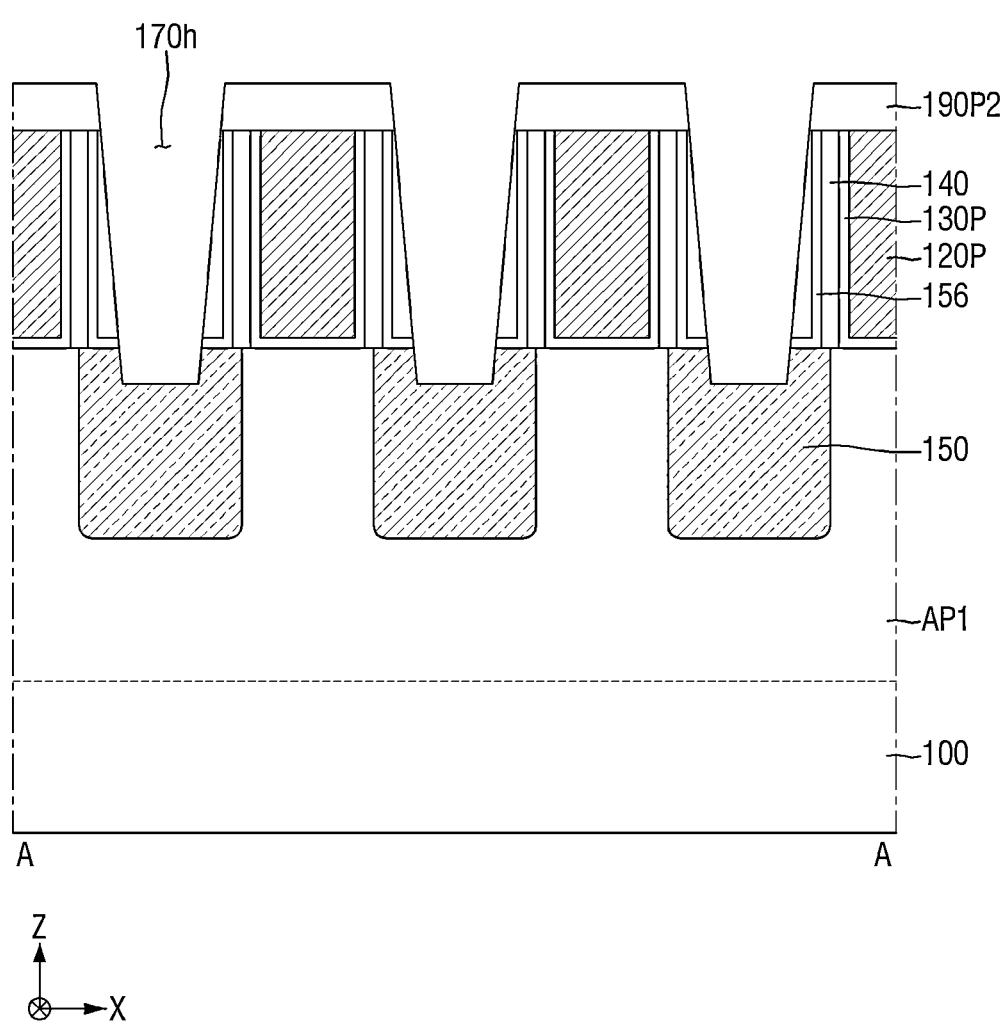

Referring to FIG. 38, a first additional insulating layer covering the upper surface of the pre-gate electrode 120P may be formed to form a second pre-interlayer insulating layer 190P2 on the first source/drain pattern 150.

A contact hole 170h exposing the first source/drain pattern 150 may be formed in the second pre-layer insulating layer 190P2.

Figure 39:
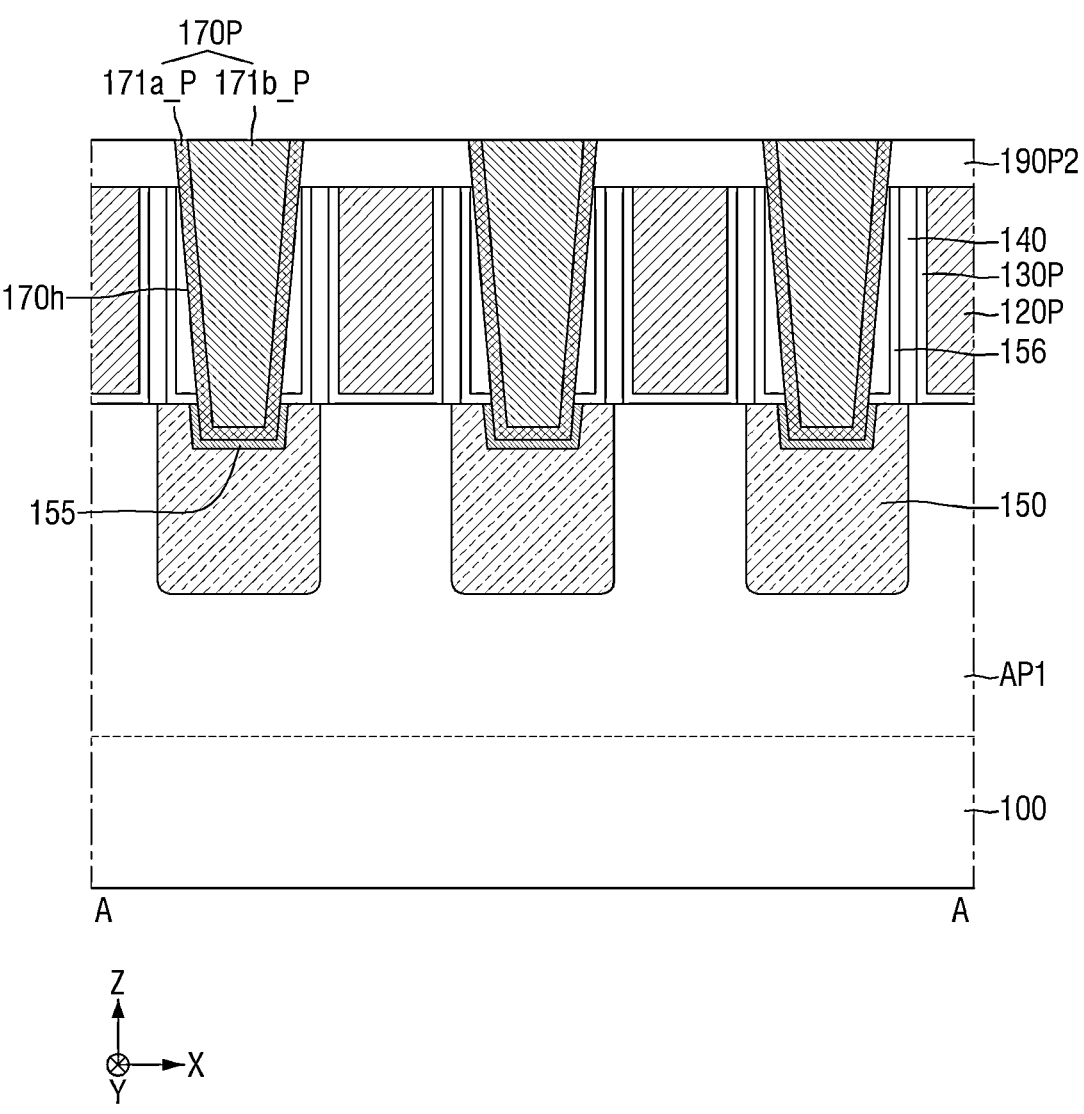

Referring to FIG. 39, a pre-source/drain contact 170P is formed on the first source/drain pattern 150.

The pre-source/drain contact 170P is formed in the contact hole 170h. The pre-source/drain contact 170P may include a pre-source/drain barrier layer 171a_P and a pre-source/drain filling layer 171b_P. The pre-source/drain filling layer 171b_P is formed on the pre-source/drain barrier layer 171a_P.

The first contact silicide layer 155 is formed between the first source/drain pattern 150 and the pre-source/drain contact 170P.

Although not illustrated, before the pre-source/drain contact 170P is formed in the contact hole 170h, the first contact insulating liner 175 of FIG. 14 may be further formed.

Figure 40:
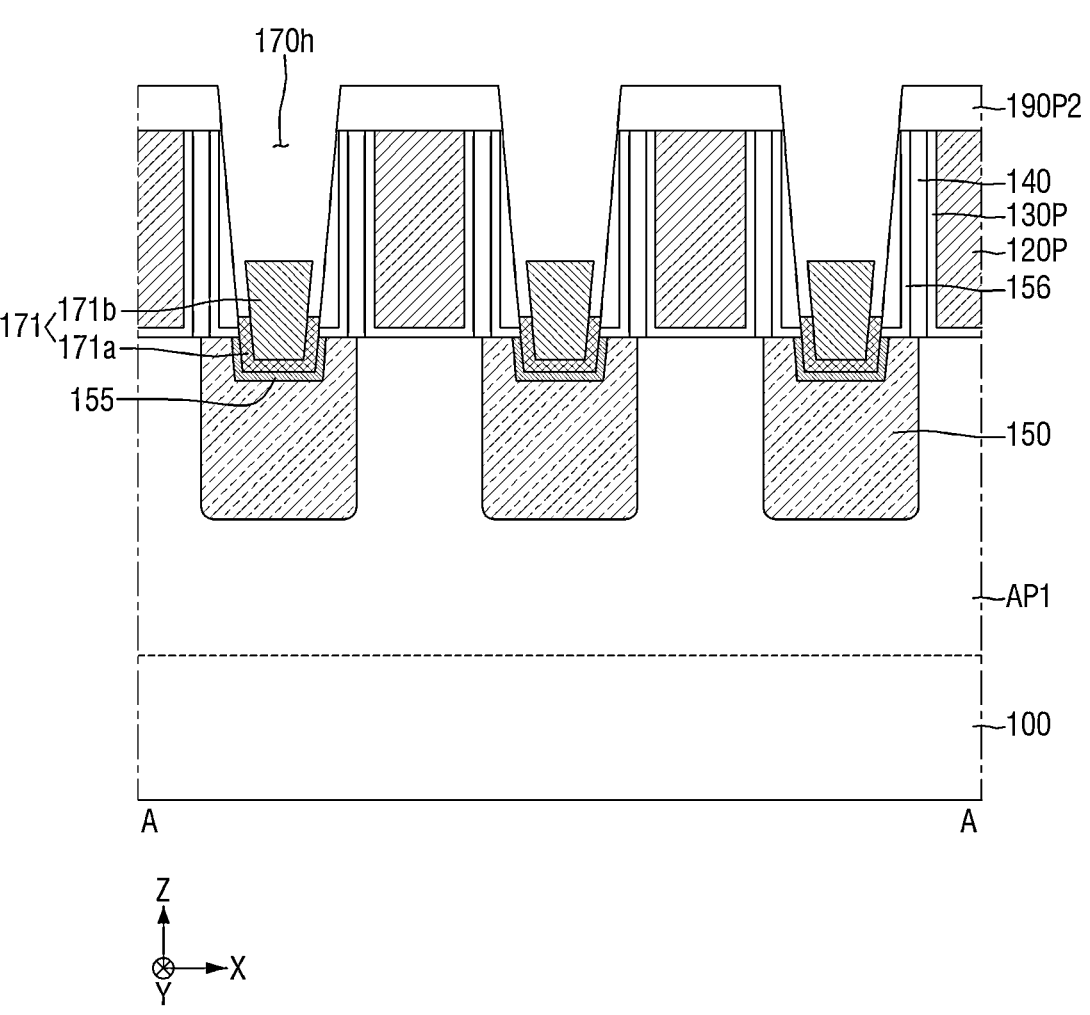

Referring to FIGS. 39 and 40, a part of the pre-source/drain contact 170P is removed to form the first lower source/drain contact 171 in the contact hole 170h.

The first lower source/drain contact 171 is formed on the first source/drain pattern 150. The first lower source/drain contact 171 includes the first lower source/drain barrier layer 171a and the first lower source/drain filling layer 171b.

Figure 41:
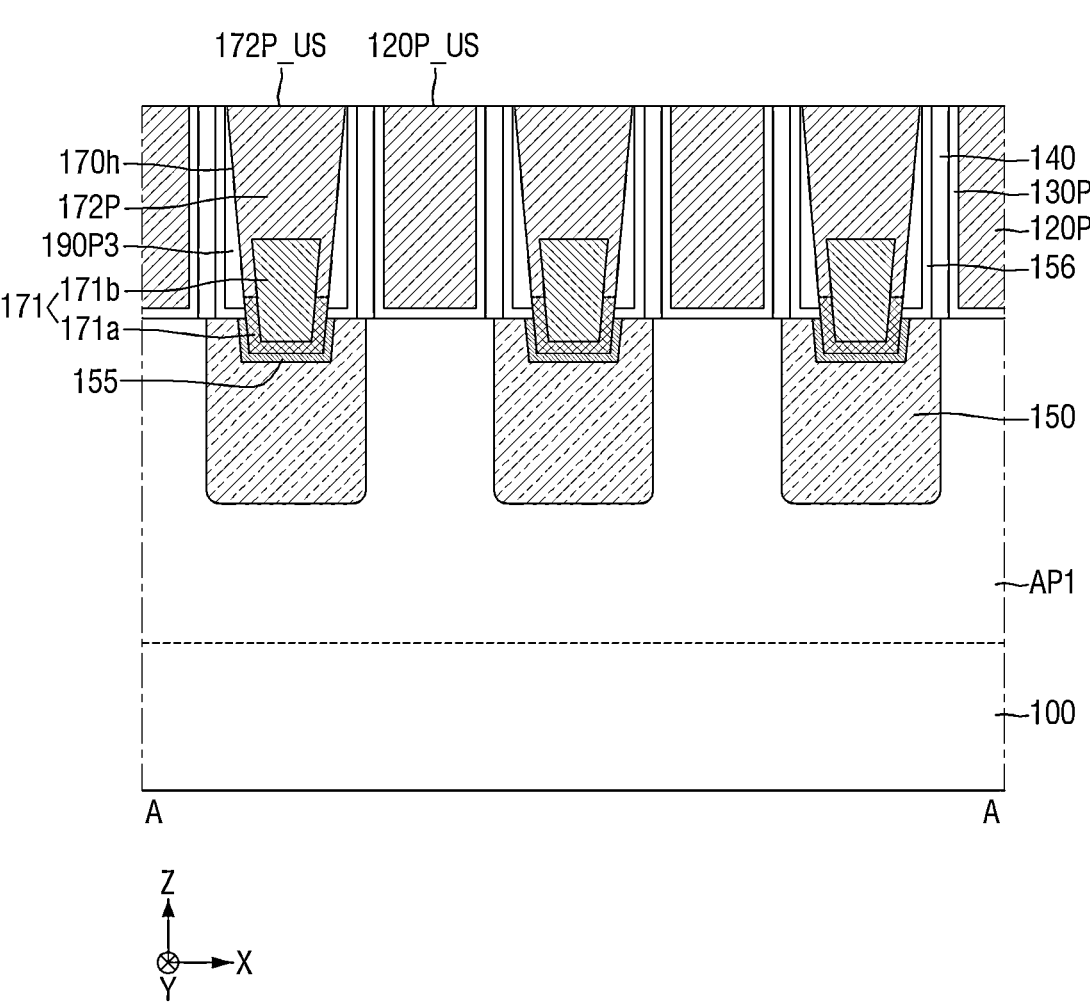

Referring to FIGS. 40 and 41, a pre-upper source/drain pattern 172P is formed on the first lower source/drain contact 171.

The pre-upper source/drain pattern 172P fills the remaining portion of the contact hole 170h after the first lower source/drain contact 171 is formed therein. An upper surface 172P_US of the pre-upper source/drain pattern may be coplanar with the upper surface 120P_US of the pre-gate electrode.

For example, the pre-upper source/drain pattern 172P may fill the contact hole 170h. Subsequently, a part of the pre-upper source/drain pattern 172P and the second pre-interlayer insulating layer 190P2 on the pre-gate electrode 120P may be removed through a planarization process. Accordingly, the pre-gate electrode 120P may be exposed.

While the pre-gate electrode 120P is exposed, a third pre-interlayer insulating layer 190P3 that wraps the sidewall of the pre-upper source/drain pattern 172P and the sidewall of the first lower source/drain contact 171 may be formed. The third pre-interlayer insulating layer 190P3 may be a part of the second pre-interlayer insulating layer 190P2.

Figure 42:
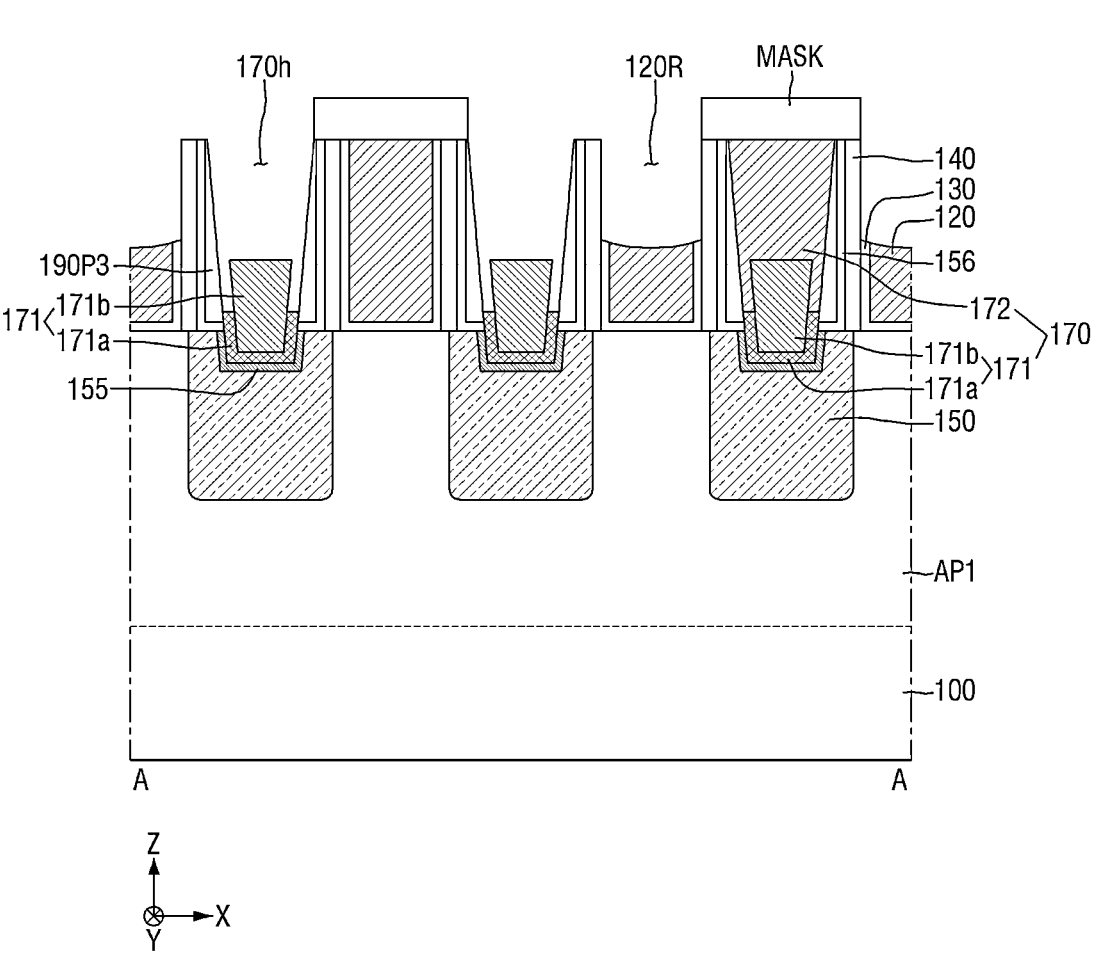

Referring to FIGS. 41 and 42, a mask pattern MASK may be formed on the pre-gate electrode 120P and the pre-upper source/drain pattern 172P.

The mask pattern MASK covers a portion of the upper surface 120P_US of the pre-gate electrode and a portion of the upper surface 172P_US of the pre-upper source/drain pattern.

A part of the pre-gate electrode 120P and a part of the pre-upper source/drain pattern 172P may be removed using the mask pattern MASK as a mask. Accordingly, the first gate electrode 120 and the first upper source/drain contact 172 are formed.

The first source/drain contact 170 is formed on the first source/drain pattern 150. The first source/drain contact 170 includes the first lower source/drain contact 171 and the first upper source/drain contact 172.

A part of the pre-gate electrode 120P and a portion of the pre-upper source/drain pattern 172P may be removed to form a gate recess 120R and the contact hole 170h.

Figure 43:
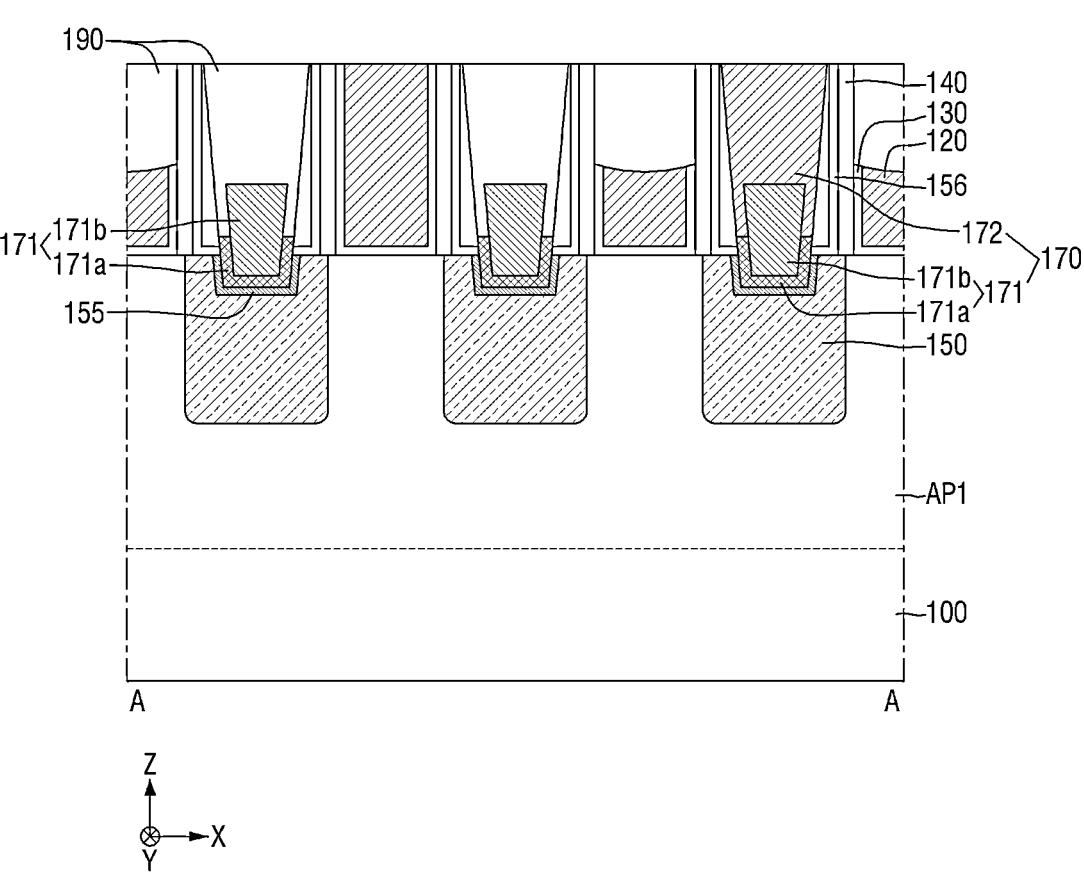

Referring to FIGS. 42 and 43, an insulating material is filled in the gate recess 120R and the contact hole 170h to form the first interlayer insulating layer 190 on the substrate 100.

While the interlayer insulating layer 190 is formed, the mask pattern MASK may be removed.

Subsequently, referring to FIG. 2, the first wiring line 205 and the second wiring structure 206 are formed on the first gate electrode 120 and the first source/drain contact 170.

In concluding the detailed description, those skilled in the art will appreciate that many variations and modifications may be made to the disclosed example embodiments without substantially departing from the principles of the present inventive concepts. Therefore, the disclosed example embodiments of the inventive concepts are used in a generic and descriptive sense only and not for purposes of limitation.

What is claimed is:

1. A semiconductor device comprising:
an active pattern on a substrate and extending in a first direction;
a gate structure on the active pattern, the gate structure comprising a gate electrode, the gate electrode extending in a second direction different from the first direction;
a source/drain pattern on at least one side of the gate structure; and
a source/drain contact on the source/drain pattern and connected to the source/drain pattern,
wherein with respect to an upper surface of the active pattern, a height of an upper surface of the gate electrode is same as a height of an upper surface of the source/drain contact, and
the source/drain contact comprises a lower source/drain contact and an upper source/drain contact on the lower source/drain contact.

2. The semiconductor device of claim 1, wherein
the gate electrode comprises a line portion extending in the second direction and a protruding portion protruding from the line portion of the gate electrode, and
the protruding portion of the gate electrode comprises the upper surface of the gate electrode.

3. The semiconductor device of claim 1, wherein the lower source/drain contact comprises a lower source/drain filling layer and a lower source/drain barrier layer extending along a sidewall of the lower source/drain filling layer.

4. The semiconductor device of claim 3, wherein the lower source/drain barrier layer extends along a boundary between the lower source/drain filling layer and the source/drain pattern.

5. The semiconductor device of claim 3, wherein with respect to the upper surface of the active pattern, an upper surface of the lower source/drain filling layer is higher than an upper surface of the lower source/drain barrier layer.

6. The semiconductor device of claim 5, wherein
the lower source/drain filling layer comprises a protruding portion protruding from the upper surface of the lower source/drain barrier layer, and
a width in the first direction of the protruding portion of the lower source/drain filling layer decreases as the protruding portion becomes farther from the source/drain pattern in a third direction perpendicular to the substrate.

7. The semiconductor device of claim 3, wherein the upper source/drain contact has a single material layer structure.

8. The semiconductor device of claim 1, further comprising:
a contact insulating liner extending along a sidewall of the lower source/drain contact and in contact with the lower source/drain contact.

9. The semiconductor device of claim 1, further comprising:
a contact isolation structure on the substrate,
wherein the lower source/drain contact comprises a first sidewall extending in the first direction and a second sidewall extending in the second direction,
the contact isolation structure faces the first sidewall of the lower source/drain contact, and with respect to an upper surface of the substrate, a height of an upper surface of the contact isolation structure is same as a height of the upper surface of the source/drain contact.

10. The semiconductor device of claim 1, further comprising:

a wiring line on the source/drain contact and extending in the first direction, wherein the wiring line is in contact with the source/drain contact.

11. A semiconductor device comprising:

an active pattern on a substrate and extending in a first direction;

a gate structure on the active pattern, the gate structure comprising a gate spacer and a gate electrode, the gate electrode extending in a second direction different from the first direction;

a source/drain pattern on at least one side of the gate structure;

a source/drain contact on the source/drain pattern and connected to the source/drain pattern;

a first wiring line on the source/drain contact, the first wiring line being in contact with the source/drain contact and extending in the first direction; and a wiring structure on the first wiring line and connected to the first wiring line, the wiring structure comprising a via and a second wiring line, wherein the source/drain contact comprises a lower source/drain contact and an upper source/drain contact on the lower source/drain contact, the gate electrode comprises a line portion extending in the second direction and a protruding portion protruding from the line portion of the gate electrode, and the protruding portion of the gate electrode comprises an upper surface of the gate electrode.

12. The semiconductor device of claim 11, wherein with respect to an upper surface of the active pattern, a height of the upper surface of the gate electrode is same as a height of an upper surface of the source/drain contact and a height of an upper surface of the gate spacer.

13. The semiconductor device of claim 11, wherein the lower source/drain contact comprises a lower source/drain filling layer and a lower source/drain barrier layer extending along a sidewall of the lower source/drain filling layer, and with respect to an upper surface of the active pattern, an upper surface of the lower source/drain filling layer is higher than an upper surface of the lower source/drain barrier layer.

14. The semiconductor device of claim 11, further comprising:

a source/drain etch stop layer extending along a sidewall of the gate structure; and a contact insulating liner extending along a sidewall of the lower source/drain contact, and in contact with the lower source/drain contact.

15. The semiconductor device of claim 11, further comprising:

a contact isolation structure on the substrate, wherein the lower source/drain contact comprises a first sidewall extending in the first direction and a second sidewall extending in the second direction, and the contact isolation structure faces the first sidewall of the lower source/drain contact, and is in contact with the gate spacer.

16. A semiconductor device comprising:

a first active pattern on a substrate and extending in a first direction;

a second active pattern on the substrate and extending in the first direction, the second active pattern spaced apart from the first active pattern in a second direction;

a gate electrode extending in the second direction, the gate electrode being on the first active pattern and the second active pattern;

a first source/drain pattern on the first active pattern;

a second source/drain pattern on the second active pattern;

a first source/drain contact on the first source/drain pattern and connected to the first source/drain pattern;

a second source/drain contact on the second source/drain pattern and connected to the second source/drain pattern;

a contact isolation structure between the first source/drain contact and the second source/drain contact; and a wiring line on the first source/drain contact, the wiring line extending in the first direction and in contact with the first source/drain contact, wherein an upper surface of the gate electrode is coplanar with an upper surface of the first source/drain contact and an upper surface of the second source/drain contact, and each of the first source/drain contact and the second source/drain contact comprises a lower source/drain contact and an upper source/drain contact on the lower source/drain contact.

17. The semiconductor device of claim 16, wherein the lower source/drain contact comprises a lower source/drain filling layer and a lower source/drain barrier layer extending along a sidewall of the lower source/drain filling layer, and with respect to an upper surface of the first active pattern, an upper surface of the lower source/drain filling layer is higher than an upper surface of the lower source/drain barrier layer.

18. The semiconductor device of claim 16, wherein the gate electrode comprises a line portion extending in the second direction and a protruding portion protruding from the line portion of the gate electrode, and the protruding portion of the gate electrode comprises the upper surface of the gate electrode.

19. The semiconductor device of claim 16, wherein an upper surface of the contact isolation structure is coplanar with the upper surface of the first source/drain contact and the upper surface of the second source/drain contact.

20. The semiconductor device of claim 16, further comprising:

a contact insulating liner extending along a sidewall of the lower source/drain contact and in contact with the lower source/drain contact.

* * * * *